US012713783B2

(12) United States Patent
Park et al.

(10) Patent No.: US 12,713,783 B2
(45) Date of Patent: Aug. 18, 2026

(54) DISPLAY DEVICE

(71) Applicant: Samsung Display Co., LTD., Yongin-si (KR)

(72) Inventors: Junhyeong Park, Yongin-si (KR); Hyejin Joo, Yongin-si (KR); Myunghee Han, Yongin-si (KR); Jangyeol Yoon, Yongin-si (KR); Yongseok Kim, Yongin-si (KR); Jinwoo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 140 days.

(21) Appl. No.: 18/900,221

(22) Filed: Sep. 27, 2024

(65) Prior Publication Data

US 2025/0120264 A1 Apr. 10, 2025

(30) Foreign Application Priority Data

Oct. 10, 2023 (KR) ........................ 10-2023-0134326

(51) Int. Cl.

*H10K 59/122* (2023.01)
*H10K 59/124* (2023.01)
*H10K 59/80* (2023.01)
*H10K 59/40* (2023.01)

(52) U.S. Cl.

CPC ......... *H10K 59/122* (2023.02); *H10K 59/124* (2023.02); *H10K 59/873* (2023.02); *H10K 59/40* (2023.02)

(58) Field of Classification Search

CPC .. H10K 59/122; H10K 59/873; H10K 59/124; H10K 59/40

See application file for complete search history.

(56) References Cited

U.S. PATENT DOCUMENTS 10,461,142 B2 10/2019 Hong et al.
11,177,335 B2 11/2021 Park et al.
11,296,156 B2 4/2022 Kim et al.
11,342,519 B2 5/2022 Bu
11,610,954 B1 3/2023 Lin et al.
11,785,797 B2 * 10/2023 Joo ..................... H10K 59/131 257/40

(Continued)

FOREIGN PATENT DOCUMENTS

CN 109671761 A 4/2019
KR 20180045968 A 5/2018

(Continued)

*Primary Examiner* — Anne M Hines
(74) *Attorney, Agent, or Firm* — CANTOR COLBURN LLP

(57) ABSTRACT

Provided is a display device including a substrate including a first unit area, a second unit area, and an intermediate area between the first unit area and the second unit area, an organic insulating layer disposed on the substrate, an emission element layer disposed on the organic insulating layer, the emission element layer including a first emission element overlapping the first unit area and a second emission element overlapping the second unit area, and an encapsulation layer disposed on the emission element layer, wherein the emission element layer and the encapsulation layer define a valley portion which overlaps the intermediate area and exposes an upper surface of the organic insulating layer.

25 Claims, 55 Drawing Sheets

(56) References Cited

U.S. PATENT DOCUMENTS

2021/0384465 A1* 12/2021 Park .................... H10K 59/873
2025/0008818 A1* 1/2025 Shima ................... H10K 59/65

FOREIGN PATENT DOCUMENTS

KR 20190055868 A 5/2019
KR 20200063590 A 6/2020
KR 20200067524 A 6/2020

* cited by examiner

OPv
510OPv
320OPv
310OPv
250OPv
dm1
dm2
512
EDL
ML
511
320
310
250
215
300
z
CM1
PT1
411
421
431
ED1
401
UA1
MA
402
PT2
412
422
432
ED2
CM2
UA2

OPv
510OPv
320OPv
310OPv
250OPv
dm1
dm2
512
EDL
ML
511
320
310
250
215
300
z
CM1
CM2
PT1
PT2
411
421
431
ED1
412
422
432
ED2
401
402
540
UA1
UA2
MA

OPv
512
EDL
dm2
dm1
MLp
PT4
PT1
PT2
401
402
411
421
431
412
422
432
ED1
ED2
CM1
CM2
UA1
UA2
MA
511
320
310
250
215
300
z

512
EDL
dm2
522
OPv
521
dm1
530
511
320
310
250
215
300
z
CM1
PT1
411
421
431
ED1
401
402
PT2
412
422
432
ED2
CM2
UA1
MA
UA2

V
530OPv
250OPv
dm1
dm2
521
522
531
511
320
310
250
215
300
532
512
EDL
411 421 431
ED1
412 422 432
ED2
401
402
PT1
PT2
CM1
CM2
UA1
MA
UA2
z
511
512
521
522
531
532
500

217p
215
OIL
213
BL
θ
IIL
z
217r
217
217r 217p
217r
217p
215
OIL
213
θ
BL
IIL
z
217

DISPLAY DEVICE

This application claims priority to Korean Patent Application No. 10-2023-0134326, filed on Oct. 10, 2023, and all the benefits accruing therefrom under 35 U.S.C. § 119, the content of which in its entirety is herein incorporated by reference.

BACKGROUND

1. Field

One or more embodiments relate to display devices.

2. Description of the Related Art

With the advancement of display devices for visually displaying electrical signals, various display devices with excellent characteristics such as, for example, thinness, light weight, and low power consumption have been introduced. For example, flexible display devices that are foldable or rollable into a roll shape have been introduced. Recently, research and development has been actively conducted on display devices of various structures such as, for example, stretchable display devices that may be deformed into various shapes.

SUMMARY

One or more embodiments include display devices, for example, flexible display devices.

Additional aspects will be set forth in part in the description that follows and, in part, will be apparent from the description, or may be learned by practice of the embodiments of the disclosure.

According to one or more embodiments, a display device includes a substrate including a first unit area, a second unit area, and an intermediate area between the first unit area and the second unit area, an organic insulating layer disposed on the substrate, an emission element layer disposed on the organic insulating layer, the emission element layer including a first emission element overlapping the first unit area and a second emission element overlapping the second unit area, and an encapsulation layer disposed on the emission element layer, wherein the emission element layer and the encapsulation layer define a valley portion which overlaps the intermediate area and exposes an upper surface of the organic insulating layer.

Each of the first emission element and the second emission element may include a pixel electrode, an opposite electrode, and an emission layer arranged between the pixel electrode and the opposite electrode, the emission element layer may further include an inorganic bank layer disposed on the organic insulating layer and defining a pixel opening that exposes a portion of the pixel electrode, and a metal bank layer disposed on the inorganic bank layer and including a first metal layer and a second metal layer disposed on the first metal layer, the first metal layer may define a first bank opening overlapping the pixel opening, and the second metal layer may define a second bank opening overlapping the pixel opening.

A width of the first bank opening may be greater than a width of the second bank opening.

The inorganic bank layer and the metal bank layer may be arranged apart from the intermediate area.

The encapsulation layer may cover a side surface of the metal bank layer facing the intermediate area.

The display device may further include a cover layer between the encapsulation layer and the side surface of the metal bank layer facing the intermediate area.

The display device may further include a voltage line disposed under the organic insulating layer and configured to transfer a common power voltage, wherein the metal bank layer is electrically connected to the voltage line through one or more contact holes defined in the inorganic bank layer and the organic insulating layer.

The one or more contact holes may include a plurality of contact holes, wherein a first contact hole of the plurality of contact holes is located in the first unit area and a second contact hole of the plurality of contact holes is located in the second unit area.

The opposite electrode may be in direct contact with a side surface of the first metal layer facing a center of the pixel opening.

The encapsulation layer may include a first inorganic encapsulation layer overlapping the first unit area, a second inorganic encapsulation layer overlapping the second unit area, a third inorganic encapsulation layer disposed on the first inorganic encapsulation layer, and a fourth inorganic encapsulation layer disposed on the second inorganic encapsulation layer.

The encapsulation layer may further include a first organic encapsulation layer arranged between the first inorganic encapsulation layer and the third inorganic encapsulation layer, and a second organic encapsulation layer arranged between the second inorganic encapsulation layer and the fourth inorganic encapsulation layer.

The emission element layer may further include a third emission element overlapping the first unit area and arranged apart from the first emission element, the encapsulation layer may further include a third organic encapsulation layer between the first inorganic encapsulation layer and the third inorganic encapsulation layer, the first organic encapsulation layer may be arranged such that the first organic encapsulation layer overlaps the first emission element, and the third organic encapsulation layer may overlap the third emission element and may be arranged apart from the first organic encapsulation layer.

The emission element layer may further include a third emission element overlapping the first unit area and arranged apart from the first emission element, and the first organic encapsulation layer may be arranged such that the first organic encapsulation layer overlaps the first emission element and the third emission element.

The second inorganic encapsulation layer and the fourth inorganic encapsulation layer may be arranged apart from each other, with the intermediate area between the second inorganic encapsulation layer and the fourth inorganic encapsulation layer.

The second inorganic encapsulation layer and the fourth inorganic encapsulation layer may constitute a side surface of the valley portion.

The display device may further include an inorganic insulating layer between the substrate and the organic insulating layer, wherein the inorganic insulating layer defines a first opening overlapping the intermediate area.

The substrate may include at least one base layer and at least one barrier layer, and the at least one barrier layer may define a second opening overlapping the first opening.

A center of the first opening and a center of the valley portion may be offset from each other.

The display device may further include a filler layer filling in the first opening, wherein a modulus of the filler layer is about 3 MPa to about 20 MPa.

The substrate may define a recess portion that overlaps the first opening and is concave in a thickness direction, and the filler layer may fill in the recess portion.

The display device may further include a bridge line disposed on the inorganic insulating layer and the filler layer and crossing the first opening.

The bridge line may have an arch shape.

An upper surface of the filler layer may have unevenness, and the bridge line may have a shape corresponding to a shape of the upper surface of the filler layer.

The bridge line may include a first bridge line having a concave shape in a thickness direction and a second bridge line disposed on the first bridge line and having an arch shape.

The display device may further include a planarization layer disposed on the encapsulation layer, and a touch sensor layer disposed on the planarization layer, the touch sensor layer including a first touch electrode, a second touch electrode, a first touch insulating layer between the planarization layer and the first touch electrode, and a second touch insulating layer between the first touch electrode and the second touch electrode, wherein, in a plan view, a shape of the first touch insulating layer corresponds to a shape of the first touch electrode.

Other aspects, features, and advantages in addition to those described herein will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A to 4C are equivalent circuit diagrams of a sub-pixel of a display device according to an embodiment;

FIGS. 14A to 14C are diagrams illustrating elongation rates of each area of a substrate, an inorganic insulating film, and a conductive line when an inorganic insulating film is segmented with a segment area in between;

DETAILED DESCRIPTION

Figure 1:
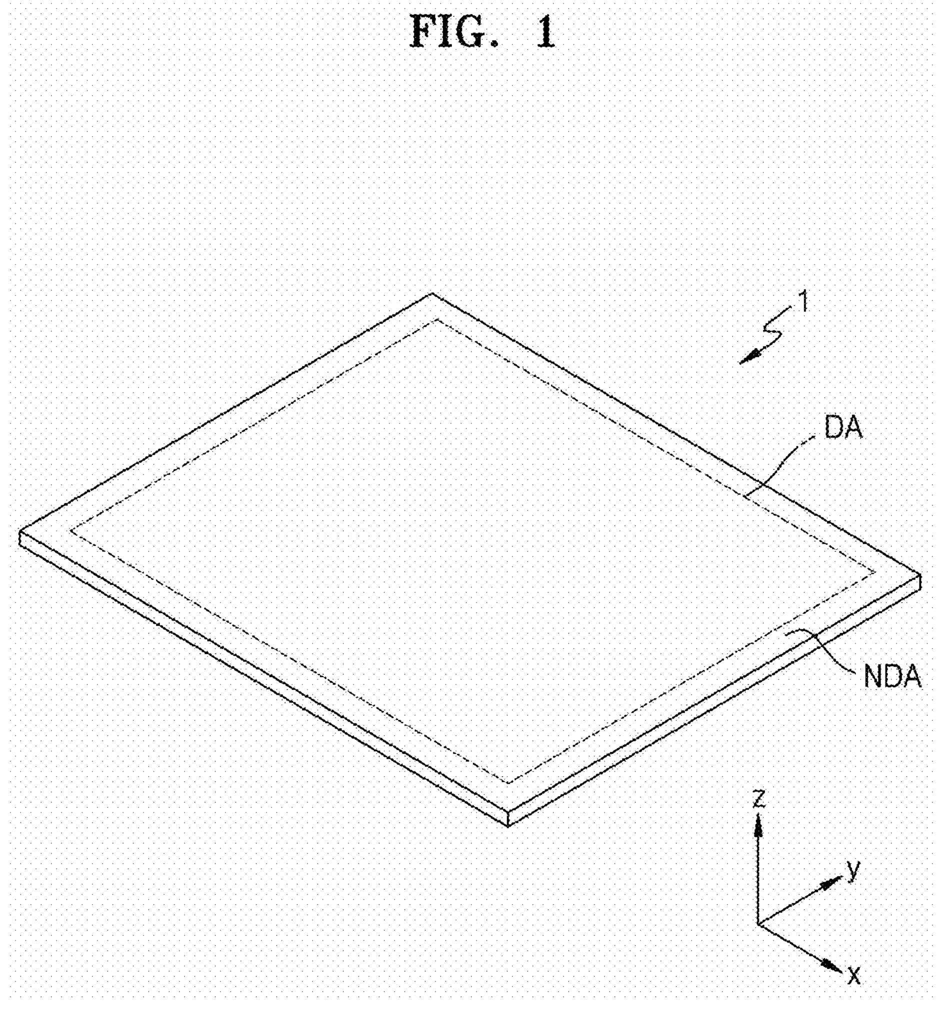
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described herein, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure are illustrated. This disclosure may, however, be embodied in many different forms and should not be construed as limited to the embodiments set forth herein.

One or more embodiments of the disclosure will be described herein in more detail with reference to the accompanying drawings. Those components that are the same or are in correspondence are rendered the same reference numeral regardless of the figure number, and redundant descriptions thereof are omitted.

In the disclosure, terms such as "first" and "second" are used herein merely to describe a variety of elements, but the elements are not limited by the terms. Such terms are used for the purpose of distinguishing one element from another element.

In the disclosure, an expression used in the singular encompasses the expression of the plural, unless it has a clearly different meaning in the context.

In the disclosure, terms such as "include" or "comprise" may be construed to denote a certain characteristic or element, or a combination thereof, but may not be construed to exclude the existence of or a possibility of addition of one or more other characteristics, elements, or combinations thereof.

It will be understood that when a layer, region, or element is referred to as being "formed on" another layer, region, or element, it can be directly or indirectly formed on the other layer, region, or element. That is, for example, intervening layers, regions, or elements may be present.

It will be understood that when a layer, region, or element is referred to as being "connected" to another layer, region, or element, it may be "directly connected" to the other layer, region, or element and/or may be "indirectly connected" to the other layer, region, or element with other layer, region, or element therebetween. For example, it will be understood that when a layer, region, or element is referred to as being "electrically connected" to another layer, region, or element, it may be "directly electrically connected" to the other layer, region, or element and/or may be "indirectly electrically connected" to other layer, region, or element with other layer, region, or element therebetween.

In the disclosure, "A and/or B" may include "A," "B," or "A and B." In addition, in the disclosure, "at least one of A and B" may include "A," "B," or "A and B."

In the disclosure, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the disclosure, when a certain embodiment may be implemented differently, a specific process order may be performed differently from the described order. For example, two consecutively described processes may be performed substantially at the same time or performed in an order opposite to the described order.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

The terms "about" or "approximately" as used herein are inclusive of the stated value and include a suitable range of deviation for the particular value as determined by one of ordinary skill in the art, considering the measurement in question and the error associated with measurement of the particular quantity. The term "about" can mean within one or more standard deviations, or within ±30%, 20%, 10%, 5% of the stated value, for example.

The term "substantially," as used herein, means approximately or actually. The term "substantially equal," as used herein, means approximately or actually equal (e.g., within a threshold percent of equal). The term "substantially the same," as used herein, means approximately or actually the same (e.g., within a threshold difference amount).

Embodiments of the present disclosure support one or more processes (methods, flowcharts) supportive of the features and embodiments described herein. Descriptions that an element "may be disposed," "may be formed," "may be deposited," "may be shaped," and the like include processes (methods, flowcharts) and techniques for disposing, forming, positioning, modifying, and configuring the element in accordance with example aspects described herein.

Figure 2A:
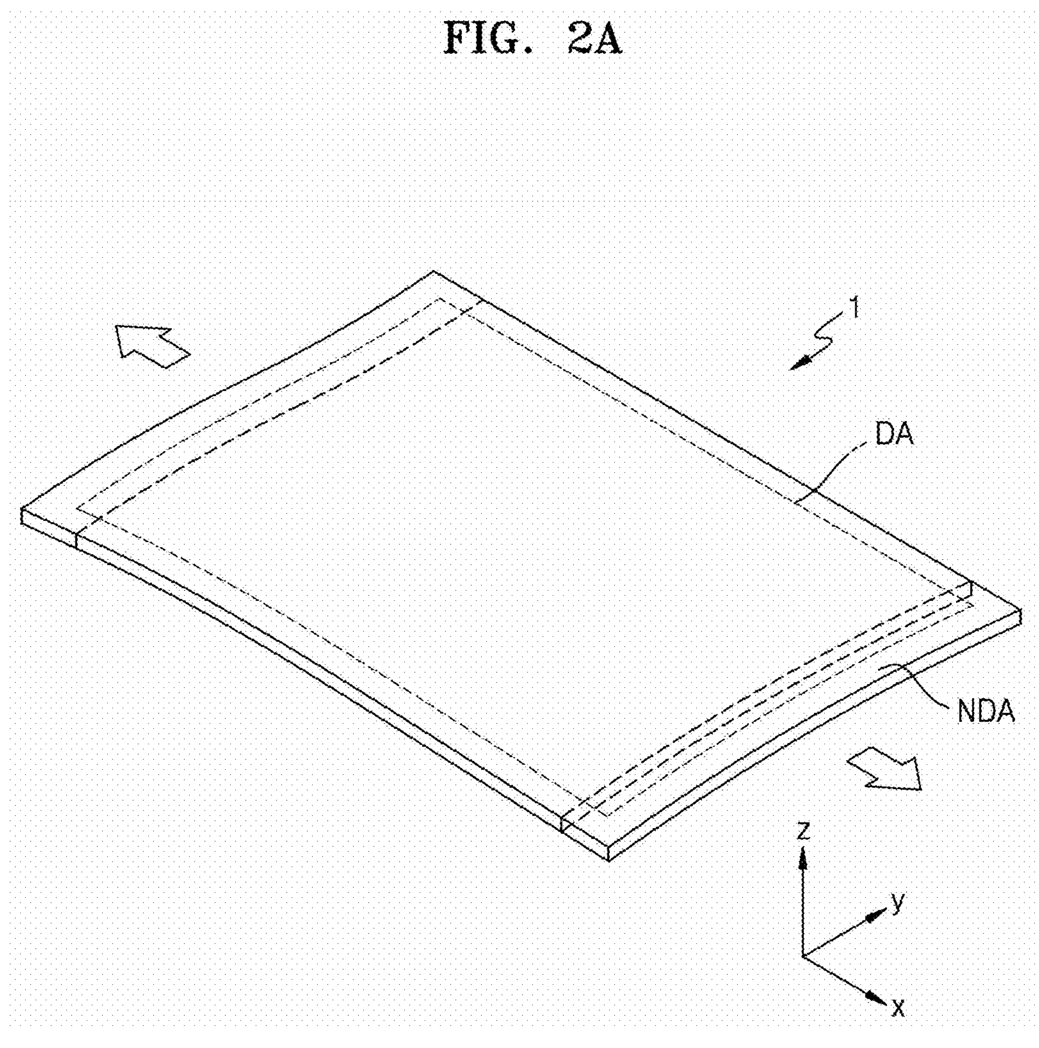
FIGS. 2A and 2B are perspective view illustrating the display device in FIG. 1 stretched in a first direction.
Figure 2B:
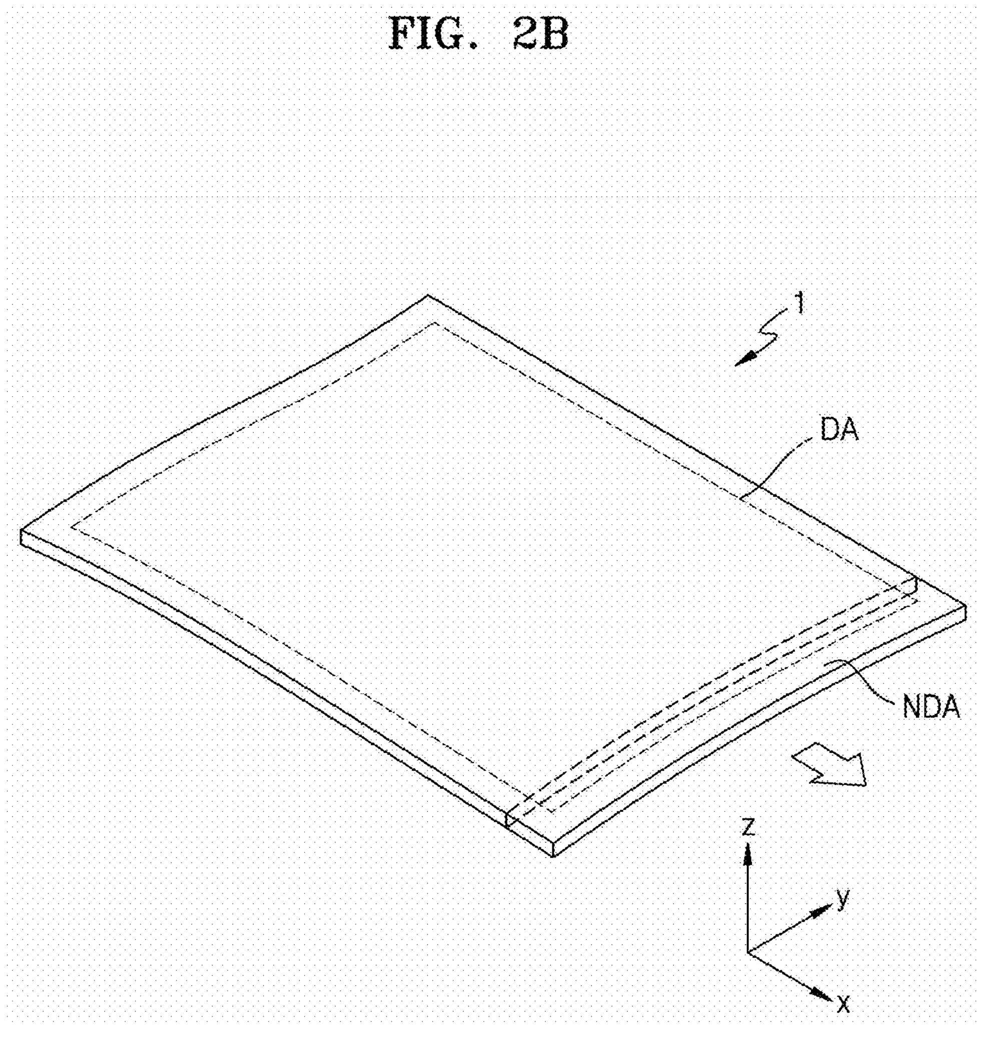
Figure 2C:
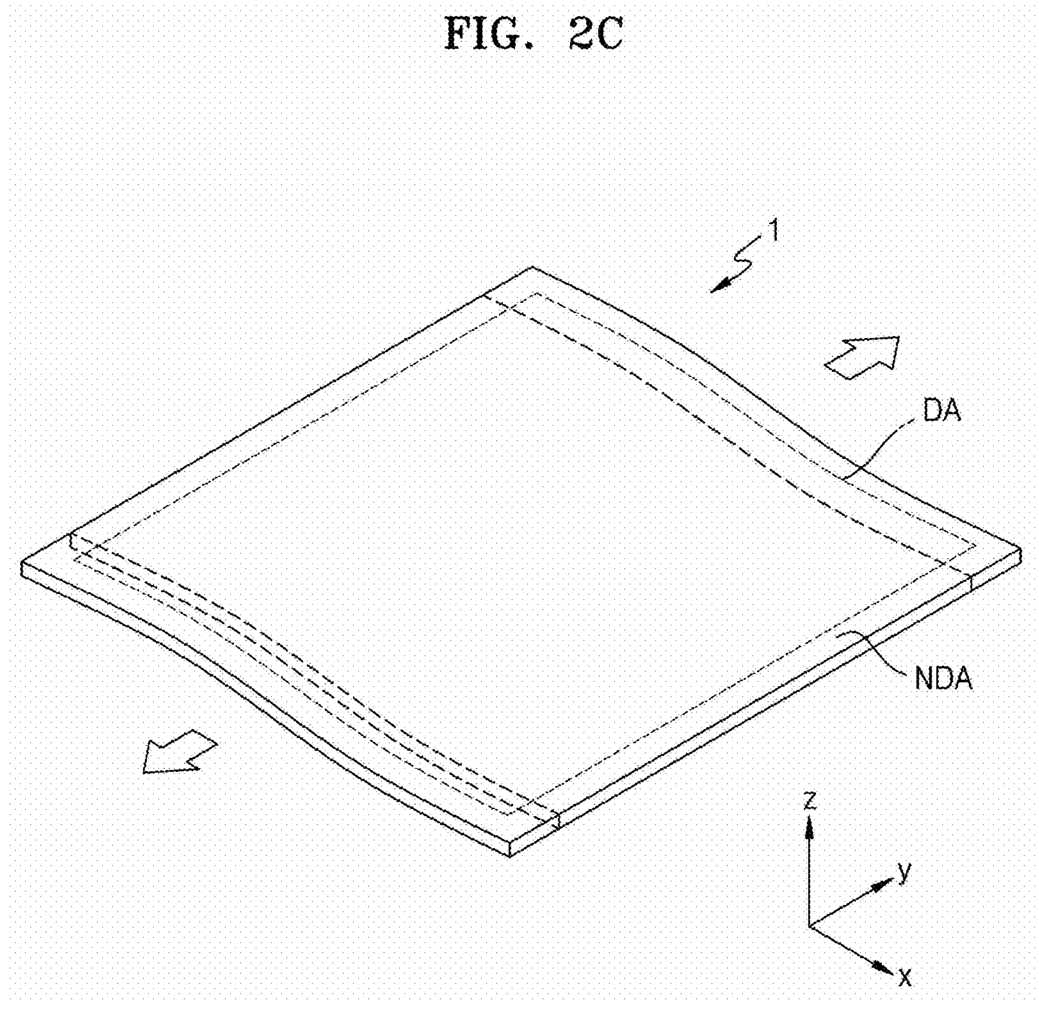
FIG. 2C is a perspective view illustrating the display device in FIG. 1 stretched in a second direction.
Figure 2D:
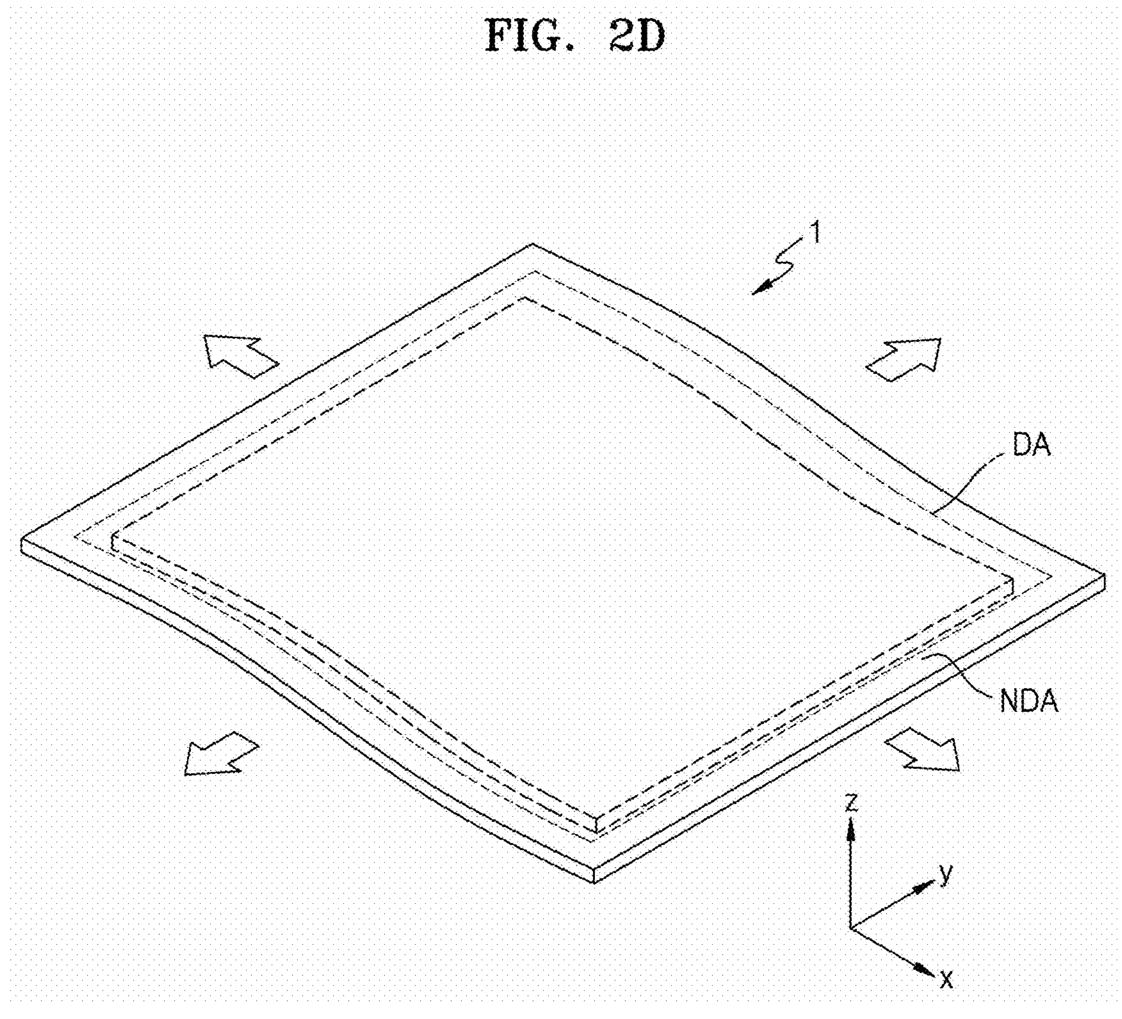
FIG. 2D is a perspective view illustrating the display device in FIG. 1 stretched in the first and second directions.
Figure 2E:
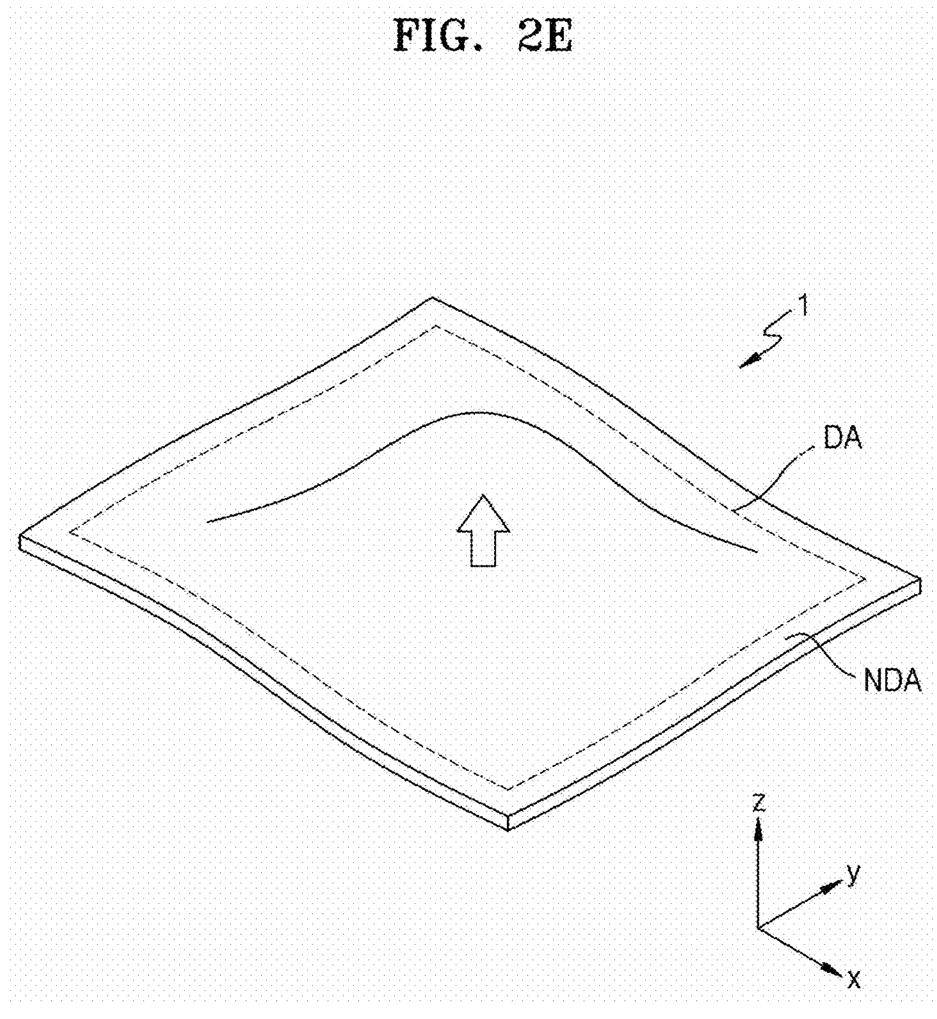
FIG. 2E is a perspective view illustrating the display device in FIG. 1 stretched in a third direction.

FIG. 1 is a perspective view schematically illustrating a display device 1 according to an embodiment. FIGS. 2A and 2B are perspective view illustrating the display device 1 in FIG. 1 stretched in a first direction. FIG. 2C is a perspective view illustrating the display device 1 in FIG. 1 stretched in a second direction. FIG. 2D is a perspective view illustrating the display device 1 in FIG. 1 stretched in the first and second directions. FIG. 2E is a perspective view illustrating the display device 1 in FIG. 1 stretched in a third direction.

Referring to FIG. 1, the display device 1 may include a display area DA and a non-display area NDA. The display area DA may include a plurality of pixels. The display device 1 may provide a certain image by using light emitted from the plurality of pixels. The non-display area NDA may be arranged outside the display area DA. The non-display area NDA is an area in which pixels are not arranged and may entirely surround the display area DA.

The display device 1 may be stretched or compressed in various directions. The display device 1 may be stretched in a first direction (for example, x direction and/or −x direction) by an external force applied by an external object or a user. In an embodiment, as illustrated in FIGS. 2A and 2B, the display area DA and/or non-display area NDA of the display device 1 may be stretched in the first direction (for example, x direction and/or −x direction). For example, as illustrated in FIG. 2A, the display device 1 may be stretched in the x direction and −x direction, or as illustrated in FIG. 2B, the display device 1 may be stretched in the x direction while one side of the display device 1 is fixed.

The display device 1 may be stretched in a second direction (for example, y direction and/or −y direction) by an external force applied by an external object or a user. In an embodiment, as illustrated in FIG. 2C, the display area DA and/or non-display area NDA of the display device 1 may be stretched in the y direction and −y direction. In another embodiment, the display device 1 may be stretched in the y direction or −y direction while one side of the display device 1 is fixed.

The display device 1 may be stretched in a plurality of directions, for example, in the first direction (for example, the x direction and/or −x direction) and in the second direction (for example, the y direction and/or −y direction), by an external force applied by an external object or a user's body part. As illustrated in FIG. 2D, the display area DA and/or non-display area NDA of the display device 1 may be stretched in a ±x direction and in a ±y direction.

The display device 1 may be stretched in a third direction (for example, a z direction or −z direction) by an external force applied by an external object or a user's body part. In an embodiment, FIG. 2E illustrates a part of the display device 1, for example, a partial area of the display area DA, protruding in the z direction. In another embodiment, a part of the display device 1, for example, a partial area of the display area DA, may protrude in the −z direction (or be depressed in the z direction).

In FIGS. 2A to 2E, the display device 1 is stretched in the first direction, in the second direction, and/or in the third direction. However, one or more embodiments are not limited thereto. In another embodiment, the display device 1 may be variously deformed into various irregular shapes, such as, for example, being bent or twisted along two or more axes.

Figure 3:
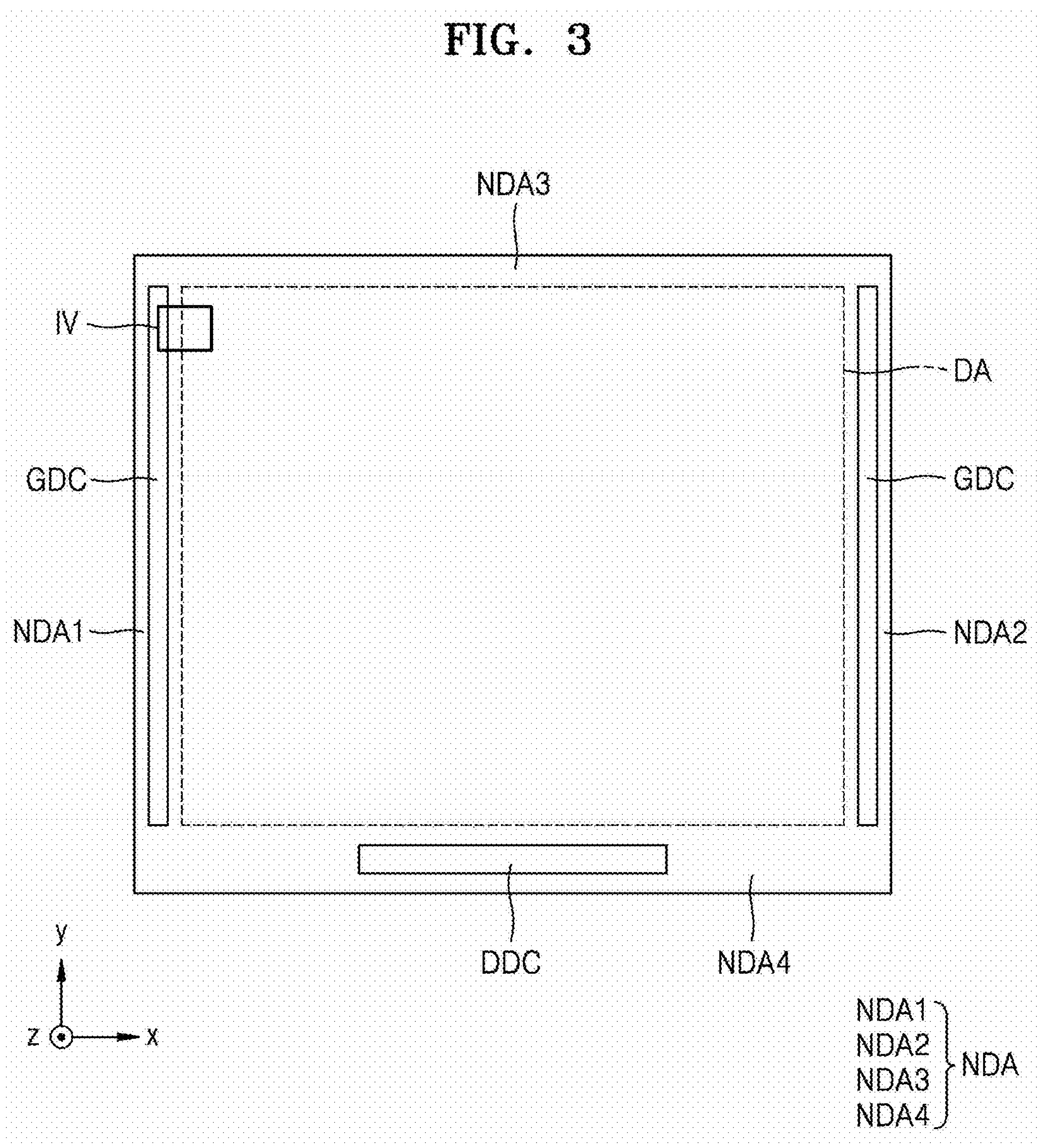
FIG. 3 is a plan view schematically illustrating a display device according to an embodiment.

FIG. 3 is a plan view schematically illustrating the display device 1 according to an embodiment.

A plurality of pixels may be arranged in the display area DA of the display device 1. Each of the pixels may include sub-pixels emitting light of different colors from each other. Emission elements corresponding to the respective sub-pixels may be arranged in the display area DA. A circuit for providing electrical signals to the emission elements arranged in the display area DA and transistors electrically connected to the emission elements may be located in the non-display area NDA around the display area DA. A gate driving circuit GDC may be arranged in each of a first non-display area NDA1 and a second non-display area NDA2, which are arranged at opposite sides with the display area DA between the first non-display area NDA1 and the second non-display area NDA2.

The gate driving circuit GDC may include drivers for providing electrical signals to gate electrodes of the transistors electrically connected to the emission elements. In FIG. 3, the gate driving circuit GDC is arranged in each of the first non-display area NDA1 and the second non-display area NDA2. However, one or more embodiments are not limited thereto. In another embodiment, the gate driving circuit GDC may be arranged in one of the first non-display area NDA1 and the second non-display area NDA2.

A data driving circuit DDC may be arranged in a third non-display area NDA3 and/or in a fourth non-display area NDA4, which connect the first non-display area NDA1 and the second non-display area NDA2 to each other. In an embodiment, FIG. 3 illustrates that the data driving circuit DDC is arranged in the fourth non-display area NDA4. In another embodiment, the data driving circuit DDC may be arranged in each of the third non-display area NDA3 and the fourth non-display area NDA4.

In FIG. 3, the data driving circuit DDC is arranged in the fourth non-display area NDA4 of the display device 1. However, one or more embodiments are not limited thereto. In another embodiment, the display device 1 may further include a flexible circuit board (not illustrated) electrically connected through a terminal unit (not illustrated) arranged in the fourth non-display area NDA4, and the display device 1 may be disposed on the flexible circuit board described herein.

In some embodiments, an elongation rate of the non-display area NDA may be less than or equal to an elongation rate of the display area DA. In an embodiment, the elongation rate of the non-display area NDA may different for each area. For example, the first non-display area NDA1, the second non-display area NDA2, and the third non-display area NDA3 may have substantially the same elongation rate as each other, but an elongation rate of the fourth non-display area NDA4 may be less than the elongation rate of each of the first non-display area NDA1, the second non-display area NDA2, and the third non-display area NDA3.

Figure 4A:
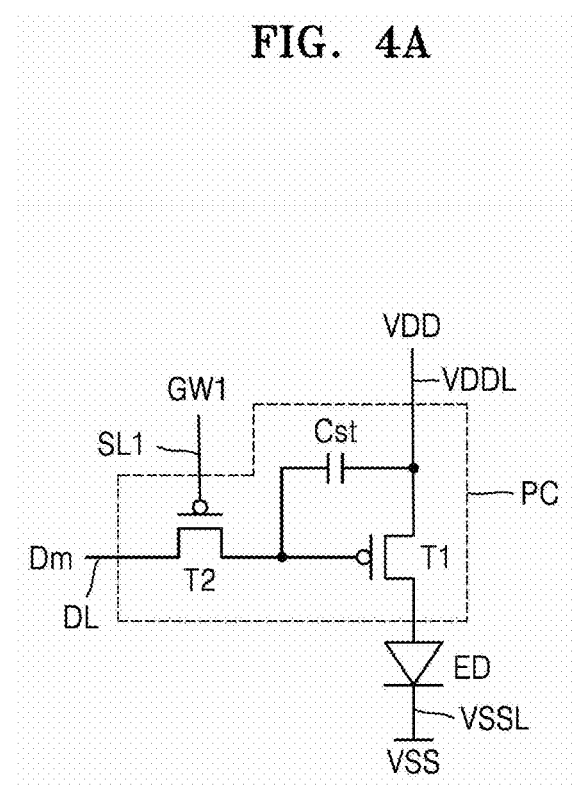
Figure 4B:
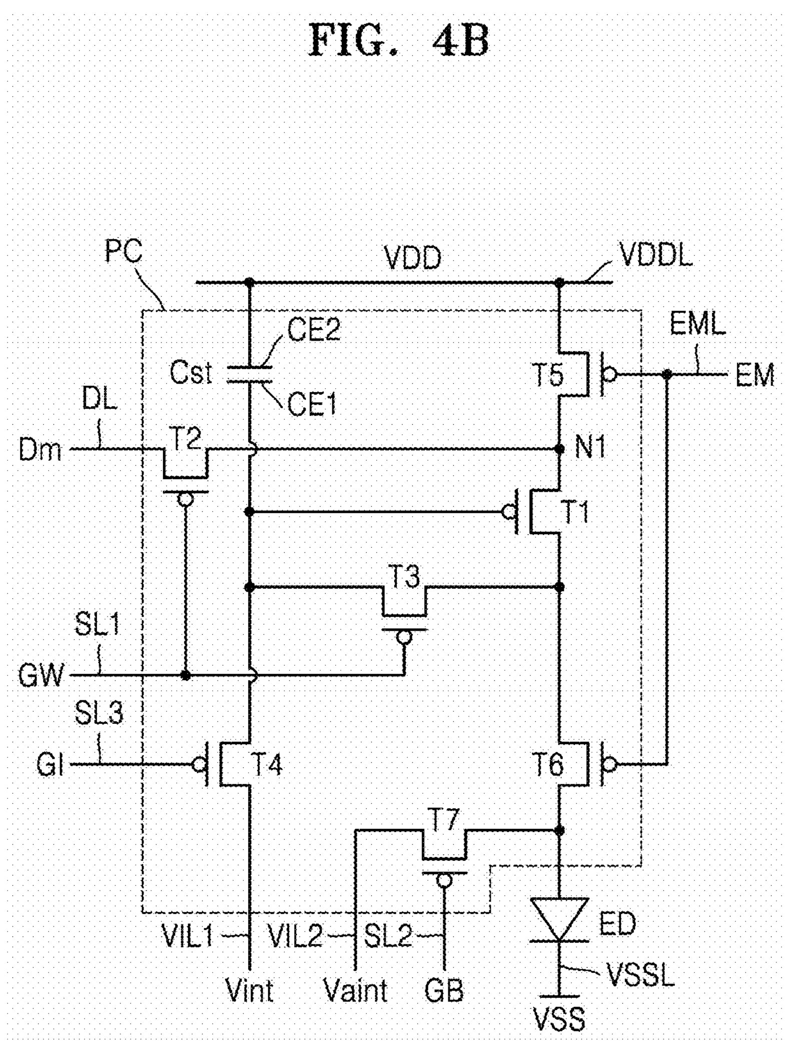
Figure 4C:
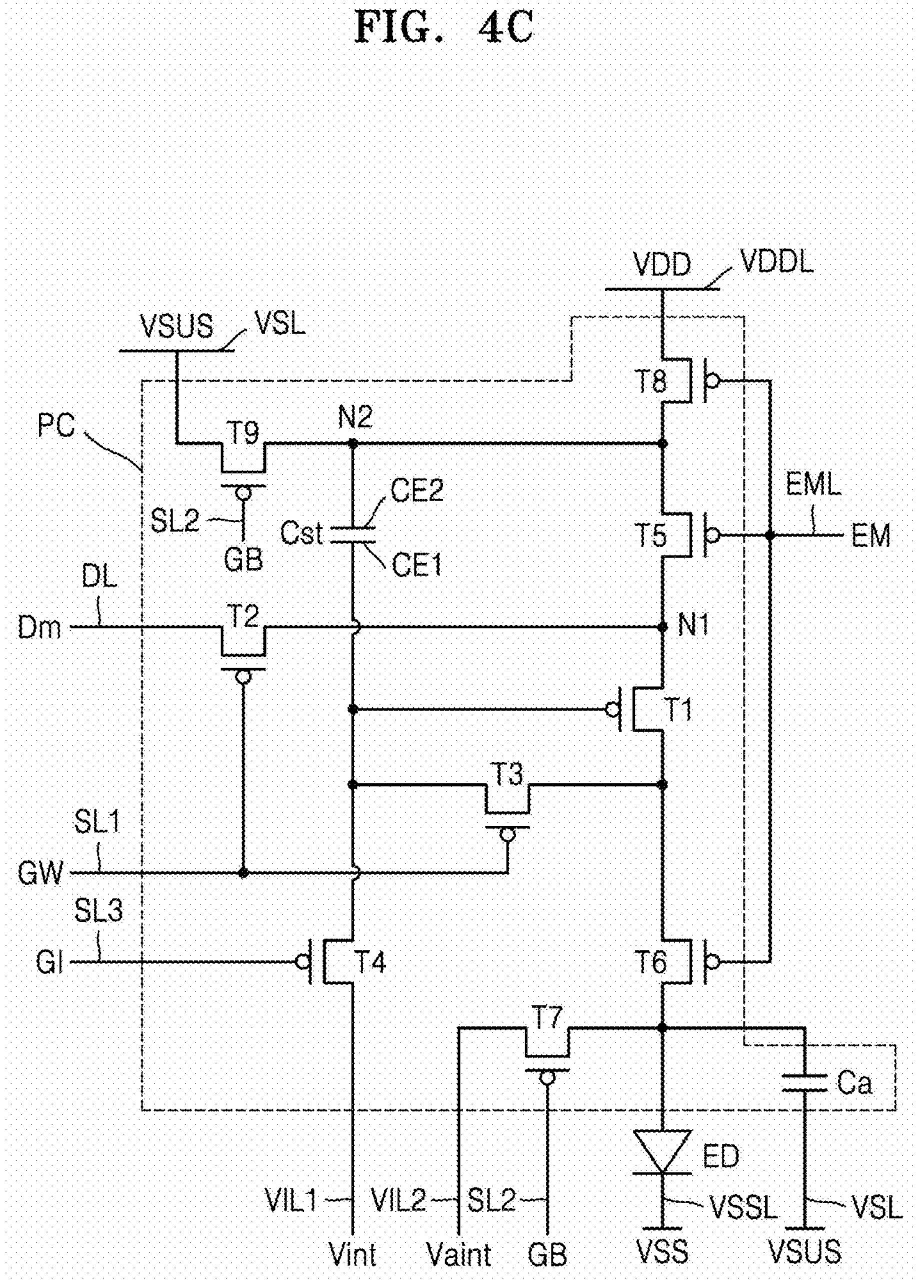

FIGS. 4A to 4C are equivalent circuit diagrams of a sub-pixel of a display device according to an embodiment.

Referring to FIG. 4A, an emission element ED corresponding to the sub-pixel may be electrically connected to a pixel driving circuit unit PC, and the pixel driving circuit unit PC may include a first transistor T1, a second transistor T2, and a storage capacitor Cst. The pixel driving circuit unit PC may be electrically connected to a signal line and a voltage line. The signal line may include a gate line, such as, for example, a first scan line SL1, and a data line DL, and the voltage line may include a first voltage line (driving power voltage) VDDL.

The second transistor T2 may be electrically connected to the first scan line SL1 and the data line DL. The first scan line SL1 may provide a first scan signal GW1 to a gate electrode of the second transistor T2. The second transistor T2 may transfer a data signal Dm received via the data line DL to the first transistor T1 according to the first scan signal GW1 received via the first scan line SL1.

The storage capacitor Cst may be electrically connected to the second transistor T2 and the first voltage line VDDL and may store a voltage corresponding to a voltage difference between a voltage received from the second transistor T2 and a first power voltage VDD supplied via the first voltage line VDDL.

The first transistor T1 is a driving transistor and may control a driving current flowing through the emission element ED. The first transistor T1 may be connected to the first voltage line VDDL and the storage capacitor Cst. The first transistor T1 may control a driving current flowing through the emission element ED from the first voltage line VDDL, to correspond to a voltage value stored in the storage capacitor Cst. The emission element ED may emit light having a certain brightness according to the driving current. A first electrode (pixel electrode) of the emission element ED may be electrically connected to the first transistor T1, and a second electrode (common electrode) may be electrically connected to a second voltage line VSSL configured to supply a second power voltage (common power voltage) VSS.

In FIG. 4A, the pixel driving circuit unit PC includes two transistors and one storage capacitor. However, in another embodiment, the pixel driving circuit unit PC may include three or more transistors.

Referring to FIG. 4B, the pixel driving circuit unit PC may include a first transistor T1, a second transistor T2, a third transistor T3, a fourth transistor T4, a fifth transistor T5, a sixth transistor T6, a seventh transistor T7, and a storage capacitor Cst.

The pixel driving circuit unit PC may be electrically connected to signal lines and voltage lines. The signal lines may include a gate line, such as, for example, a first scan line SL1, a second scan line SL2, a third scan line SL3, and an emission control line EML, and a data line DL. The voltage lines may include first and second initialization voltage lines VIL1 and VIL2 and a first voltage line VDDL.

The first voltage line VDDL may be configured to transfer the first power voltage VDD to the first transistor T1. The first initialization voltage line VIL1 may be configured to transfer, to the pixel driving circuit unit PC, a first initialization voltage Vint for initializing the first transistor T1. The second initialization voltage line VIL2 may be configured to transfer, to the pixel driving circuit unit PC, a second initialization voltage Vaint for initializing a first electrode of the emission element ED.

The first transistor T1 may be electrically connected to the first voltage line VDDL via the fifth transistor T5, and may be electrically connected to the emission element ED via the sixth transistor T6. The first transistor T1 may serve as a driving transistor, and may receive a data signal Dm according to a switching operation of the second transistor T2 and supply a driving current to the emission element ED.

The second transistor T2, as a data write transistor, may be electrically connected to the first scan line SL1 and the data line DL. The second transistor T2 may be electrically connected to the first voltage line VDDL via the fifth transistor T5. The second transistor T2 may be turned on according to a first scan signal GW received via the first scan line SL1 and may perform a switching operation for transferring, to a first node N1, the data signal Dm transmitted via the data line DL.

The third transistor T3 may be electrically connected to the first scan line SL1, and may be electrically connected to the emission element ED via the sixth transistor T6. The third transistor T3 may be turned on according to the first scan signal GW received via the first scan line SL1, to diode-connect the first transistor T1.

The fourth transistor T4, as a first initialization transistor, may be electrically connected to a third scan line SL3 and the first initialization voltage line VIL1. The fourth transistor T4 may be turned on according to a third scan signal GI received via the third scan line SL3, and the fourth transistor T4 may transfer the first initialization voltage Vint from the first initialization voltage line VIL1 to a gate electrode of the first transistor T1 so as to initialize a voltage of the gate electrode of the first transistor T1. The third scan signal GI may correspond to a first scan signal of another pixel driving circuit unit arranged in a previous row of the pixel driving circuit unit PC.

The fifth transistor T5 may be an operation control transistor, and the sixth transistor T6 may be an emission control transistor. The fifth transistor T5 and the sixth transistor T6 may be electrically connected to an emission control line EML, and may be simultaneously turned on according to an emission control signal EM received via the emission control line EML to form a current path such that a driving current may flow in a direction toward the emission element ED from the first voltage line VDDL.

The seventh transistor T7, as a second initialization transistor, may be electrically connected to a second scan line SL2, the second initialization voltage line VIL2, and the sixth transistor T6. The seventh transistor T7 may be turned on according to a second scan signal GB received via the second scan line SL2, and may transfer the second initialization voltage Vaint from the second initialization voltage line VIL2 to the first electrode of the emission element ED to initialize the first electrode of the emission element ED.

The storage capacitor Cst may include a first capacitor electrode CE1 and a second capacitor electrode CE2. The first capacitor electrode CE1 may be electrically connected to the gate electrode of the first transistor T1, and the second capacitor electrode CE2 may be electrically connected to the first voltage line VDDL. The storage capacitor Cst may store and maintain a voltage corresponding to a voltage difference between the first voltage line VDDL and opposite ends of the gate electrode of the first transistor T1, thereby maintaining a voltage applied to the gate electrode of the first transistor T1.

Referring to FIG. 4C, the pixel driving circuit unit PC may include a first transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and an auxiliary capacitor Ca.

The pixel driving circuit unit PC may be electrically connected to signal lines and voltage lines. The signal lines may include a gate line, such as, for example, a first scan line SL1, a second scan line SL2, a third scan line SL3, and an emission control line EML, and a data line DL. The voltage lines may include first and second initialization voltage lines VIL1 and VIL2, a maintenance voltage line VSL, and a first voltage line VDDL.

The first voltage line VDDL may be configured to transfer the first power voltage VDD to the first transistor T1. The first initialization voltage line VIL1 may be configured to transfer, to the pixel driving circuit unit PC, a first initialization voltage Vint for initializing the first transistor T1. The second initialization voltage line VIL2 may be configured to transfer, to the pixel driving circuit unit PC, a second initialization voltage Vaint for initializing a first electrode of the emission element ED. The maintenance voltage line VSL may provide a maintenance voltage VSUS to a second node N2, for example, the second capacitor electrode CE2 of the storage capacitor Cst, in an initialization period and a data write period.

The first transistor T1 may be electrically connected to the first voltage line VDDL via the fifth transistor T5 and the eighth transistor T8, and may be electrically connected to the emission element ED via the sixth transistor T6. The first transistor T1 may serve as a driving transistor, and may receive a data signal Dm according to a switching operation of the second transistor T2 and supply a driving current to the emission element ED.

The second transistor T2 may be electrically connected to the first scan line SL1 and the data line DL, and may be electrically connected to the first voltage line VDDL via the fifth transistor T5 and the eighth transistor T8. The second transistor T2 may be turned on according to a first scan signal GW received via the first scan line SL1 and may perform a switching operation for transferring, to a first node N1, the data signal Dm transmitted via the data line DL.

The third transistor T3 may be electrically connected to the first scan line SL1, and may be electrically connected to the emission element ED via the sixth transistor T6. The third transistor T3 may be turned on according to the first scan signal GW received via the first scan line SL1 to diode-connect the first transistor T1, thereby compensating for a threshold voltage of the first transistor T1.

The fourth transistor T4 may be electrically connected to the third scan line SL3 and the first initialization voltage line VIL1, and the fourth transistor T4 may be turned on according to the third scan signal GI received via the third scan line SL3 to transfer the first initialization voltage Vint from the first initialization voltage line VIL1 to the gate electrode of the first transistor T1, so as to initialize a voltage of the gate electrode of the first transistor T1. The third scan signal GI may correspond to a first scan signal of another pixel driving circuit unit arranged in a previous row of the pixel driving circuit unit PC.

The fifth transistor T5, the sixth transistor T6, and the eighth transistor T8 may be electrically connected to an emission control line EML, and may be simultaneously turned on according to an emission control signal EM received via the emission control line EML to form a current path such that a driving current may flow in a direction toward the emission element ED from the first voltage line VDDL.

The seventh transistor T7, as a second initialization transistor, may be electrically connected to a second scan line SL2, the second initialization voltage line VIL2, and the sixth transistor T6. The seventh transistor T7 may be turned on according to a second scan signal GB received via the second scan line SL2, and may transfer the second initialization voltage Vaint from the second initialization voltage line VIL2 to the first electrode of the emission element ED to initialize the first electrode of the emission element ED.

The ninth transistor T9 may be electrically connected to the second scan line SL2, and the second capacitor electrode CE2 of the storage capacitor Cst and the maintenance voltage line VSL. The ninth transistor T9 may be turned on according to the second scan signal GB received via the second scan line SL2, and may transfer a maintenance voltage VSUS to the second node N2, for example, the second capacitor electrode CE2 of the storage capacitor Cst, in the initialization period and the data write period.

Each of the eighth transistor T8 and the ninth transistor T9 may be electrically connected to the second node N2, for example, the second capacitor electrode CE2 of the storage capacitor Cst. In some embodiments, in the initialization period and the data write period, the eighth transistor T8 may be turned off, and the ninth transistor T9 may be turned on, and in the emission period, the eighth transistor T8 may be turned on, and the ninth transistor T9 may be turned off. In the initialization period and the data write period, the second node N2 receives the maintenance voltage VSUS, and thus, the luminance uniformity (e.g., long range uniformity (LRU)) of the display device according to a voltage drop of the first voltage line VDDL may be improved.

The storage capacitor Cst may include a first capacitor electrode CE1 and a second capacitor electrode CE2. The first capacitor electrode CE1 may be electrically connected to the gate electrode of the first transistor T1, and the second capacitor electrode CE2 may be electrically connected to the eighth transistor T8 and the ninth transistor T9.

The auxiliary capacitor Ca may be electrically connected to the sixth transistor T6, the maintenance voltage line VSL, and the first electrode of the emission element ED. While the seventh transistor T7 and the ninth transistor T9 are turned on, the auxiliary capacitor Ca may store and maintain a voltage corresponding to a voltage difference between the first electrode of the emission element ED and the maintenance voltage line VSL, thereby preventing black luminance from increasing when the sixth transistor T6 is turned off.

Figure 5:
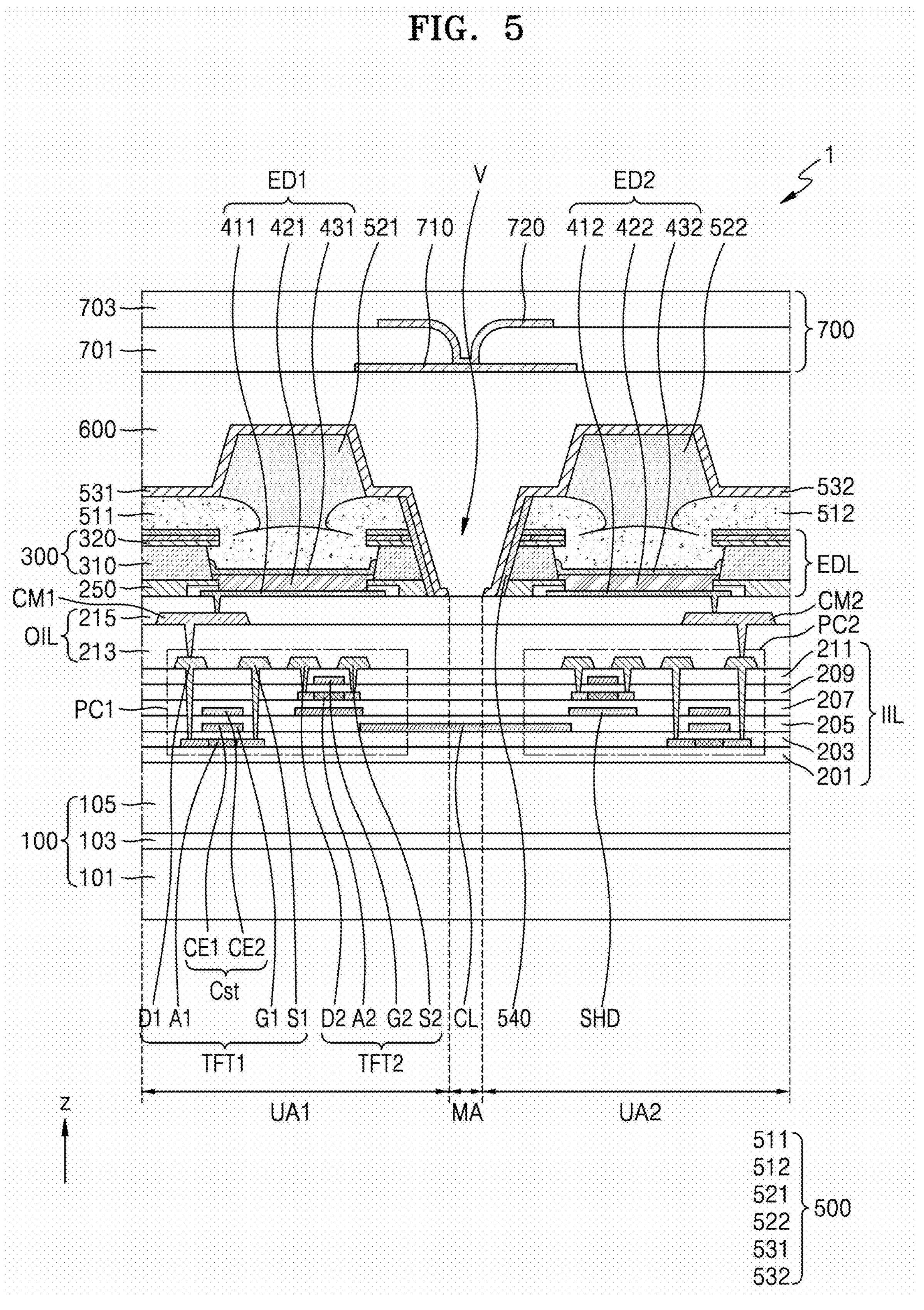
FIG. 5 is a cross-sectional view schematically illustrating a display device according to an embodiment.

FIG. 5 is a cross-sectional view schematically illustrating a display device 1 according to an embodiment.

Referring to FIG. 5, the display device 1 according to an embodiment may include a substrate 100, a first pixel circuit PC1 and a second pixel circuit PC2 disposed on the substrate 100, a first emission element ED1 electrically connected to the first pixel circuit PC1, and a second emission element ED2 electrically connected to the second pixel circuit PC2.

The display device 1 may include a first unit area UA1 in which the first emission element ED1 is arranged, a second unit area UA2 in which the second emission element ED2 is arranged, and an intermediate area MA located between the first unit area UA1 and the second unit area UA2. The intermediate area MA may be defined as an area not overlapping an emission element layer EDL and an encapsulation layer 500 described herein. Alternatively, the intermediate area MA may be defined as an area overlapping a valley portion V. The first unit area UA1, the second unit area UA2, and the intermediate area MA may be included in the display area DA (see FIG. 3).

Because elements constituting the display device 1 are disposed on the substrate 100, the substrate 100 may include an area corresponding to the first unit area UA1, an area corresponding to the second unit area UA2, and an area corresponding to the intermediate area MA. In one or more embodiments, descriptions that the substrate 100 includes the first unit area UA1 in which the first emission element ED1 is arranged, the second unit area UA2 in which the second emission element ED2 is arranged, and the intermediate area MA located between the first unit area UA1 and the second unit area UA2, mean that the substrate 100 includes an area corresponding to the first unit area UA1, an area corresponding to the second unit area UA2, and an area corresponding to the intermediate area MA.

The substrate 100 may include an insulating material such as, for example, glass, quartz, or polymer resin. Polymer resin may include, for example, polyethersulfone, polyacrylate, polyetherimide, polyethylene naphthalate, polyethylene terephthalate, polyphenylene sulfide, polyarylate, polyimide, polycarbonate, cellulose acetate propionate, or any mixtures thereof.

In some embodiments, the substrate 100 may be provided such that a barrier layer, which is an inorganic material layer, and a base layer, which is an organic material layer, are alternately arranged with each other. In FIG. 5, the substrate 100 includes a first base layer 101, a first barrier layer 103, and a second base layer 105. However, one or more embodiments are not limited thereto. Although not illustrated in FIG. 5, the display device 1 may include a second barrier layer arranged between the substrate 100 and a buffer layer 201.

The first base layer 101 and the second base layer 105 may include an inorganic material such as, for example, polymer resin. The first barrier layer 103 may prevent, or minimize, permeation of impurities from under the substrate 100. The first barrier layer 103 may include an inorganic material such as, for example, an oxide or nitride, and may have a single-layer or multi-layer structure. In some embodiments, the first barrier layer 103 may include silicon oxide, silicon nitride, and/or silicon oxynitride.

The buffer layer 201 may be disposed on the substrate 100. The buffer layer 201 may prevent or reduce permeation of impurities from the substrate 100, and the buffer layer 201 may provide a flat surface to the first pixel circuit PC1 and the second pixel circuit PC2 disposed on the buffer layer 201. The buffer layer 201 may include an inorganic material such as, for example, an oxide or nitride, and may have a single-layer or multi-layer structure. In some embodiments, the buffer layer 201 may include silicon oxide, silicon nitride, and/or silicon oxynitride.

The first pixel circuit PC1 and the second pixel circuit PC2 may be disposed on the buffer layer 201. Each of the first pixel circuit PC1 and the second pixel circuit PC2 may include a first thin-film transistor TFT1, a second thin-film transistor TFT2, and a storage capacitor Cst. The first thin-film transistor TFT1 may include a first semiconductor layer A1, a first gate electrode G1, a first source electrode S1, and a first drain electrode D1. The second thin-film transistor TFT2 may include a second semiconductor layer A2, a second gate electrode G2, a second source electrode S2, and a second drain electrode D2. The storage capacitor Cst may include a first capacitor electrode CE1 and a second capacitor electrode CE2. The first pixel circuit PC1 and the second pixel circuit PC2 may be similar to each other or may have substantially the same configuration as each other.

The first semiconductor layer A1 of the first thin-film transistor TFT1 may be disposed on the buffer layer 201. The first semiconductor layer A1 may include a channel region and impurity regions arranged at opposite sides of the channel region. One of the impurity regions arranged at opposite sides of the channel region may be a source region, and the other of the impurity regions may be a drain region.

The first semiconductor layer A1 may include a silicon-based semiconductor material, for example, polysilicon. In some embodiments, the first semiconductor layer A1 may include amorphous silicon.

A first gate insulating layer 203 may be disposed on the first semiconductor layer A1. The first gate electrode G1 may be disposed on the first gate insulating layer 203. The first gate electrode G1 may be arranged such that the first gate electrode G1 overlaps the channel region of the first semiconductor layer A1. The first gate electrode G1 may include a conductive material, for example, molybdenum (Mo), aluminum (Al), copper (Cu), and titanium (Ti), and may have a single-layer or multi-layer structure.

A second gate insulating layer 205 may be disposed on the first gate electrode G1. The second capacitor electrode CE2 may be disposed on the second gate insulating layer 205. The second capacitor electrode CE2 may be arranged such that the second capacitor electrode CE2 overlaps the first gate electrode G1. The first gate electrode G1 may be integrally provided as a single body with the first capacitor electrode CE1 of the storage capacitor Cst. The first capacitor electrode CE1 and the second capacitor electrode CE2 may constitute the storage capacitor Cst. The second capacitor electrode CE2 may include a conductive material, for example, Mo, Al, Cu, and Ti, and may have a single-layer or multi-layer structure.

A first interlayer insulating layer 207 may be disposed on the second capacitor electrode CE2. The second semiconductor layer A2 of the second thin-film transistor TFT2 may be disposed on the first interlayer insulating layer 207. The second semiconductor layer A2 may include a channel region and impurity regions arranged at opposite sides of the channel region. The second semiconductor layer A2 may include an oxide-based semiconductor material, for example, a zinc (Zn) oxide-based material. The second semiconductor layer A2 may be In—Ga—Zn—O (IGZO), In—Sn—Zn—O (ITZO), or In—Ga—Sn—Zn—O (IGTZO) semiconductor, in which metal such as, for example, indium (In), gallium (Ga), and tin (Sn) is contained in zinc oxide (ZnO).

A shield layer SHD may be arranged between the first interlayer insulating layer 207 and the second gate insulating layer 205 and overlap the second semiconductor layer A2. The shield layer SHD may prevent, or reduce, deterioration of characteristics of the second thin-film transistor TFT2 by external light.

A third gate insulating layer 209 may be disposed on the second semiconductor layer A2. The second gate electrode G2 may be disposed on the third gate insulating layer 209. The second gate electrode G2 may be arranged such that the second gate electrode G2 overlaps the channel region of the second semiconductor layer A2. The second gate electrode G2 may include a conductive material, for example, Mo, Al, Cu, and Ti, and may have a single-layer or multi-layer structure.

A second interlayer insulating layer 211 may be disposed on the second gate electrode G2. The first source electrode S1, the first drain electrode D1, the second source electrode S2, and the second drain electrode D2 may be disposed on the second interlayer insulating layer 211. In some embodiments, one or more of the first source electrode S1, the first drain electrode D1, the second source electrode S2, and the second drain electrode D2 may be omitted. The first source electrode S1, the first drain electrode D1, the second source electrode S2, and the second drain electrode D2 may include Mo, Al, Cu, or Ti, and may have a single-layer or multi-layer structure.

Elements of the first pixel circuit PC1 and the second pixel circuit PC2 may be connected to each other through a connection line CL. In FIG. 5, the connection line CL is arranged between the first gate insulating layer 203 and the second gate insulating layer 205. However, one or more embodiments are not limited thereto. In some embodiments, the connection line CL may be arranged between the buffer layer 201 and the first gate insulating layer 203 and may connect the first semiconductor layer A1 of the first pixel circuit PC1 and a first semiconductor layer of the second pixel circuit PC2 to each other. In some embodiments, the connection line CL may be arranged between the second interlayer insulating layer 211 and a first planarization layer 213 and may connect any one of the first source electrode S1, the first drain electrode D1, the second source electrode S2, and the second drain electrode D2 of the first pixel circuit PC1 and any one of the first source electrode S1, the first drain electrode D1, the second source electrode S2, and the second drain electrode D2 of the second pixel circuit PC2 to each other.

Each of the buffer layer 201, the first gate insulating layer 203, the second gate insulating layer 205, the first interlayer insulating layer 207, the third gate insulating layer 209 and the second interlayer insulating layer 211 may include an inorganic insulating material, such as, for example, silicon oxide, silicon nitride, silicon oxynitride, aluminum oxide, titanium oxide, tantalum oxide, hafnium oxide, and/or zinc oxide. Inorganic material layers arranged between the substrate 100 and the emission element layer EDL may be defined as an inorganic insulating layer IIL. For example, the inorganic insulating layer IIL may include the buffer layer 201, the first gate insulating layer 203, the second gate insulating layer 205, the first interlayer insulating layer 207, the third gate insulating layer 209 and the second interlayer insulating layer 211.

The first planarization layer 213 may be disposed on the inorganic insulating layer IIL and cover the first source electrode S1, the first drain electrode D1, the second source electrode S2, and the second drain electrode D2. A second planarization layer 215 may be disposed on the first planarization layer 213. The first planarization layer 213 and the second planarization layer 215 may include general-purpose polymers, such as, for example, benzocyclobutene (BCB), polyimide, hexamethyldisiloxane (HMDSO), polymethylmethacrylate (PMMA), or polystyrene (PS), polymer derivatives having a phenol-based group, acryl-based polymers, imide-based polymers, aryl ether-based polymers, amide-based polymers, fluorine-based polymers, p-xylene-based polymers, or vinyl alcohol-based polymers. The first planarization layer 213 and the second planarization layer 215 may provide a flat base surface to elements disposed over the first planarization layer 213 and the second planarization layer 215.

Organic material layers arranged between the inorganic insulating layer IIL and the emission element layer EDL may be defined as an organic insulating layer OIL. For example, the organic insulating layer OIL may include the first planarization layer 213 and the second planarization layer 215. In some embodiments, the organic insulating layer OIL may have a relatively low modulus. For example, a modulus of each of the first planarization layer 213 and the second planarization layer 215 may be about 3 MPa to about 20 MPa.

A first connection electrode CM1 and a second connection electrode CM2 may be arranged between the first planarization layer 213 and the second planarization layer 215. The first connection electrode CM1 and the second connection electrode CM2 may include Mo, Al, Cu, or Ti, and may have a single-layer or multi-layer structure.

The first emission element ED1, the second emission element ED2, and the emission element layer EDL including an inorganic bank layer 250 and a metal bank layer 300 may be disposed on the organic insulating layer OIL. The first emission element ED1 may be arranged such that the first emission element ED1 overlaps the first unit area UA1, and the second emission element ED2 may be arranged such that the second emission element ED2 overlaps the second unit area UA2. The first emission element ED1 may include a first pixel electrode 411, a first opposite electrode 431, and a first intermediate layer 421 arranged between the first pixel electrode 411 and the first opposite electrode 431. The second emission element ED2 may include a second pixel electrode 412, a second opposite electrode 432, and a second intermediate layer 422 arranged between the second pixel electrode 412 and the second opposite electrode 432. The first emission element ED1 and the second emission element ED2 may have structures substantially identical or similar to each other.

The first pixel electrode 411 and the second pixel electrode 412 may be disposed on the second planarization layer 215. The first pixel electrode 411 may be electrically connected to the first pixel circuit PC1 via the first connection electrode CM1. The second pixel electrode 412 may be electrically connected to the second pixel circuit PC2 via the second connection electrode CM2.

The first pixel electrode 411 and the second pixel electrode 412 may include a conductive oxide, such as, for example, indium tin oxide (ITO), indium zinc oxide (IZO), zinc oxide (ZnO), indium oxide ($In_2O_3$), indium gallium oxide (IGO), or aluminum zinc oxide (AZO). In some embodiments, the first pixel electrode 411 and the second pixel electrode 412 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or any compounds thereof. In some embodiments, the first pixel electrode 411 and the second pixel electrode 412 may further include a layer including ITO, IZO, ZnO, AZO, or $In_2O_3$, over or under the reflective layer described herein.

Each of the first intermediate layer 421 and the second intermediate layer 422 may include an emission layer emitting light of a certain color. The emission layer may include a polymer or low-molecular weight organic material. The first intermediate layer 421 and the second intermediate layer 422 may respectively include a first functional layer disposed under the emission layer and a second functional layer disposed over the emission layer. The first functional layer may include a hole transport layer (HTL) and/or a hole injection layer (HIL). The second functional layer may include an electron transport layer (ETL) and/or an electron injection layer (EIL).

The first opposite electrode 431 and the second opposite electrode 432 may each include a conductive material having a low work function. For example, the first opposite electrode 431 and the second opposite electrode 432 may each include a (semi-) transparent layer including Ag, Mg, Al, Pt, Pd, Au, Ni, Nd, Ir, Cr, lithium (Li), calcium (Ca), or any alloys thereof. Alternatively, the first opposite electrode 431 and the second opposite electrode 432 may each further include a layer including ITO, IZO, ZnO, AZO, or $In_2O_3$, over the (semi-) transparent layer including the materials described herein.

The inorganic bank layer 250 may be disposed on the organic insulating layer OIL and cover an edge of each of the first pixel electrode 411 and the second pixel electrode 412. The inorganic bank layer 250 may define pixel openings that expose a portion of each of the first pixel electrode 411 and the second pixel electrode 412. The pixel opening may define an emission area of a corresponding emission element.

The inorganic bank layer 250 may include an inorganic material, such as, for example, silicon oxide, silicon nitride, and/or silicon oxynitride, and may have a single-layer or multi-layer structure. The inorganic bank layer 250 may increase a distance between an edge of the first pixel electrode 411 and the first opposite electrode 431 and a distance between an edge of the second pixel electrode 412 and the second opposite electrode 432, thereby preventing an arc or the like from occurring between the first pixel electrode 411 and the first opposite electrode 431 and/or between the second pixel electrode 412 and the second opposite electrode 432.

The metal bank layer 300 may be disposed on the inorganic bank layer 250. The metal bank layer 300 may include a first metal layer 310 and a second metal layer 320 disposed on the first metal layer 310. The first metal layer 310 and the second metal layer 320 may include different metals from each other. In some embodiments, the first metal layer 310 may include Al or Mo, and the second metal layer 320 may include Ti or Ta. The first metal layer 310 may define first bank openings overlapping the pixel openings, and the second metal layer 320 may define second bank openings overlapping the pixel openings. A width (or area) of the first bank opening defined in the first metal layer 310 may be greater than a width (or area) of the second bank opening defined in the second metal layer 320. In other words, an undercut structure may be formed in which the second metal layer 320 protrudes by removing a portion of the first metal layer 310 disposed under the second metal layer 320. The second metal layer 320 may have a tip protruding from a side surface of the first metal layer 310 defining the first bank opening.

Dummy stacks may be disposed on an upper surface of the second metal layer 320. A first dummy stack located in an area adjacent to the first emission element ED1 may include dummy layers respectively including the same materials as the first intermediate layer 421 and the first opposite electrode 431. A second dummy stack located in an area adjacent to the second emission element ED2 may include dummy layers respectively including the same materials as the second intermediate layer 422 and the second opposite electrode 432.

The first opposite electrode 431 may be in direct contact with a side surface of the first metal layer 310 facing a center portion of the pixel opening. The second opposite electrode 432 may be in direct contact with a side surface of the first metal layer 310 facing a center portion of the pixel opening. Because the metal bank layer 300 is electrically connected to a voltage line configured to transfer a common power voltage, the first opposite electrode 431 and the second opposite electrode 432 may receive the common power voltage.

The encapsulation layer 500 may be disposed on the emission element layer EDL. The encapsulation layer 500 may include a first inorganic encapsulation layer 511 overlapping the first unit area UA1, a second inorganic encapsulation layer 512 overlapping the second unit area UA2, a third inorganic encapsulation layer 531 disposed on the first inorganic encapsulation layer 511, a fourth inorganic encapsulation layer 532 disposed on the second inorganic encapsulation layer 512, a first organic encapsulation layer 521 disposed between the first inorganic encapsulation layer 511 and the third inorganic encapsulation layer 531, and a second organic encapsulation layer 522 disposed between the second inorganic encapsulation layer 512 and the fourth inorganic encapsulation layer 532.

The first inorganic encapsulation layer 511, the second inorganic encapsulation layer 512, the third inorganic encapsulation layer 531, and the fourth inorganic encapsulation layer 532 may include an inorganic material, such as, for example, silicon oxide, silicon nitride, and/or silicon oxynitride, and may have a single-layer or multi-layer structure.

The first inorganic encapsulation layer 511 and the second inorganic encapsulation layer 512 may be formed by chemical vapor deposition (CVD) or the like. The first inorganic encapsulation layer 511 has a relatively excellent step coverage (e.g., step coverage greater than a threshold value) and may be in direct contact with a surface of the first metal layer 310 and a surface of the second metal layer 320 that are not covered by the first intermediate layer 421 and the first opposite electrode 431, to form an inorganic contact area for sealing the first emission element ED1. In some aspects, similar to the first inorganic encapsulation layer 511, the second inorganic encapsulation layer 512 may be in direct contact with a surface of the first metal layer 310 and a surface of the second metal layer 320 that are not covered by the second intermediate layer 422 and the second opposite electrode 432, to form an inorganic contact area for sealing the second emission element ED2.

The first organic encapsulation layer 521 may be disposed on the first inorganic encapsulation layer 511, and the second organic encapsulation layer 522 may be disposed on the second inorganic encapsulation layer 512. Each of the first organic encapsulation layer 521 and the second organic encapsulation layer 522 may fill in pixel openings and provide a flat base surface to elements disposed over the first organic encapsulation layer 521, the second organic encapsulation layer 522, and/or the pixel openings. The first organic encapsulation layer 521 and the second organic encapsulation layer 522 may include a polymer-based material. Polymer-based materials may include, for example, acryl-based resin, epoxy-based resin, polyimide, and polyethylene. In some embodiments, the first organic encapsulation layer 521 and the second organic encapsulation layer 522 may be arranged to respectively correspond to the first emission element ED1 and the second emission element ED2 through an inkjet process or a photo patterning process.

The third inorganic encapsulation layer 531 may be disposed on the first organic encapsulation layer 521, and the fourth inorganic encapsulation layer 532 may be disposed on the second organic encapsulation layer 522. The third inorganic encapsulation layer 531 may cover the entire surface of the first unit area UA1, and the fourth inorganic encapsulation layer 532 may cover the entire surface of the second unit area UA2. The first inorganic encapsulation layer 511 and the third inorganic encapsulation layer 531 may constitute an inorganic contact area surrounding the first emission element ED1. The second inorganic encapsulation layer 512 and the fourth inorganic encapsulation layer 532 may constitute an inorganic contact area surrounding the second emission element ED2.

The emission element layer EDL and the encapsulation layer 500 may define the valley portion V overlapping the intermediate area MA and exposing an upper surface of the organic insulating layer OIL. The valley portion V may be arranged such that the valley portion V surrounds each of the first unit area UA1 and the second unit area UA2. For example, a portion of the emission element layer EDL overlapping the first unit area UA1 may be arranged to be apart from a portion of the emission element layer EDL overlapping the second unit area UA2, with the intermediate area MA between the portions of the emission element layer EDL. Likewise, for example, a portion of the encapsulation layer 500 overlapping the first unit area UA1 may be arranged to be apart from a portion of the encapsulation layer 500 overlapping the second unit area UA2, with the intermediate area MA between the portions of the encapsulation layer 500. In other words, each of the emission element layer EDL and the encapsulation layer 500 may not overlap the intermediate area MA. Accordingly, in the intermediate area MA, an inorganic material layer may not be arranged between the organic insulating layer OIL and a third planarization layer 600.

When the display device 1 is stretched or bent, stress may be concentrated in the intermediate area MA that does not overlap the emission element layer EDL and the encapsulation layer 500. Thus, cracks or the like in inorganic films included in the emission element layer EDL and the encapsulation layer 500 may be prevented or reduced.

The encapsulation layer 500 may cover a side surface of the inorganic bank layer 250 facing the intermediate area MA and a side surface of the metal bank layer 300 facing the intermediate area MA. In this case, side surfaces of the first metal layer 310 and the second metal layer 320 facing the intermediate area MA may be smoothly connected so as not to form a tip or groove. FIG. 5 illustrates that the third inorganic encapsulation layer 531 extends to an upper surface of the organic insulating layer OIL and covers a first side surface of the inorganic bank layer 250 facing the intermediate area MA and a first side surface of the metal bank layer 300 facing the intermediate area MA. FIG. 5 illustrates that the fourth inorganic encapsulation layer 532 extends to the upper surface of the organic insulating layer OIL and covers a second side surface of the inorganic bank layer 250 facing the intermediate area MA and a second side surface of the metal bank layer 300 facing the intermediate area MA. Here, the first side surface and the second side surface may be arranged to face each other.

A cover layer 540 may be arranged between the encapsulation layer 500 and a side surface of the inorganic bank layer 250 facing the intermediate area MA and the encapsulation layer 500 and a side surface of the metal bank layer 300 facing the intermediate area MA. The cover layer 540 may include an inorganic material, such as, for example, silicon oxide, silicon nitride, and/or silicon oxynitride, and may have a single-layer or multi-layer structure. In some embodiments, in a process of forming the valley portion V, irregularities or the like may be formed due to differences in etch rates of materials included in each layer. The cover layer 540 may fill in these irregularities to prevent cracks or the like from occurring from side surfaces of the valley portion V.

The third planarization layer 600 may be disposed on the encapsulation layer 500. The third planarization layer 600 may provide a flat base surface for elements disposed over the third planarization layer 600 and the encapsulation layer 500. The third planarization layer 600 may include a polymer-based material. Polymer-based materials may include, for example, acryl-based resin, epoxy-based resin, polyimide, and polyethylene. In some embodiments, the third planarization layer 600 may have a relatively low modulus. For example, a modulus of the third planarization layer 600 may be about 3 MPa to about 20 MPa.

A touch sensor layer 700 may be disposed on the third planarization layer 600. The touch sensor layer 700 may be a layer configured for obtaining coordinate information according to an external input, for example, a touch event. The touch sensor layer 700 may include a sensing electrode (or touch electrode) and trace lines connected to the sensing electrode. The touch sensor layer 700 may detect an external input by using a mutual capacitance method and/or a self-capacitance method.

The touch sensor layer 700 may include a first touch electrode 710, a second touch electrode 720, a first touch insulating layer 701 between the first touch electrode 710 and the second touch electrode 720, and a second touch insulating layer 703 on the second touch electrode 720.

The first touch electrode 710 and the second touch electrode 720 may include a metal layer or a transparent conductive layer. The metal layer may include Mo, mendelevium (Md), silver (Ag), Ti, Cu, Al, or any alloys thereof. The transparent conductive layer may include a transparent conductive oxide, such as, for example, indium tin oxide, indium zinc oxide, zinc oxide, indium oxide, indium gallium oxide, or aluminum zinc oxide. In addition, the transparent conductive layer may include conductive polymers, such as, for example, poly(3,4-ethylenedioxythiophene) (PEDOT), metal nanowires, carbon nanotubes, and graphene.

In some embodiments, the first touch electrode 710 and the second touch electrode 720 may have a mesh structure including a plurality of holes. The plurality of holes may be arranged such that the holes overlap an emission area of the first emission element ED1 and an emission area of the second emission element ED2. In some embodiments, the first touch electrode 710 and the second touch electrode 720 may have a serpentine shape to facilitate stretching.

The first touch insulating layer 701 and the second touch insulating layer 703 may include a polymer-based material. Polymer-based materials may include, for example, acryl-based resin, epoxy-based resin, polyimide, and polyethylene. In some embodiments, the touch sensor layer 700 may include a third touch insulating layer between the first touch electrode 710 and the third planarization layer 600. The third touch insulating layer may be an inorganic material layer.

Figure 6A:
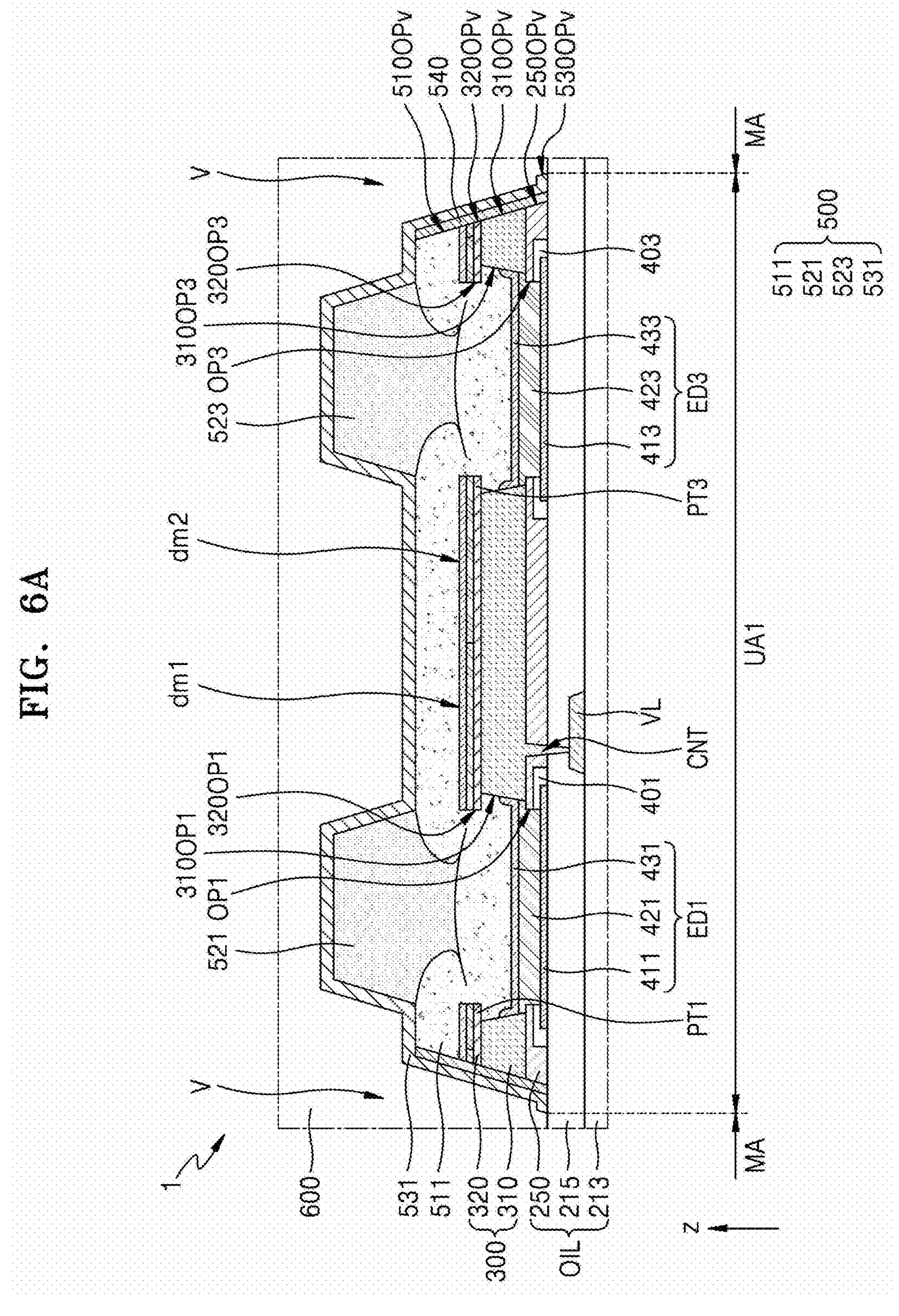
FIGS. 6A to 6C are cross-sectional views schematically illustrating a display device according to one or more embodiments.
Figure 6B:
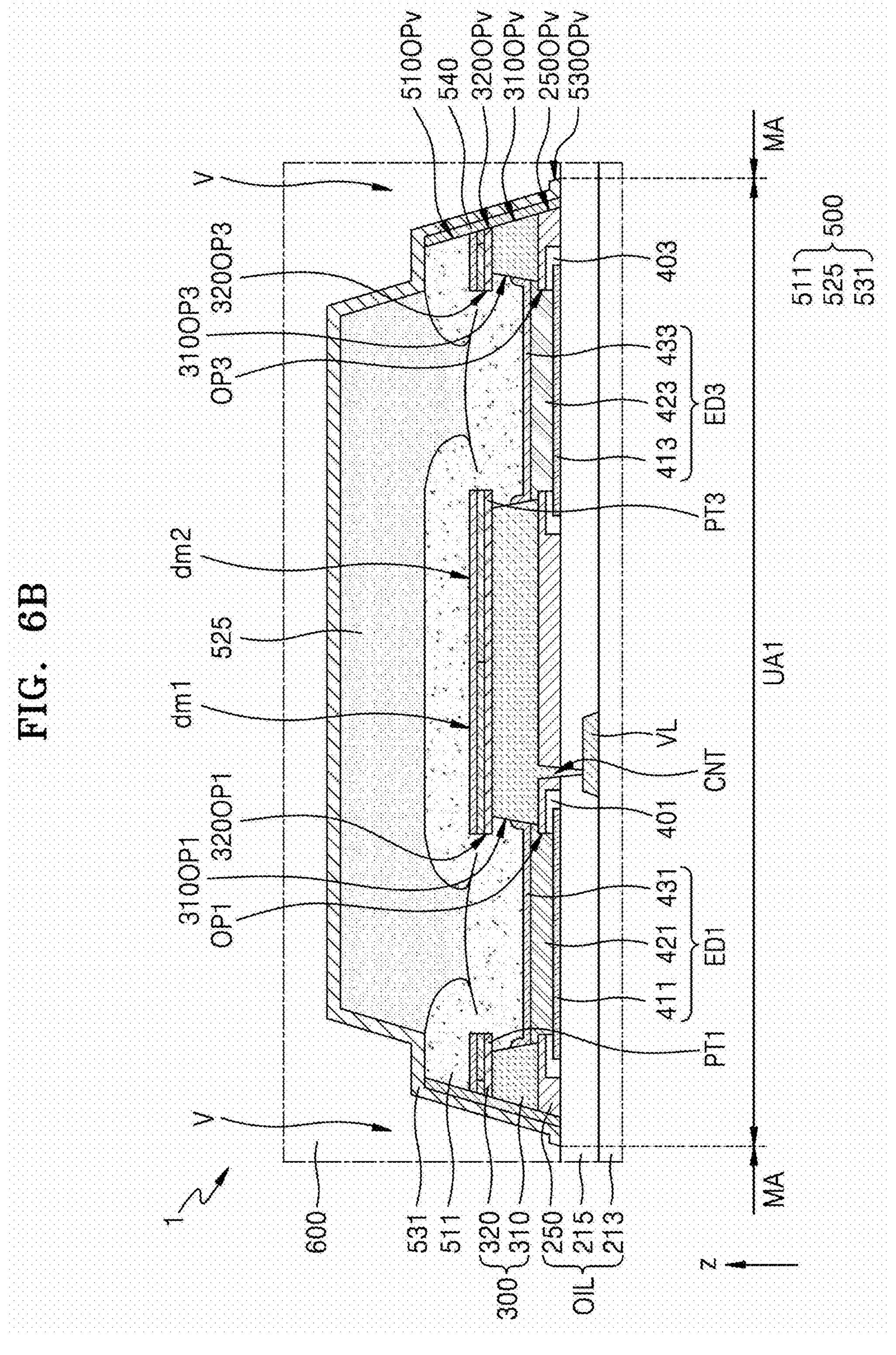
Figure 6C:
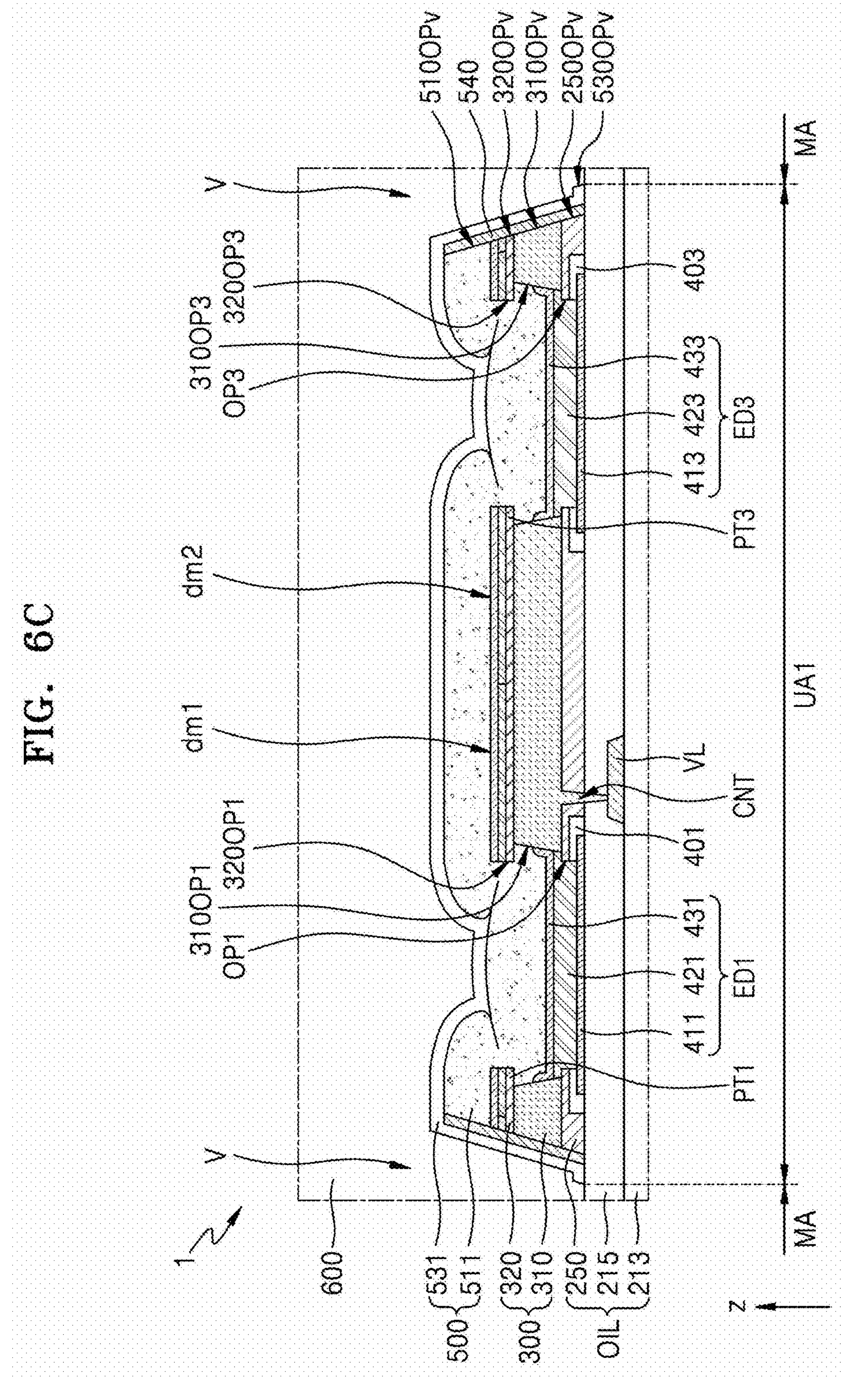

FIGS. 6A to 6C are cross-sectional views schematically illustrating a display device 1 according to one or more embodiments.

Referring to FIG. 6A, one or more emission elements may overlap the first unit area UA1. For example, the first emission element ED1 and a third emission element ED3 may be arranged such that the first emission element ED1 and the third emission element ED3 overlap the first unit area UA1. The first unit area UA1 may be surrounded by the intermediate area MA. In other words, in a plan view, the first unit area UA1 may have an island shape that is apart from other neighboring unit areas, with the intermediate area MA between the first unit area UA1 and the other neighboring unit areas.

The organic insulating layer OIL may include the first planarization layer 213 and the second planarization layer 215. A voltage line VL may be arranged between the first planarization layer 213 and the second planarization layer 215. The voltage line VL may include the same material as those of the first connection electrode CM1 (see FIG. 5) and the second connection electrode CM2 (see FIG. 5). The voltage line VL may be configured to transfer the common power voltage VSS (see FIG. 4A). For example, the voltage line VL may be electrically connected to the second voltage line VSSL (see FIG. 4A) and may extend to the display area DA (see FIGS. 2A through 2E). In some embodiments, the voltage line VL may have a mesh structure including a plurality of horizontal voltage lines and a plurality of vertical voltage lines crossing each other in the display area DA (see FIGS. 2A through 2E).

The first emission element ED1 and the third emission element ED3 may be disposed on the organic insulating layer OIL. The first emission element ED1 may include a first pixel electrode 411, a first opposite electrode 431, and a first intermediate layer 421 arranged between the first pixel electrode 411 and the first opposite electrode 431. The third emission element ED3 may include a third pixel electrode 413, a third opposite electrode 433, and a third intermediate layer 423 arranged between the third pixel electrode 413 and the third opposite electrode 433. The first emission element ED1 and the third emission element ED3 may have structures substantially identical or similar to each other.

The first pixel electrode 411 and the third pixel electrode 413 may be disposed on the second planarization layer 215. As described with reference to FIG. 5, the first pixel electrode 411 and the third pixel electrode 413 may be respectively electrically connected to corresponding pixel circuits through connection electrodes arranged between the first planarization layer 213 and the second planarization layer 215.

The inorganic bank layer 250 may be disposed on the organic insulating layer OIL and cover an edge of each of the first pixel electrode 411 and the third pixel electrode 413. The inorganic bank layer 250 may have a first pixel opening OP1 exposing a part of the first pixel electrode 411 and a third pixel opening OP3 exposing a part of the third pixel electrode 413. The first pixel opening OP1 may define an emission area of the first emission element ED1, and the third pixel opening OP3 may define an emission area of the third emission element ED3.

A portion of a first sacrificial layer 401 may remain between the inorganic bank layer 250 and the first pixel electrode 411. The first sacrificial layer 401 may be a layer configured for preventing damage to a surface of the first pixel electrode 411 during a process of forming the first pixel opening OP1. A portion of a third sacrificial layer 403 may remain between the inorganic bank layer 250 and the third pixel electrode 413. The third sacrificial layer 403 may be a layer configured for preventing damage to a surface of the third pixel electrode 413 during a process of forming the third pixel opening OP3. In some aspects, the first sacrificial layer 401 and the third sacrificial layer 403 may include a conductive oxide, IZO and/or IGZO.

The metal bank layer 300 may be disposed on the inorganic bank layer 250. The metal bank layer 300 may include the first metal layer 310 and the second metal layer 320. The first metal layer 310 may define a first-1 bank opening 310OP1 overlapping the first pixel opening OP1 and a first-3 bank opening 3100P3 overlapping the third pixel opening OP3. The second metal layer 320 may define a second-1 bank opening 320OP1 overlapping the first pixel opening OP1 and a second-3 bank opening 320OP3 overlapping the third pixel opening OP3.

A width (or area) of the first-1 bank opening 310OP1 may be greater than an width (or area) of the second-1 bank opening 320OP1. A width (or area) of the first-3 bank opening 310OP3 may be greater than a width (or area) of the second-3 bank opening 320OP3. Accordingly, for example, an undercut structure may be formed in which the second metal layer 320 protrudes by removing a portion of the first metal layer 310 disposed under the second metal layer 320. For example, the second metal layer 320 may have a first tip PT1 protruding in a center direction of the first pixel opening OP1 from a side surface of the first metal layer 310 and a third tip PT3 protruding in a center direction of the third pixel opening OP3 from the side surface of the first metal layer 310.

The first metal layer 310 of the metal bank layer 300 may be electrically connected to the voltage line VL through a contact hole CNT defined in the inorganic bank layer 250 and the second planarization layer 215. In each unit area, at least one contact hole CNT may be arranged to electrically connect the metal bank layer 300 and the voltage line VL to each other.

The first intermediate layer 421 may be disposed on the first pixel electrode 411 such that the first intermediate layer 421 overlaps the first pixel opening OP1, and the third intermediate layer 423 may be disposed on the third pixel electrode 413 such that the third intermediate layer 423 overlaps the third pixel opening OP3. Each of the first intermediate layer 421 and the third intermediate layer 423 may include an emission layer emitting light of a color. Each emission layer may be formed by using a fine metal mask (FMM) or the like to correspond to the first pixel electrode 411 and the third pixel electrode 413. A material of the first intermediate layer 421 and a material of the third intermediate layer 423 may be deposited on the second metal layer 320 to form a dummy layer.

The first opposite electrode 431 may be disposed on the first intermediate layer 421 such that the first opposite electrode 431 overlaps the first pixel opening OP1, and the third opposite electrode 433 may be disposed on the third intermediate layer 423 such that the third opposite electrode 433 overlaps the third pixel opening OP3. The first opposite electrode 431 may be in direct contact with a side surface of the first metal layer 310 facing the center of the first pixel opening OP1. The third opposite electrode 433 may be in direct contact with a side surface of the first metal layer 310 facing the center of the third pixel opening OP3. Because the metal bank layer 300 is electrically connected through the contact hole CNT to the voltage line VL configured to transfer a common power voltage, the first opposite electrode 431 and the third opposite electrode 433 may receive the common power voltage.

Materials of the first opposite electrode 431 and the third opposite electrode 433 may be deposited on the second metal layer 320 to form a dummy layer. For example, a material of the first intermediate layer 421 and a material of the first opposite electrode 431 may be deposited on the second metal layer 320 adjacent to the first emission element ED1, to form a first dummy stack dm1. A material of the third intermediate layer 423 and the material of the third opposite electrode 433 may be deposited on the second metal layer 320 adjacent to the third emission element ED3, to form a second dummy stack dm2. Because the first opposite electrode 431 and the third opposite electrode 433 may be formed through the same process, the material of the first opposite electrode 431 and the material of the third opposite electrode 433 may be identical to each other.

The first dummy stack dm1 may be separated and spaced apart from the first intermediate layer 421 and the first opposite electrode 431 by the first tip PT1. The second dummy stack dm2 may be separated and spaced apart from the third intermediate layer 423 and the third opposite electrode 433 by the third tip PT3.

The encapsulation layer 500 may be arranged such that the encapsulation layer 500 covers the first emission element ED1 and the third emission element ED3. The encapsulation layer 500 may include the first inorganic encapsulation layer 511, the first organic encapsulation layer 521, a third organic encapsulation layer 523, and the third inorganic encapsulation layer 531 covering the first organic encapsulation layer 521 and the third organic encapsulation layer 523.

The first inorganic encapsulation layer 511 may overlap the first emission element ED1 and the third emission element ED3. The first inorganic encapsulation layer 511 may be in direct contact with a surface of the first metal layer 310 and a surface of the second metal layer 320 that are not covered by the first intermediate layer 421, the first opposite electrode 431, the third pixel electrode 423, and the third opposite electrode 433, and may form an inorganic contact area for sealing each of the first emission element ED1 and the second emission element ED2.

The first organic encapsulation layer 521 may be arranged to correspond to the first emission element ED1, so as to fill in the first-1 bank opening 310OP1 and the second-1 bank opening 320OP1. The third organic encapsulation layer 523 may be arranged to correspond to the third emission element ED3, so as to fill the first-3 bank opening 310OP3, and the second-3 bank opening 320OP3. The first organic encapsulation layer 521 and the third organic encapsulation layer 523 may be arranged apart from each other.

The third inorganic encapsulation layer 531 may cover the entire surface of the first unit area UA1. The third inorganic encapsulation layer 531 may overlap the first emission element ED1 and the third emission element ED3. The third inorganic encapsulation layer 531 may be in direct contact with the first inorganic encapsulation layer 511 in an area in which the first organic encapsulation layer 521 and the third organic encapsulation layer 523 are not arranged, such that the third inorganic encapsulation layer 531 and the first inorganic encapsulation layer 511 form an inorganic contact area. The third inorganic encapsulation layer 531 and the first inorganic encapsulation layer 511 may form an inorganic contact area surrounding the first emission element ED1 and the third emission element ED3.

The emission element layer EDL and the encapsulation layer 500 may define the valley portion V overlapping the intermediate area MA and exposing an upper surface of the organic insulating layer OIL. For example, the valley portion V may be formed by overlapping of an opening 250OPv of the inorganic bank layer 250, an opening 310OPv of the first metal layer 310, an opening 320OPv of the second metal layer 320, a first encapsulation opening 510OPv, and a second encapsulation opening 530OPv. Here, the first encapsulation opening 510OPv may be defined by the first inorganic encapsulation layer 511 and an inorganic encapsulation layer (for example, the second inorganic encapsulation layer 512 illustrated in FIG. 5) arranged on the same layer as the first inorganic encapsulation layer 511 and neighboring the first inorganic encapsulation layer 511. Likewise, the second encapsulation opening 530OPv may be defined by the third inorganic encapsulation layer 531 and an inorganic encapsulation layer (for example, the fourth inorganic encapsulation layer 532 illustrated in FIG. 5) arranged on the same layer as the third inorganic encapsulation layer 531 and neighboring the third inorganic encapsulation layer 531.

The third inorganic encapsulation layer 531 may extend such that the third inorganic encapsulation layer 531 is in direct contact with an upper surface of the organic insulating layer OIL. Accordingly, the third inorganic encapsulation layer 531 may form a side surface of the valley portion V.

The valley portion V may be arranged such that the valley portion V surrounds the first unit area UA1. For example, a portion of the inorganic bank layer 250, a portion of the metal bank layer 300, and a portion of the encapsulation layer 500, overlapping the first unit area UA1, may have an island shape segmented from a surrounding area by the valley portion V.

The cover layer 540 may be arranged between the encapsulation layer 500 and a side surface of the inorganic bank layer 250 facing the intermediate area MA and between the encapsulation layer 500 and a side surface of the metal bank layer 300 facing the intermediate area MA. For example, the cover layer 540 may be disposed under the third inorganic encapsulation layer 531 and cover an inner surface of each of the opening 250OPv of the inorganic bank layer 250, the opening 310OPv of the first metal layer 310, the opening 320OPv of the second metal layer 320, and the first encapsulation opening 510OPv. In a process of forming the opening 250OPv of the inorganic bank layer 250, the opening 310OPv of the first metal layer 310, the opening 320OPv of the second metal layer 320, and the first encapsulation opening 510OPv, the cover layer 540 may fill in irregularities, indentations, protrusions, cracks, or the like formed due to differences in etch rate of materials, such that the valley portion V may have a flatter side surface.

FIG. 6B is similar to FIG. 6A, differing in that a fourth organic encapsulation layer 525 overlapping the first emission element ED1 and the third emission element ED3 is arranged between the first inorganic encapsulation layer 511 and the third inorganic encapsulation layer 531. The fourth organic encapsulation layer 525 may be arranged such that the fourth organic encapsulation layer 525 overlaps a plurality of emission elements arranged in the first unit area UA1. Thus, the fourth organic encapsulation layer 525 may provide a flatter base surface to the third inorganic encapsulation layer 531.

In some embodiments, as illustrated in FIG. 6C, the first organic encapsulation layer 521, the third organic encapsulation layer 523, and the fourth organic encapsulation layer 525 may all be omitted, and the first inorganic encapsulation layer 511 and the third inorganic encapsulation layer 531 may be in direct contact with each other.

FIGS. 7A to 7H are cross-sectional views schematically illustrating some operations of a process of manufacturing a display device, according to an embodiment. In FIGS. 7A to 7H, the configuration from the substrate 100 to the first planarization layer 213 of the display device 1 illustrated in FIG. 5 are omitted, and the second planarization layer 215, the emission element layer EDL, and the encapsulation layer 500 are mainly illustrated.

Figure 7A:
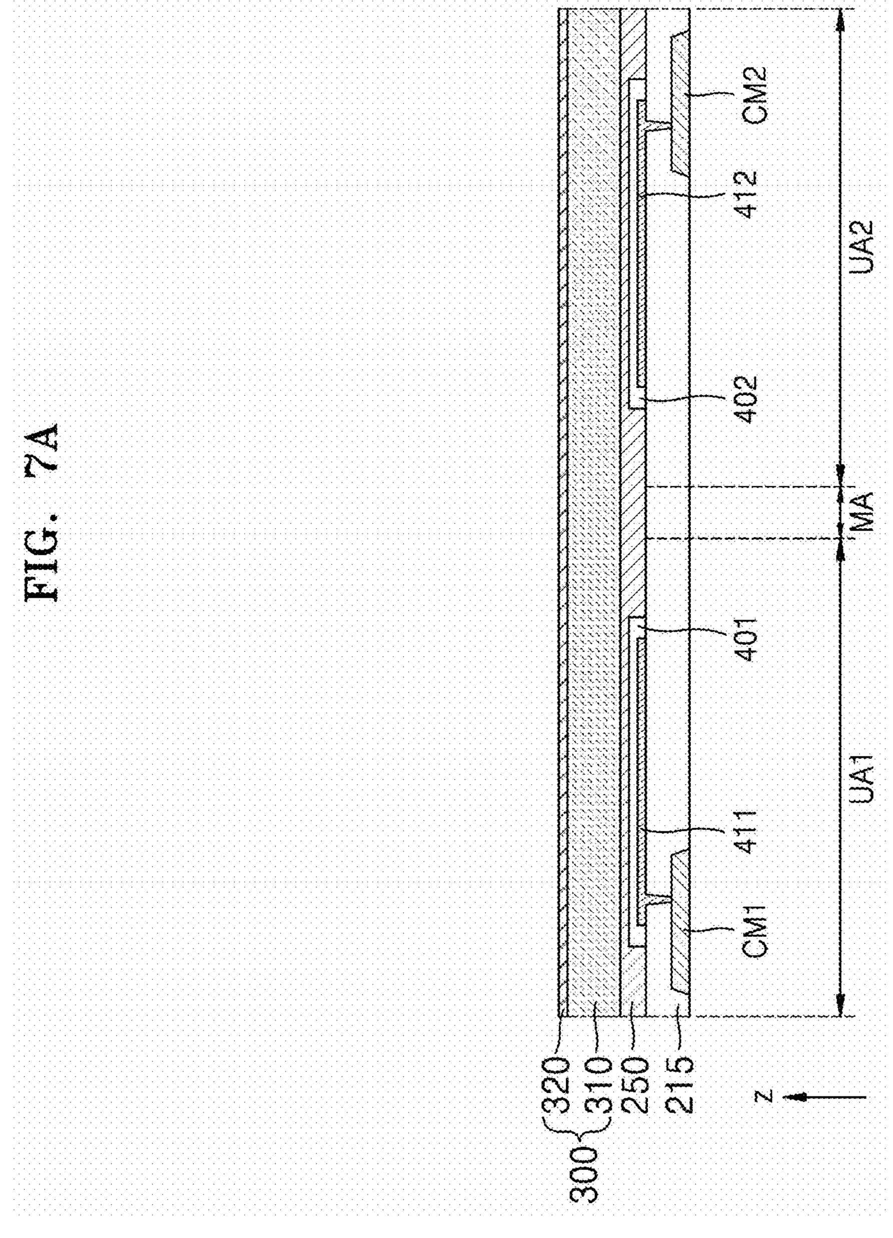
FIGS. 7A to 7H are cross-sectional views schematically illustrating some operations of a process of manufacturing a display device, according to an embodiment.

Referring to FIG. 7A, the display device may include the first unit area UA1, the second unit area UA2, and the intermediate area MA arranged between the first unit area UA1 and the second unit area UA2. The first connection electrode CM1 may be disposed on the first unit area UA1, and the second connection electrode CM2 may be disposed on the second unit area UA2. The second planarization layer 215 may be arranged such that the second planarization layer 215 covers the first connection electrode CM1 and the second connection electrode CM2.

The first pixel electrode 411 overlapping the first unit area UA1 and the second pixel electrode 412 overlapping the second unit area UA2 may be disposed on the second planarization layer 215. The first sacrificial layer 401 may be disposed on the first pixel electrode 411, and a second sacrificial layer 402 may be disposed on the second pixel electrode 412. A shape of the first sacrificial layer 401 may correspond to a shape of the first pixel electrode 411, and a shape of the second sacrificial layer 402 may correspond to a shape of the second pixel electrode 412. Here, "a shape of A corresponds to a shape of B" means that the shape of A is identical or similar to the shape of B. For example, A and B may be formed by using the same mask. In this case, boundaries of A and B may substantially equal to or partially apart from each other depending on the process and material characteristics.

The first sacrificial layer 401 and the second sacrificial layer 402 may include a conductive oxide such as, for example, IZO and/or IGZO.

The inorganic bank layer 250 and the metal bank layer 300 may be sequentially formed on the second planarization layer 215 and cover the first sacrificial layer 401 and the second sacrificial layer 402. The metal bank layer 300 may include the first metal layer 310 and the second metal layer 320. The first metal layer 310 and the second metal layer 320 may include metals having different etch rates from each other.

Figure 7B:
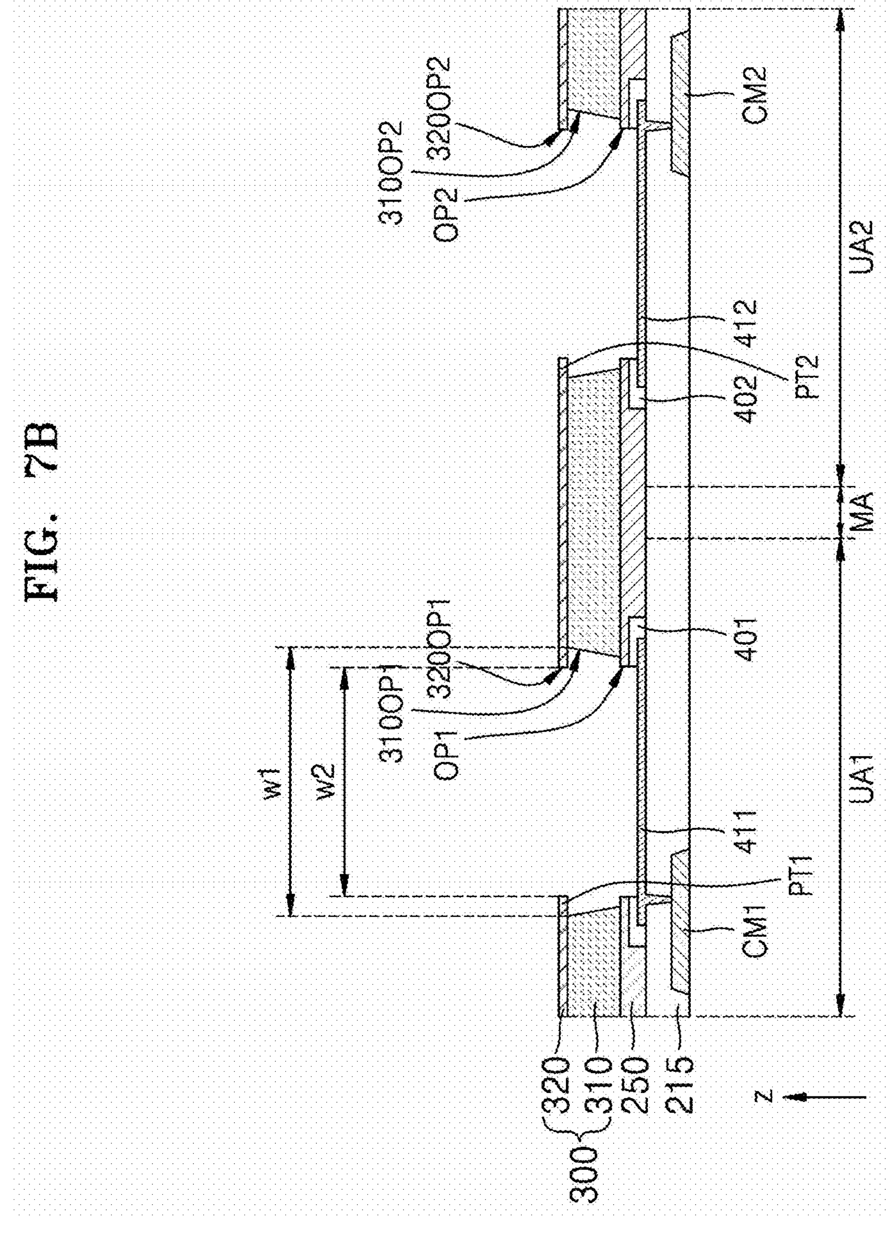

Referring to FIG. 7B, openings respectively exposing upper surfaces of the first pixel electrode 411 and an upper surface of the second pixel electrode 412 may be formed by etching a portion of the metal bank layer 300 and a portion of the inorganic bank layer 250.

By etching a portion of the first metal layer 310 and a portion of the second metal layer 320, the first-1 bank opening 310OP1 and the second-1 bank opening 320OP1 that overlap the first pixel electrode 411 may be formed, and a first-2 bank opening 310OP2 and a second-2 bank opening 320OP2 that overlap the second pixel electrode 412 may be formed. Through a wet etching process, the first-1 bank opening 310OP1 may have a first width w1, and the second-1 bank opening 320OP1 may have a second width w2 less than the first width w1. Likewise, a width of the first-2 bank opening 310OP2 may be greater than a width of the second-2 bank opening 320OP2. In other words, the metal bank layer 300 may have an undercut structure obtained by removing a portion of the first metal layer 310 under the second metal layer 320.

By etching a portion of the inorganic bank layer 250, the first pixel opening OP1 exposing a portion of the upper surface of the first pixel electrode 411 and a second pixel opening OP2 exposing a portion of the upper surface of the second pixel electrode 412 may be formed. Thereafter, the first sacrificial layer 401 and the second sacrificial layer 402 respectively exposed through the first pixel opening OP1 and the second pixel opening OP2 may be removed through wet etching. In this case, a portion of the first sacrificial layer 401 and a portion of the second sacrificial layer 402 that overlap the inorganic bank layer 250 may remain without being removed.

Figure 7C:
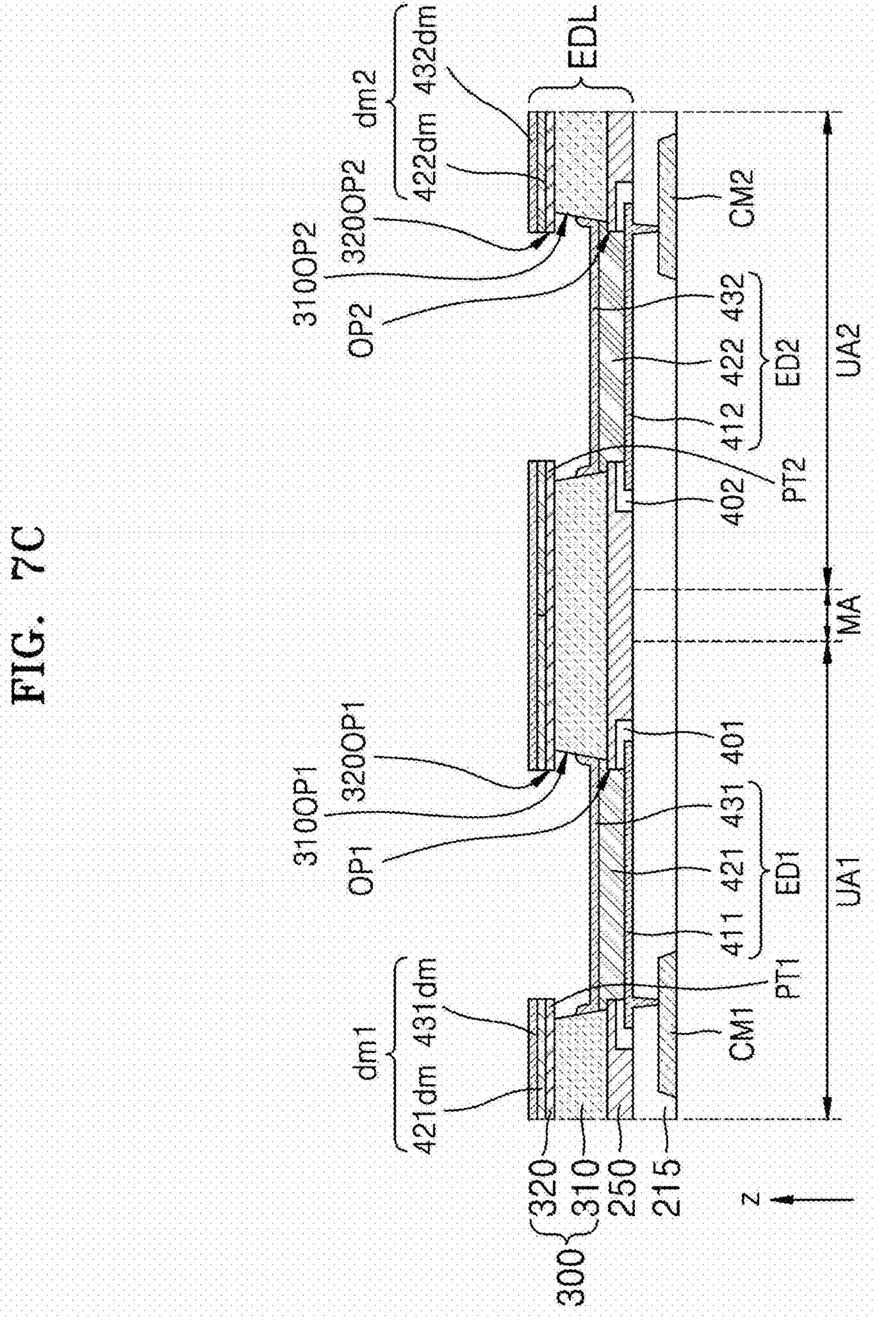

Referring to FIG. 7C, a material included in the first intermediate layer 421 and a material included in the second intermediate layer 422 may be deposited in the first unit area UA1, the second unit area UA2, and the intermediate area MA. The first intermediate layer 421 may be disposed on the first pixel electrode 411 such that the first intermediate layer 421 overlaps the first pixel opening OP1, and the second intermediate layer 422 may be disposed on the second pixel electrode 412 such that the second intermediate layer 422 overlaps the second pixel opening OP2. A first dummy intermediate layer 421*dm* may be formed on the second metal layer 320 adjacent to the first pixel opening OP1, and a second dummy intermediate layer 422*dm* may be formed on the second metal layer 320 adjacent to the second pixel opening OP2.

The first intermediate layer 421 and the first dummy intermediate layer 421*dm* may be separated and apart from each other by the first tip PT1 of the second metal layer 320 protruding in a center direction of the first pixel opening OP1 from a side surface of the first metal layer 310. The second intermediate layer 422 and the second dummy intermediate layer 422*dm* may be separated and apart from each other by a second tip PT2 of the second metal layer 320 protruding in a center direction of the second pixel opening OP2 from a side surface of the first metal layer 310.

Materials included in the first opposite electrode 431 and the second opposite electrode 432 may be deposited on the first unit area UA1, the second unit area UA2, and the intermediate area MA. The first opposite electrode 431 may be disposed on the first intermediate layer 421 and overlap the first pixel opening OP1, and the second opposite electrode 432 may be disposed on the second intermediate layer 422 and overlap the second pixel opening OP2. The first opposite electrode 431 may be in direct contact with a side surface of the first metal layer 310 facing the center of the first pixel opening OP1. The second opposite electrode 432 may be in direct contact with a side surface of the first metal layer 310 facing the center of the second pixel opening OP2.

A first dummy electrode layer 431*dm* may be formed on the first dummy intermediate layer 421*dm* and may constitute the first dummy stack dm1. A second dummy electrode layer 432*dm* may be formed on the second dummy intermediate layer 422*dm* and may constitute the second dummy stack dm2. The first dummy electrode layer 431*dm* may be integrally provided as a single body with the second dummy electrode layer 432*dm*.

The first opposite electrode 431 and the first dummy electrode layer 431*dm* may be separated and apart from each other by the first tip PT1. The second opposite electrode 432 and the second dummy electrode layer 432*dm* may be separated and apart from each other by the second tip PT2. In other words, the first opposite electrode 431 and the second opposite electrode 432 may each have an island shape and may be arranged apart from each other.

The first pixel electrode 411, the first intermediate layer 421, and the first opposite electrode 431 may constitute the first emission element ED1, and the second pixel electrode 412, the second intermediate layer 422, and the second opposite electrode 432 may constitute the second emission element ED2.

Figure 7D:
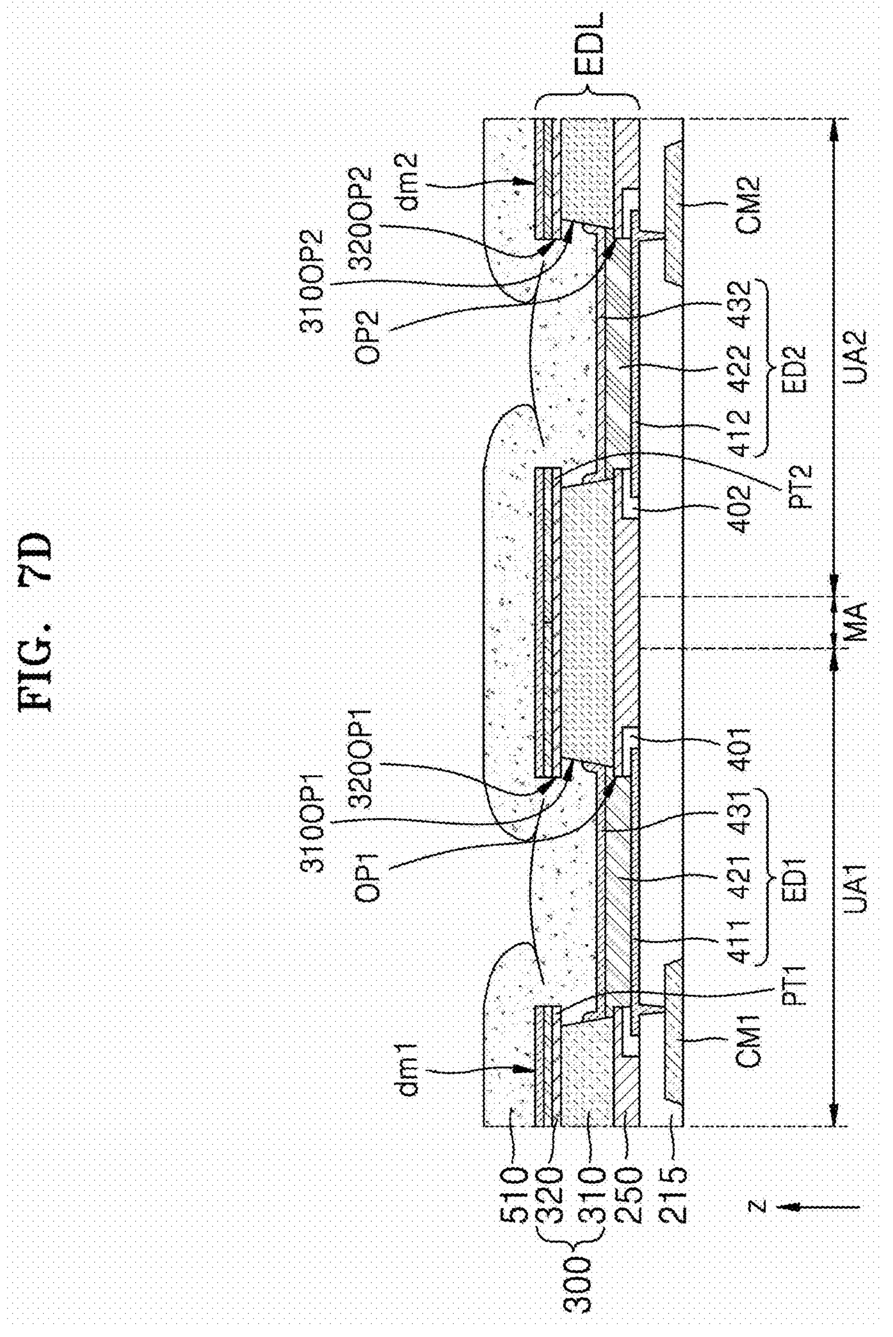

Referring to FIG. 7D, a first inorganic film 510 may be formed such that the first inorganic film 510 covers the first emission element ED1 and the second emission element ED2. The first inorganic film 510 may be formed such that the first inorganic film 510 overlaps the first unit area UA1, the second unit area UA2, and the intermediate area MA.

Because the first inorganic film 510 has a relatively high step coverage, by the first tip PT1, the first inorganic film 510 may be in direct contact with a side surface of the first metal layer 310 and a lower surface of the second metal layer 320 on which the first intermediate layer 421 and the first opposite electrode 431 are not formed. Likewise, by the second tip PT2, the first inorganic film 510 may be in direct contact with a side surface of the first metal layer 310 and a lower surface of the second metal layer 320 on which the second intermediate layer 422 and the second opposite electrode 432 are not formed. Accordingly, the first inorganic film 510 may seal the first emission element ED1 and the second emission element ED2.

Figure 7E:
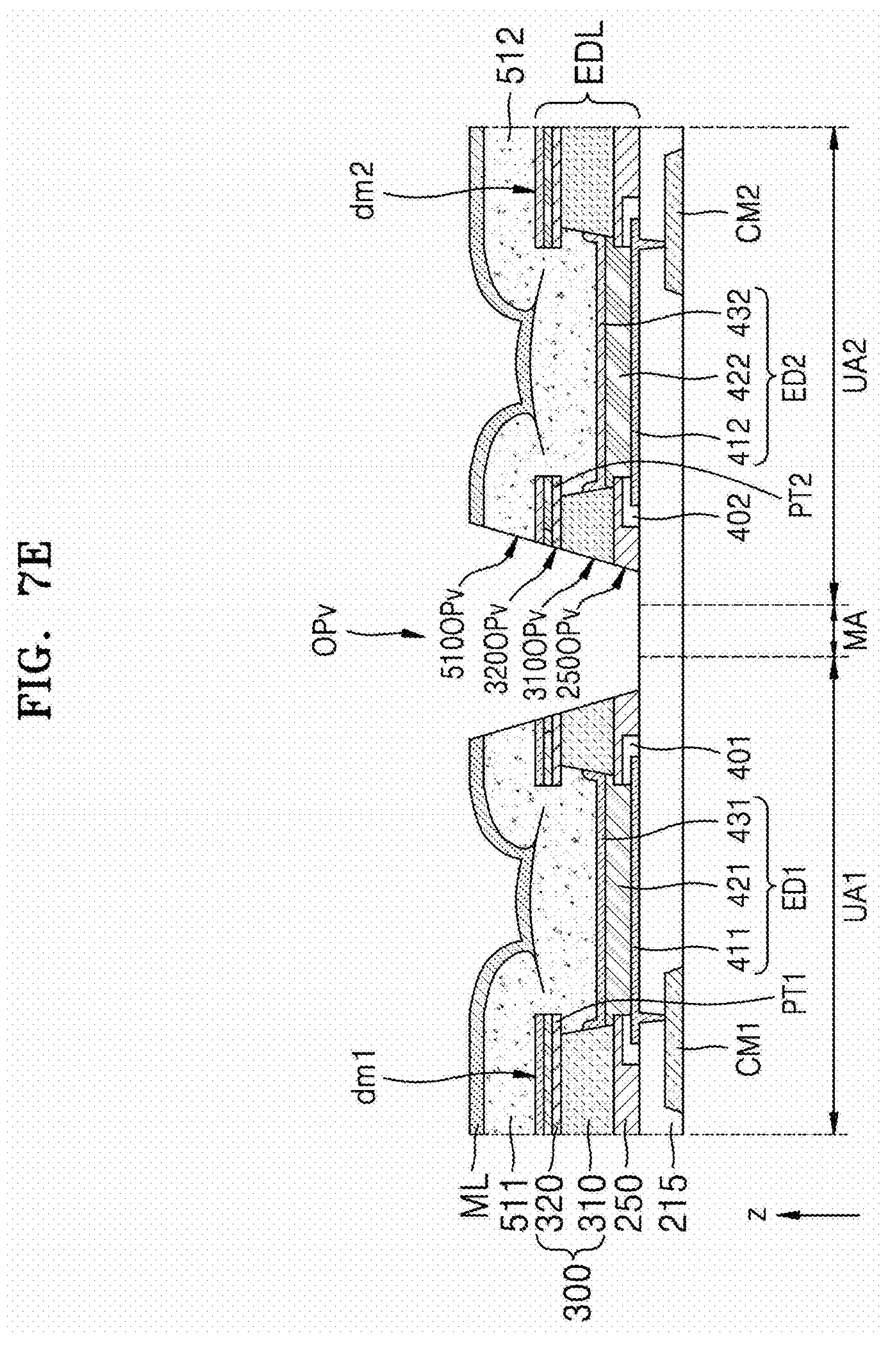

Referring to FIG. 7E, a mask layer ML may be formed on the first inorganic film 510, and a portion of the first inorganic film 510, a portion of the metal bank layer 300, and a portion of the inorganic bank layer 250 may be etched by using an opening of the mask layer ML. In some embodiments, the mask layer ML may include a conductive oxide such as, for example, IZO and/or IGZO.

A portion of the emission element layer EDL overlapping the first unit area UA1 and a portion of the emission element layer EDL overlapping the second unit area UA2 may be apart and separated from each other, with the intermediate area MA between the portions of the emission element layer EDL. The first inorganic film 510 may be separated into the first inorganic encapsulation layer 511 and the second inorganic encapsulation layer 512 apart from each other, with the intermediate area MA between the first inorganic encapsulation layer 511 and the second inorganic encapsulation layer 512.

The opening 250OPv of the inorganic bank layer 250, the opening 310OPv of the first metal layer 310, the opening 320OPv of the second metal layer 320, and the first encapsulation opening 510OPv may overlap each other such that a valley-opening portion OPv is formed. As described herein, the first encapsulation opening 510OPv may be defined by a side of the first inorganic encapsulation layer 511 facing the intermediate area MA and a side of the second inorganic encapsulation layer 512 facing the intermediate area MA.

Figure 7F:
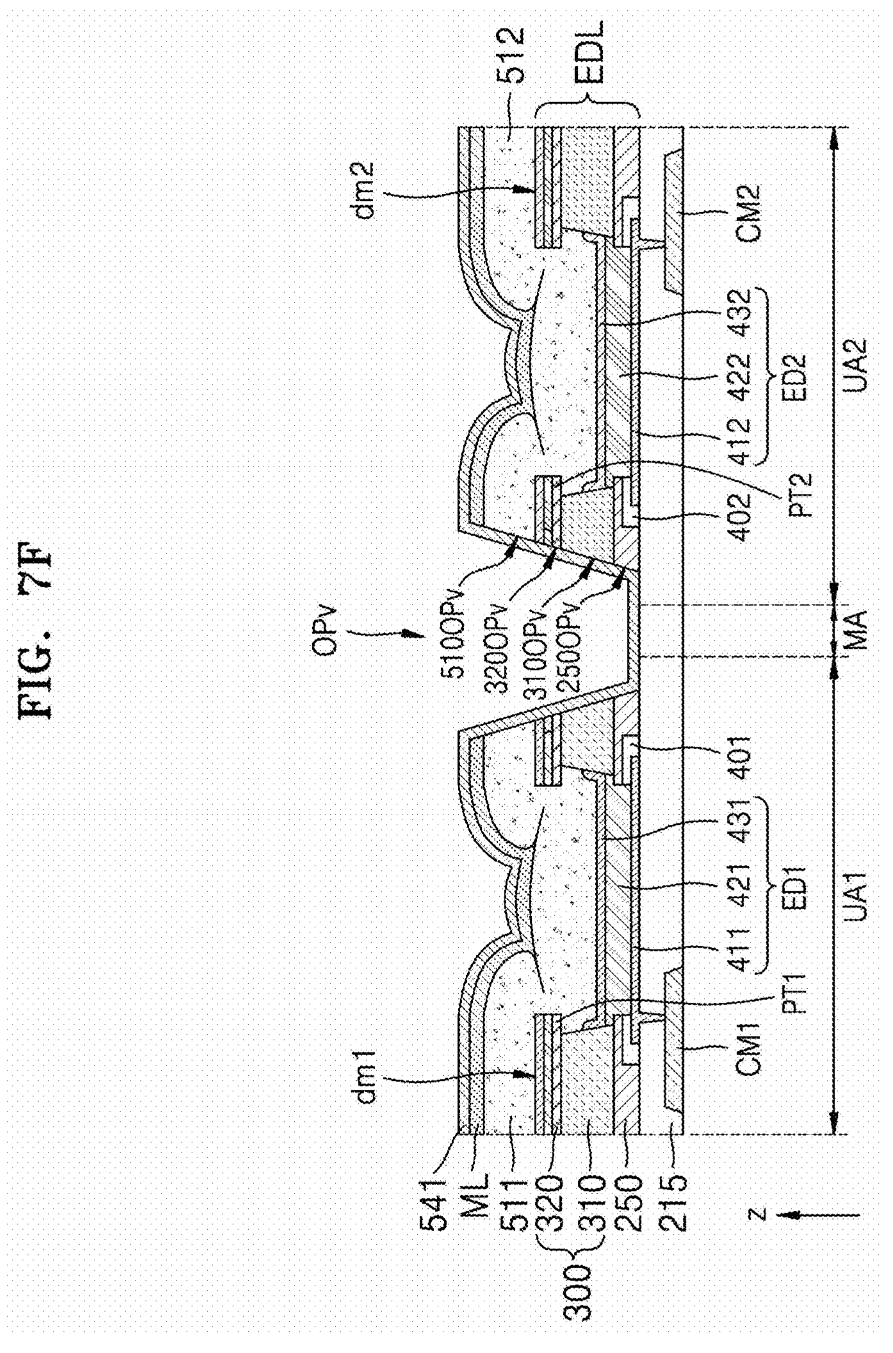

Referring to FIG. 7F, a second inorganic film 541 may be formed on the mask layer ML. The second inorganic film 541 may overlap the first unit area UA1, the second unit area UA2, and the intermediate area MA and cover an inner surface of the valley-opening portion OPv. The second inorganic film 541 may include silicon oxide, silicon nitride, and/or silicon oxynitride.

Figure 7G:
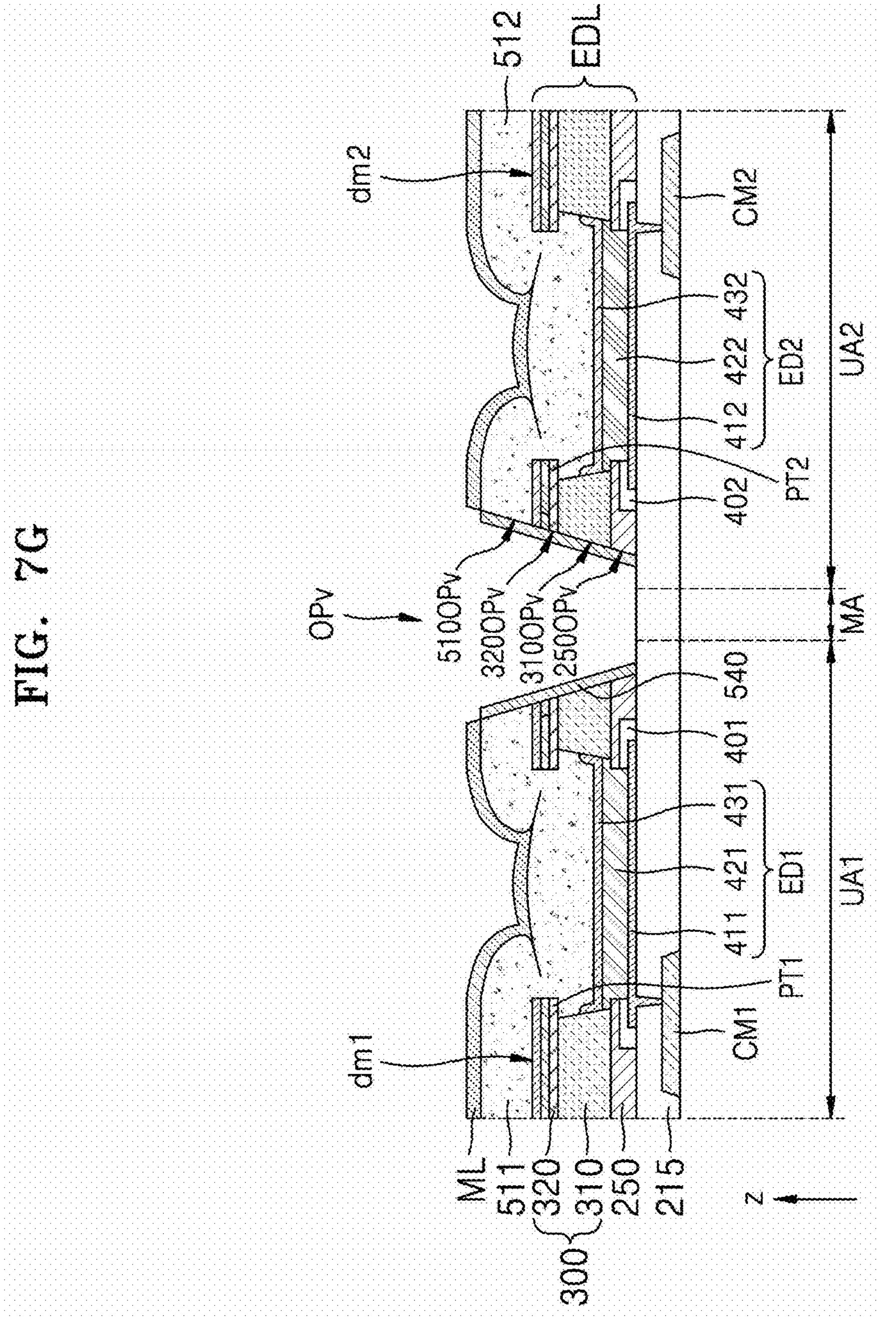

Referring to FIG. 7G, by using a difference between a horizontal etch rate and a vertical etch rate of the second inorganic film 541, the second inorganic film 541 located on the upper surface of the mask layer ML and the second inorganic film 541 located on the bottom surface of the valley-opening portion OPv may be selectively removed, and the cover layer 540 covering an inner surface of the valley-opening portion OPv may be formed. The cover layer 540 may cover an inner surface of each of the opening 250OPv of the inorganic bank layer 250, the opening 310OPv of the first metal layer 310, the opening 320OPv of the second metal layer 320, and the first encapsulation opening 510OPv. Then, the mask layer ML may be removed.

Figure 7H:
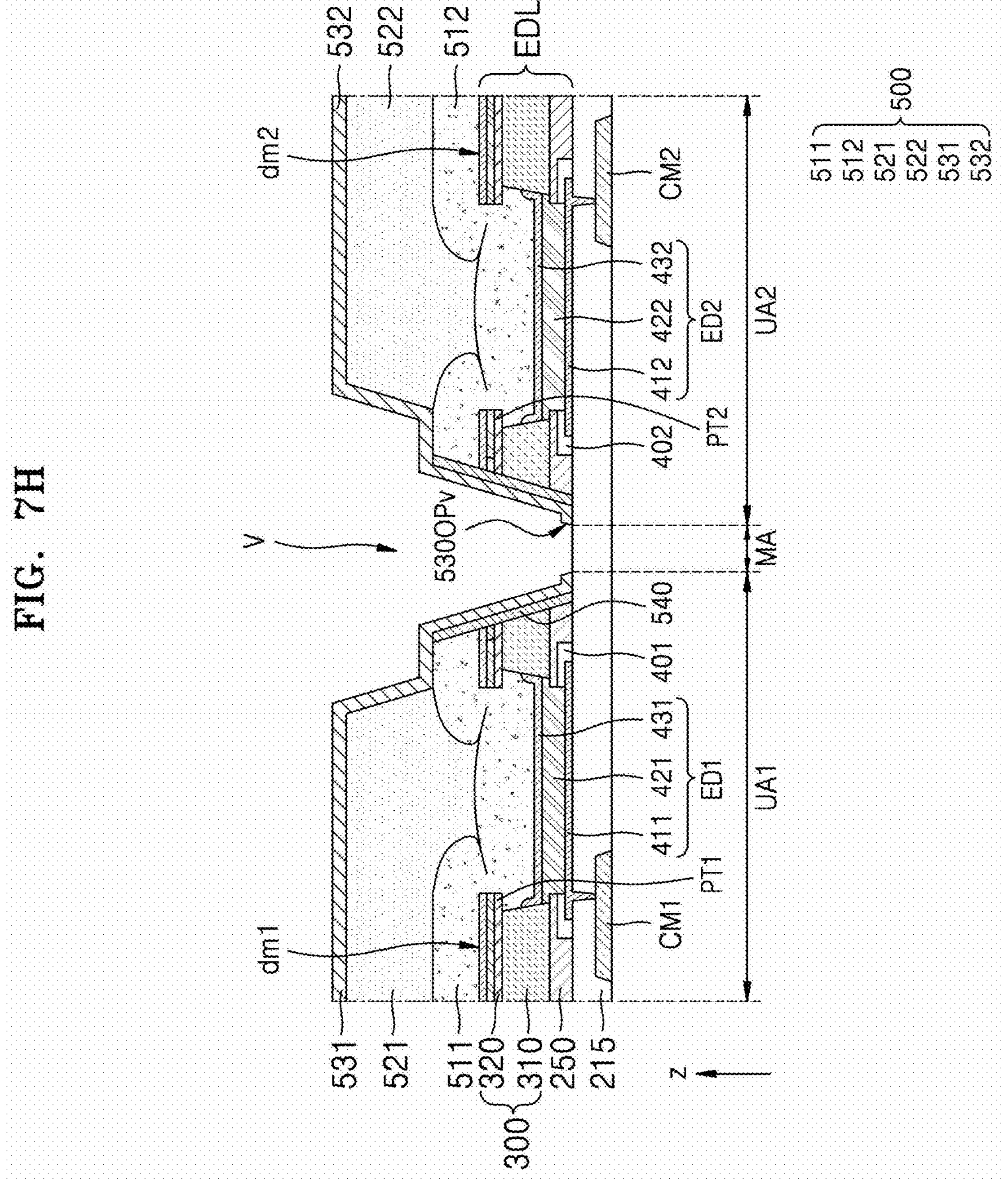

Referring to FIG. 7H, the first organic encapsulation layer 521 may be disposed on the first inorganic encapsulation layer 511 and overlap the first unit area UA1, and the third inorganic encapsulation layer 531 may be disposed on the first organic encapsulation layer 521 and overlap the first unit area UA1. The second organic encapsulation layer 522 may be disposed on the second inorganic encapsulation layer 512 and overlap the second unit area UA2, and the fourth inorganic encapsulation layer 532 may be disposed on the second organic encapsulation layer 522 and overlap the second unit area UA2. The encapsulation layer 500 may include the first inorganic encapsulation layer 511, the second inorganic encapsulation layer 512, the first organic encapsulation layer 521, the second organic encapsulation layer 522, the third inorganic encapsulation layer 531, and the fourth inorganic encapsulation layer 532.

In some embodiments, as described with reference to FIG. 6A, the first organic encapsulation layer 521 and the second organic encapsulation layer 522 may be arranged to correspond to the respective emission elements through an inkjet process or a photo patterning process. For example, the first organic encapsulation layer 521 may be arranged to correspond to the first emission element ED1, and the second organic encapsulation layer 522 may be arranged to correspond to the second emission element ED2.

In some embodiments, as described with reference to FIG. 6B, the first organic encapsulation layer 521 may be arranged such that the first organic encapsulation layer 521 overlaps a plurality of emission elements arranged in the first unit area UA1. The second organic encapsulation layer 522 may be arranged to overlap a plurality of emission elements arranged in the second unit area UA2.

In some embodiments, as described with reference to FIG. 6C, the first organic encapsulation layer 521 and the second organic encapsulation layer 522 may be omitted.

The third inorganic encapsulation layer 531 and the fourth inorganic encapsulation layer 532 may be formed by removing a portion of an inorganic film formed through the same deposition process. The third inorganic encapsulation layer

531 and the fourth inorganic encapsulation layer 532 may define the second encapsulation opening 530OPv located between the third inorganic encapsulation layer 531 and the fourth inorganic encapsulation layer 532. The second encapsulation opening 530OPv may overlap the intermediate area MA.

The emission element layer EDL and the encapsulation layer 500 may define the valley portion V overlapping the intermediate area MA and exposing an upper surface of the second planarization layer 215. The valley portion V may be an area in which layers included in the emission element layer EDL and the encapsulation layer 500 are not arranged.

The third inorganic encapsulation layer 531 and the fourth inorganic encapsulation layer 532 may extend such that the third inorganic encapsulation layer 531 and the fourth inorganic encapsulation layer 532 are in direct contact with the upper surface of the second planarization layer 215. Accordingly, the third inorganic encapsulation layer 531 and the fourth inorganic encapsulation layer 532 may constitute a side surface of the valley portion V.

The valley portion V may be arranged such that the valley portion V surrounds the first unit area UA1 and the second unit area UA2. For example, a portion of the inorganic bank layer 250, a portion of the metal bank layer 300, and a portion of the encapsulation layer 500 that overlap the first unit area UA1 may have an island shape segmented from a surrounding area by the valley portion V.

Likewise, a portion of the inorganic bank layer 250, a portion of the metal bank layer 300, and a portion of the encapsulation layer 500 that overlap the second unit area UA2 may have an island shape segmented from a surrounding area by the valley portion V.

Figure 8A:
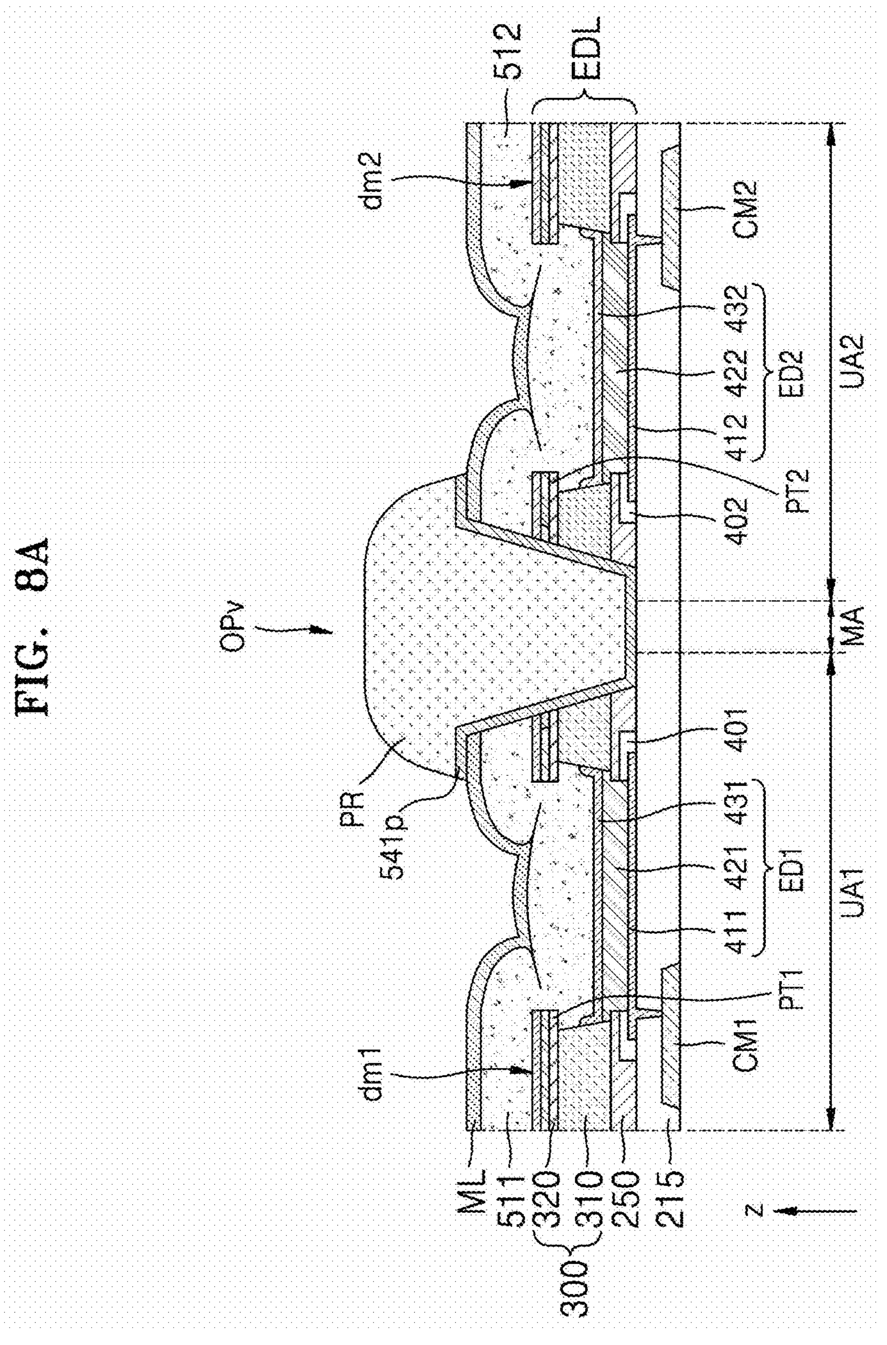
FIGS. 8A to 8C are cross-sectional views schematically illustrating some operations of a process of manufacturing a display device, according to an embodiment.
Figure 8B:
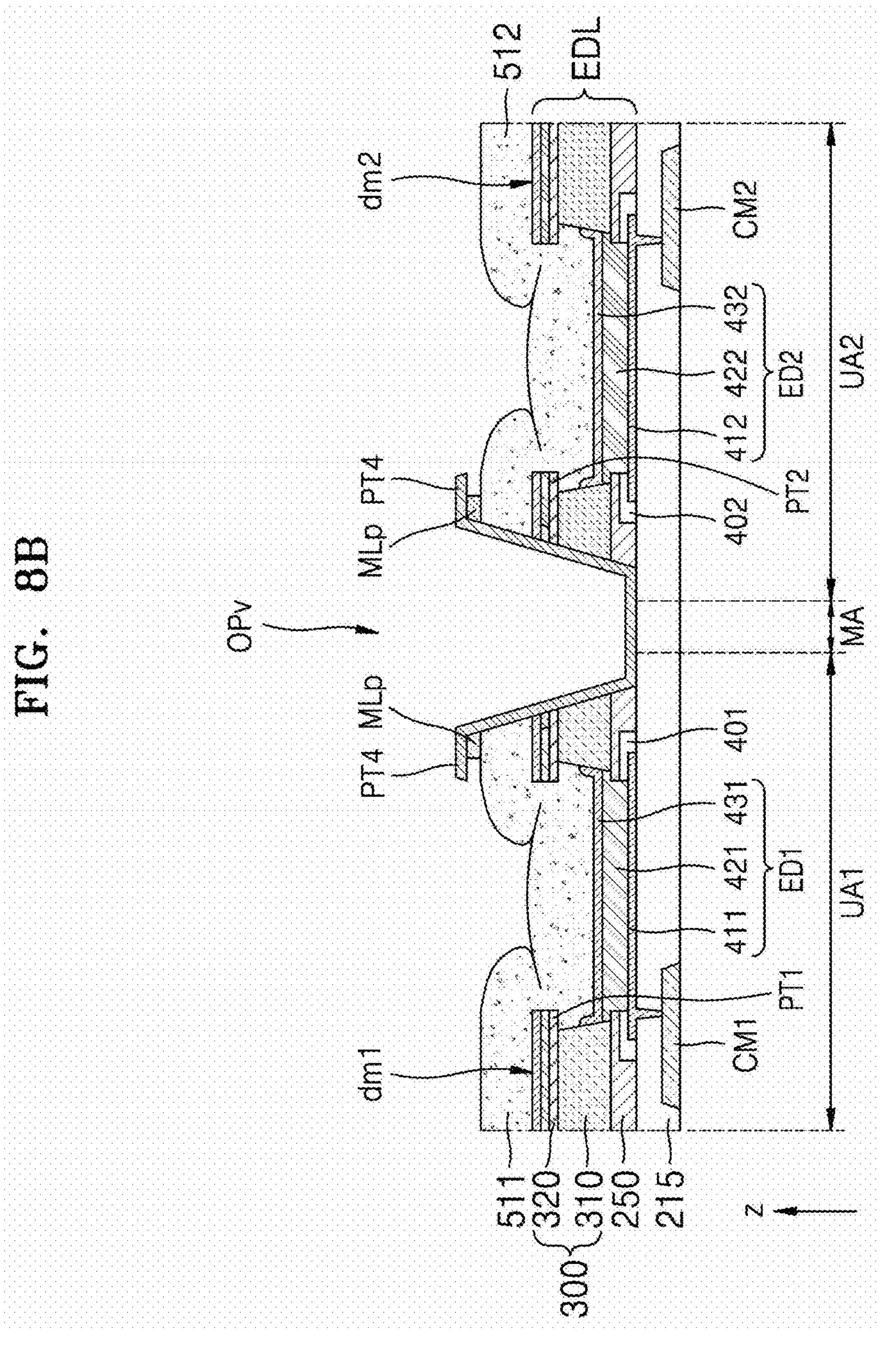
Figure 8C:
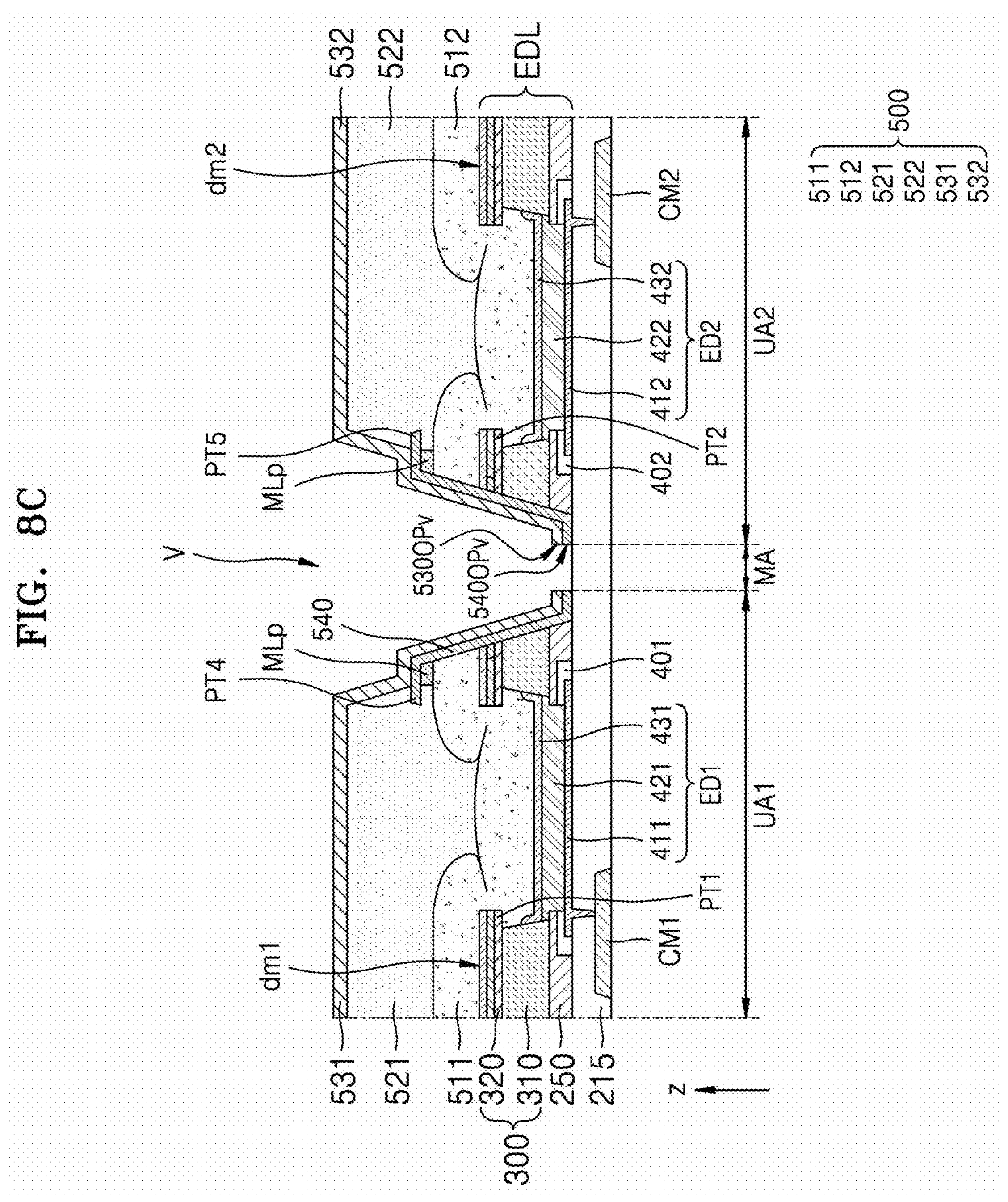

FIGS. 8A to 8C are cross-sectional views schematically illustrating some operations of a process of manufacturing a display device, according to an embodiment. FIGS. 8A to 8C schematically illustrate some operations that follow the operations described with reference to FIGS. 7A to 7F.

Referring to FIG. 8A, a photoresist PR may be formed to fill the valley-opening portion OPv in the structure described with reference to FIG. 7F, and the second inorganic film 541 (see FIG. 7F) exposed from the photoresist PR may be removed by etching. Under the photoresist PR, a residual inorganic film 541*p* covering side and bottom surfaces of the valley-opening portion OPv may be located.

The photoresist PR may overlap the valley-opening portion OPv and the mask layer ML adjacent to the valley-opening portion OPv, and the residual inorganic film 541*p* may be located between the mask layer ML and the photoresist PR.

Referring to FIG. 8B, the mask layer ML and the photoresist PR may be removed. In this case, a residual mask layer MLp overlapping the residual inorganic film 541*p* may remain. When the mask layer ML is removed by using a wet etching process, the mask layer ML under the residual inorganic film 541*p* may be removed such that the residual inorganic film 541*p* has a fourth tip PT4 protruding to the outside of the residual mask layer MLp. The fourth tip PT4 may protrude in a center direction of the first unit area UA1 or in a center direction of the second unit area UA2.

Referring to FIG. 8C, the first organic encapsulation layer 521 may be formed on the first inorganic encapsulation layer 511 and overlap the first unit area UA1, and the third inorganic encapsulation layer 531 may be formed on the first organic encapsulation layer 521 and overlap the first unit area UA1. The second organic encapsulation layer 522 may be formed on the second inorganic encapsulation layer 512 and overlap the second unit area UA2, and the fourth inorganic encapsulation layer 532 may be formed on the second organic encapsulation layer 522 and overlap the second unit area UA2.

The third inorganic encapsulation layer 531 and the fourth inorganic encapsulation layer 532 may be formed by removing a portion of a third inorganic film formed through the same deposition process. The third inorganic encapsulation layer 531 and the fourth inorganic encapsulation layer 532 may define the second encapsulation opening 530OPv located between the third inorganic encapsulation layer 531 and the fourth inorganic encapsulation layer 532.

During an etching process for forming the second encapsulation opening 530OPv, the residual inorganic film 541*p* may also be etched such that the cover layer 540 and an opening 540OPv of the cover layer 540 are formed. The cover layer 540 may extend to the upper surface of the second planarization layer 215, and the third inorganic encapsulation layer 531 and the fourth inorganic encapsulation layer 532 may be disposed on the cover layer 540.

The second encapsulation opening 530OPv may overlap the opening 540OPv of the cover layer 540. The second encapsulation opening 530OPv and the opening 540OPv of the cover layer 540 may overlap the intermediate area MA.

The emission element layer EDL and the encapsulation layer 500 may define the valley portion V overlapping the intermediate area MA and exposing an upper surface of the second planarization layer 215. The valley portion V may be an area in which layers included in the emission element layer EDL and the encapsulation layer 500 are not arranged. The third inorganic encapsulation layer 531 and the fourth inorganic encapsulation layer 532 may extend toward the intermediate area MA along the cover layer 540. Accordingly, the third inorganic encapsulation layer 531 and the fourth inorganic encapsulation layer 532 may constitute a side surface of the valley portion V. The valley portion V may be arranged such that the valley portion V surrounds the first unit area UA1 and the second unit area UA2.

Figure 9A:
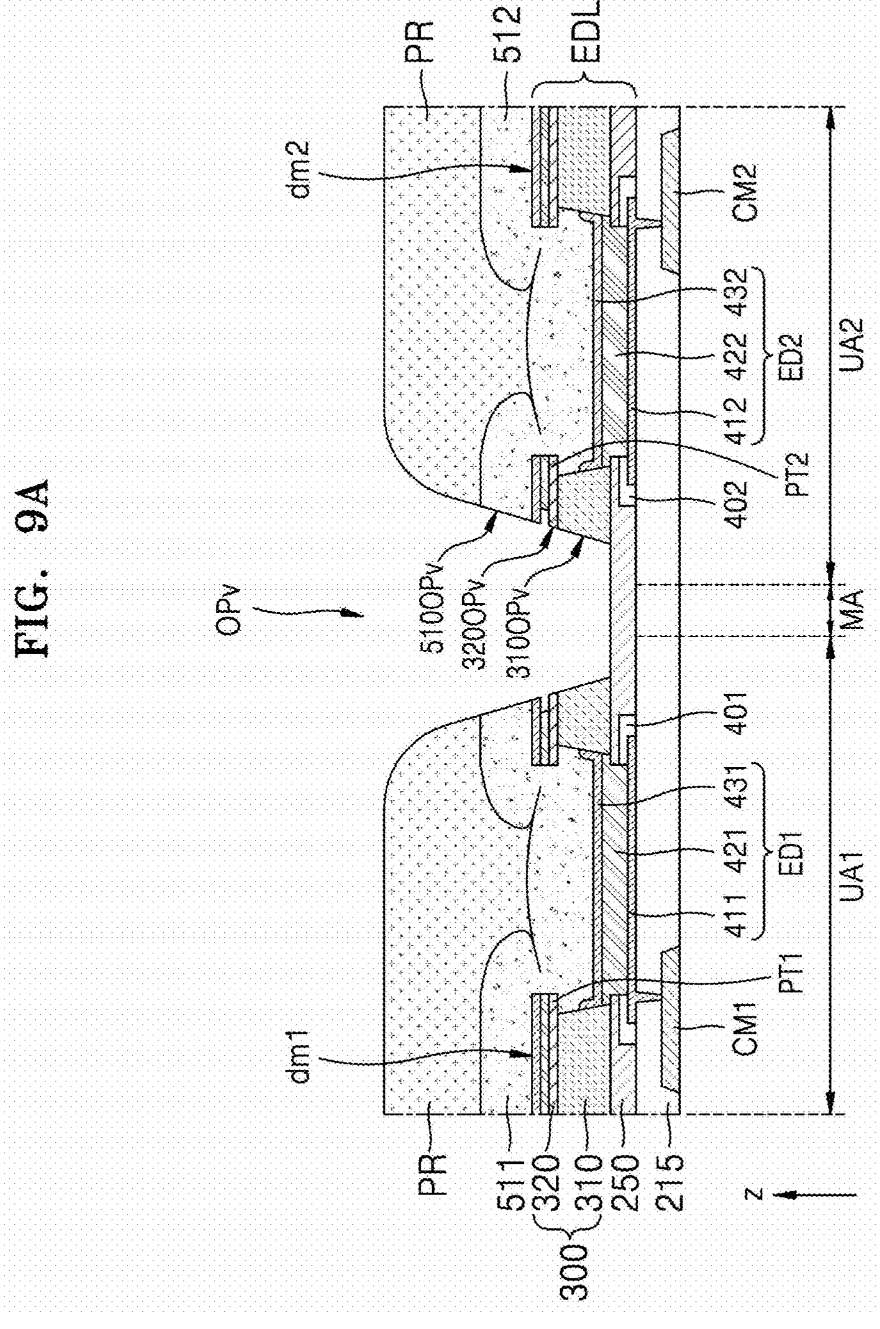
FIGS. 9A to 9C are cross-sectional views schematically illustrating some operations of a process of manufacturing a display device, according to an embodiment.
Figure 9B:
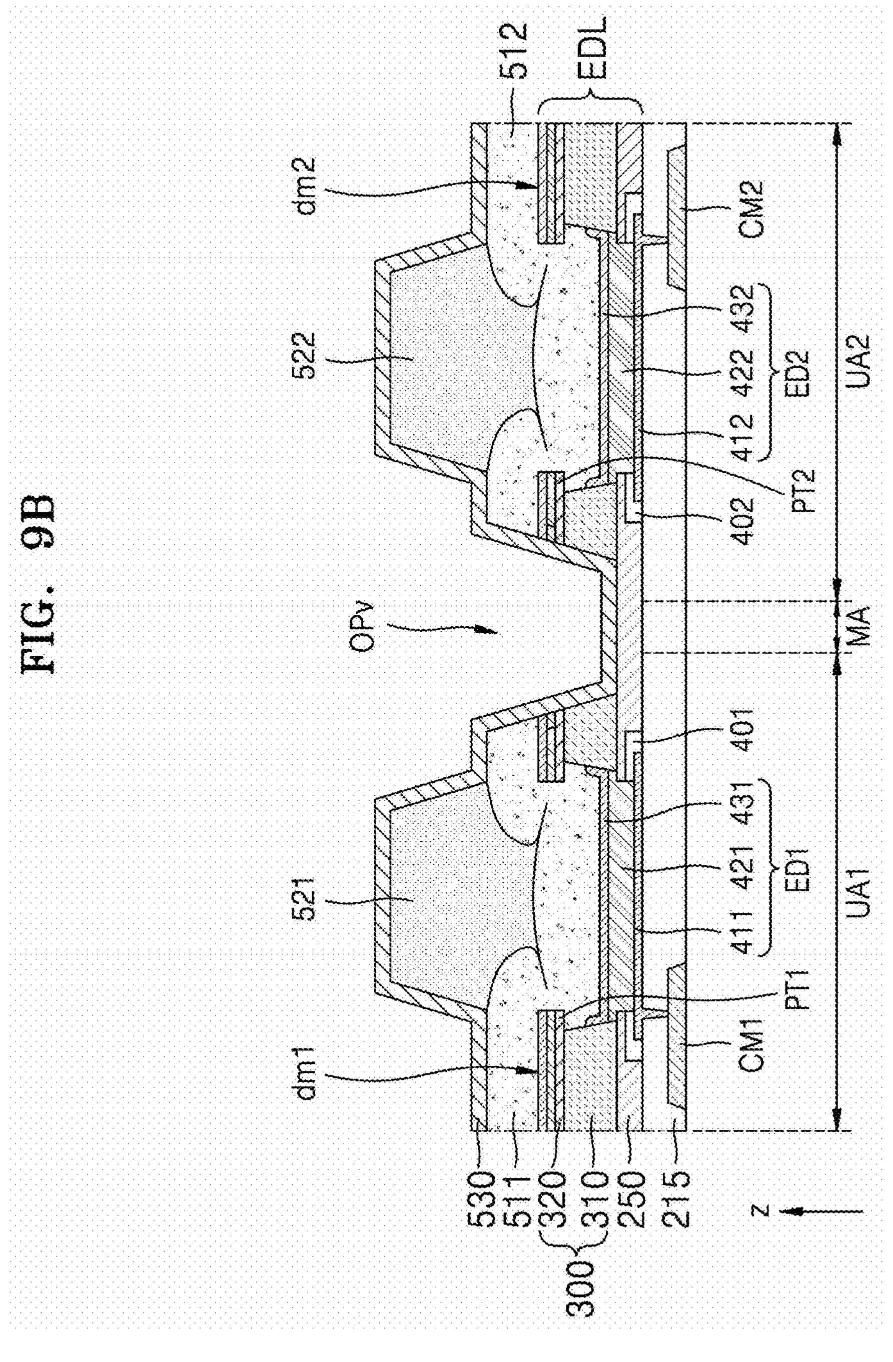
Figure 9C:
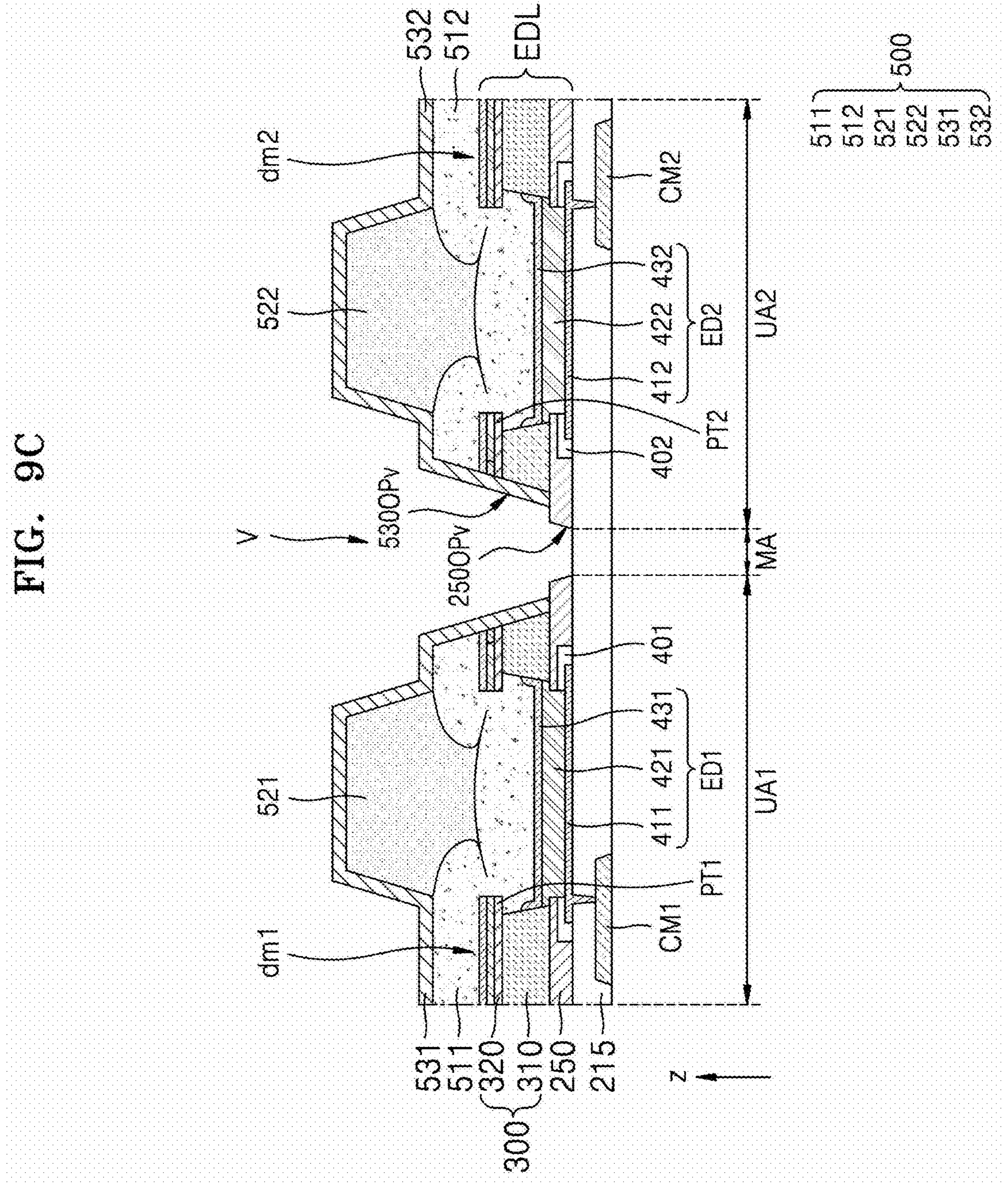

FIGS. 9A to 9C are cross-sectional views schematically illustrating some operations of a process of manufacturing a display device, according to an embodiment. FIGS. 9A to 9C schematically illustrate some operations that follow the operations described with reference to FIGS. 7A to 7D.

Referring to FIG. 9A, the photoresist PR defining an opening overlapping the valley-opening portion OPv may be formed on the first inorganic film 510 (see FIG. 7D) of the structure described with reference to FIG. 7D. Thereafter, by etching a portion of the first inorganic film 510, a portion of the second metal layer 320, and a portion of the first metal layer 310 through the opening of the photoresist PR, the first encapsulation opening 510OPv, the opening 320OPv of the second metal layer 320, and the opening 310OPv of the first metal layer 310 may be formed.

The valley-opening portion OPv exposing the upper surface of the inorganic bank layer 250 may be formed by the opening 320OPv of the second metal layer 320 and the opening 310OPv of the first metal layer 310 overlapping each other. The first inorganic film 510 may be separated into the first inorganic encapsulation layer 511 and the second inorganic encapsulation layer 512 apart from each other, with the intermediate area MA between the first inorganic encapsulation layer 511 and the second inorganic encapsulation layer 512. Then, the photoresist PR may be removed.

Referring to FIG. 9B, the first organic encapsulation layer 521 may be disposed on the first inorganic encapsulation layer 511 and overlap the first unit area UA1, and the second organic encapsulation layer 522 may be disposed on the second inorganic encapsulation layer 512 and overlap the second unit area UA2. A third inorganic film 530 may be formed such that the third inorganic film 530 covers the first organic encapsulation layer 521 and the second organic encapsulation layer 522. The third inorganic film 530 may overlap the first unit area UA1, the second unit area UA2, and the intermediate area MA. The third inorganic film 530 may cover the side and bottom surfaces of the valley-opening portion OPv.

Referring to FIG. 9C, the first organic encapsulation layer 521 may be formed on the first inorganic encapsulation layer 511 and overlap the first unit area UA1, and the third inorganic encapsulation layer 531 may be formed on the first organic encapsulation layer 521 and overlap the first unit area UA1. The second organic encapsulation layer 522 may be formed on the second inorganic encapsulation layer 512 and overlap the second unit area UA2, and the fourth inorganic encapsulation layer 532 may be formed on the second organic encapsulation layer 522 and overlap the second unit area UA2.

The third inorganic encapsulation layer 531 and the fourth inorganic encapsulation layer 532 may be formed by removing a portion of the third inorganic film 530. The third inorganic encapsulation layer 531 and the fourth inorganic encapsulation layer 532 may define the second encapsulation opening 530OPv located between the third inorganic encapsulation layer 531 and the fourth inorganic encapsulation layer 532.

During an etching process for forming the second encapsulation opening 530OPv, the inorganic bank layer 250 may also be removed, and the opening 250OPv of the inorganic bank layer 250 may be formed. The second encapsulation opening 530OPv and the opening 250OPv of the inorganic bank layer 250 may overlap the intermediate area MA.

The emission element layer EDL and the encapsulation layer 500 may define the valley portion V overlapping the intermediate area MA and exposing an upper surface of the second planarization layer 215. The valley portion V may be an area in which layers included in the emission element layer EDL and the encapsulation layer 500 are not arranged. The third inorganic encapsulation layer 531 and the fourth inorganic encapsulation layer 532 may constitute a side surface of the valley portion V. The valley portion V may be arranged such that the valley portion V surrounds the first unit area UA1 and the second unit area UA2.

In FIG. 9C, the first organic encapsulation layer 521 and the second organic encapsulation layer 522 are respectively arranged to correspond to the first emission element ED1 and the second emission element ED2. However, in some embodiments, the first organic encapsulation layer 521 may be arranged such that the first organic encapsulation layer 521 overlaps a plurality of emission elements arranged in the first unit area UA1. The second organic encapsulation layer 522 may be arranged to overlap a plurality of emission elements arranged in the second unit area UA2. In some embodiments, the first organic encapsulation layer 521 and the second organic encapsulation layer 522 may be omitted.

Figure 10:
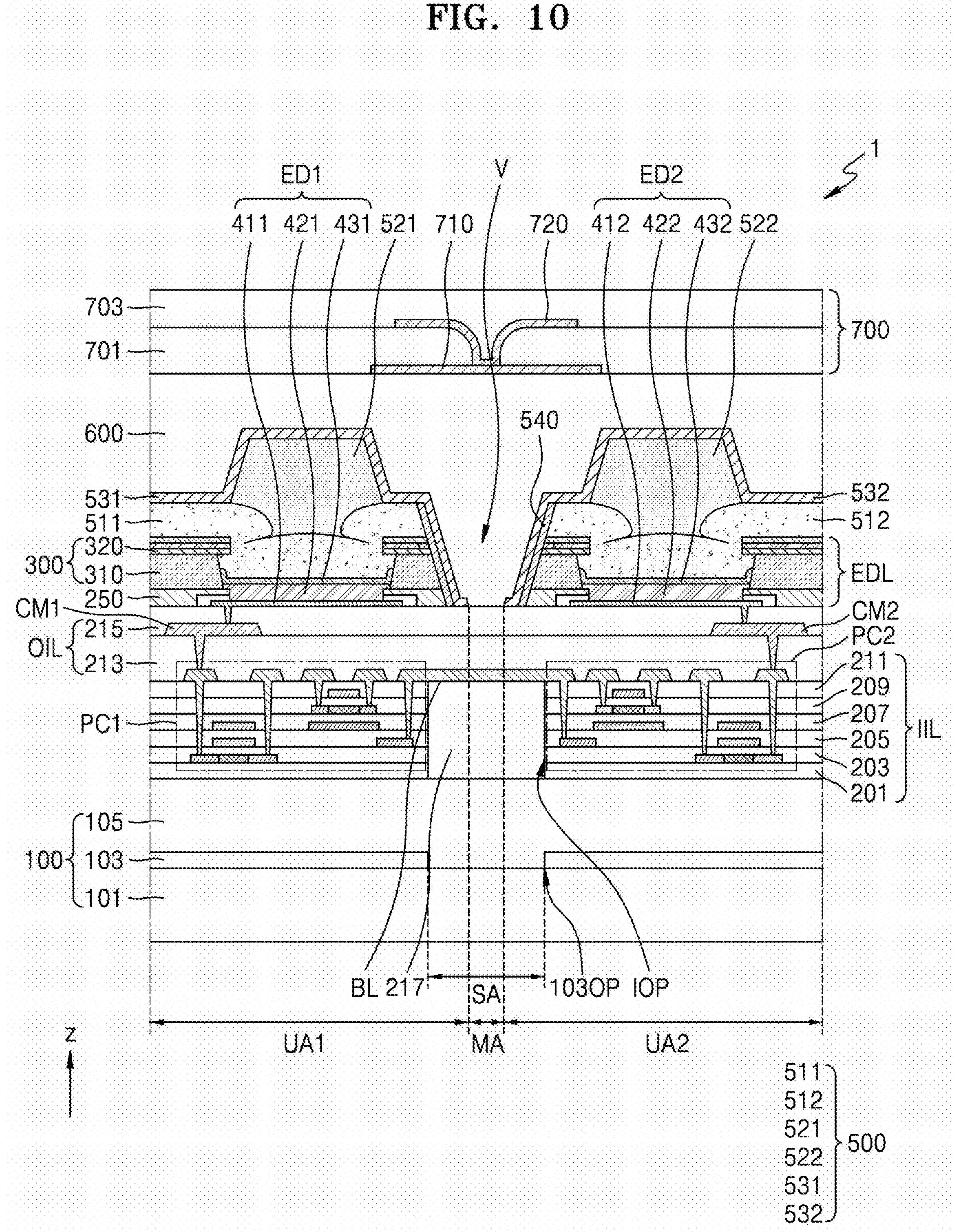
FIG. 10 is a cross-sectional view schematically illustrating a display device according to an embodiment.

FIG. 10 is a cross-sectional view schematically illustrating a display device 1 according to an embodiment. FIG. 10 is similar to FIG. 5, differing in that the inorganic insulating layer IIL defines a first opening IOP, and the first barrier layer 103 defines a second opening 103OP.

Referring to FIG. 10, the display device 1 may include the first unit area UA1, the second unit area UA2, the intermediate area MA, and a segment area SA. The segment area SA may be defined as an area not overlapping the inorganic insulating layer IIL and/or the first barrier layer 103. Alternatively, the segment area SA may be defined as an area overlapping the first opening IOP of the inorganic insulating layer IIL and/or the second opening 103OP of the first barrier layer 103. In one or more embodiments, descriptions of cases in which the substrate 100 includes the segment area SA indicate that the substrate 100 includes an area overlapping the intermediate area MA.

The substrate 100 may be provided such that a barrier layer, which is an inorganic material layer, and a base layer, which is an organic material layer, are alternately arranged with each other. For example, the substrate 100 may include the first base layer 101 and the second base layer 105, which include an organic material, and the first barrier layer 103 located between the first base layer 101 and the second base layer 105.

The first barrier layer 103 may overlap the segment area SA and define the second opening 103OP passing through the first barrier layer 103. Because the segment area SA overlaps the intermediate area MA, the second opening 103OP may overlap the valley portion V.

The segment area SA may be arranged along an edge of the first unit area UA1 and an edge of the second unit area UA2. Accordingly, a portion of the first barrier layer 103 overlapping the first unit area UA1 and a portion of the first barrier layer 103 overlapping the second unit area UA2 may be arranged apart from each other, with the segment area SA between the portions of the first barrier layer 103.

The first pixel circuit PC1, the second pixel circuit PC2, and the inorganic insulating layer IIL may be disposed on the substrate 100. The inorganic insulating layer IIL may include inorganic material layers between the substrate 100 and the emission element layer EDL. For example, the inorganic insulating layer IIL may include the buffer layer 201, the first gate insulating layer 203, the second gate insulating layer 205, the first interlayer insulating layer 207, the third gate insulating layer 209 and the second interlayer insulating layer 211.

The inorganic insulating layer IIL may overlap the segment area SA and define the first opening IOP exposing the upper surface of the second base layer 105. The first opening IOP may be formed by an opening of the buffer layer 201, an opening of the first gate insulating layer 203, an opening of the second gate insulating layer 205, an opening of the first interlayer insulating layer 207, an opening of the third gate insulating layer 209, and an opening of the second interlayer insulating layer 211 overlapping each other.

A portion of the inorganic insulating layer IIL overlapping the first unit area UA1 and a portion of the inorganic insulating layer IIL overlapping the second unit area UA2 may be arranged apart from each other, with the segment area SA between the portions of the inorganic insulating layer IIL. Because the first opening IOP of the inorganic insulating layer IIL and the second opening 103OP of the first barrier layer 103 overlap the segment area SA, in the segment area SA, an inorganic material layer may not be disposed under the organic insulating layer OIL.

The first opening IOP of the inorganic insulating layer IIL may be filled with a filler layer 217. In some embodiments, an upper surface of the filler layer 217 may be located on a level identical or similar to a level at which the upper surface of the second interlayer insulating layer 211 is located. In some embodiments, the upper surface of the filler layer 217 may have a convex shape higher than the upper surface of the second interlayer insulating layer 211 (e.g., at least a portion of the convex shape is higher than the upper surface of the second interlayer insulating layer 211), a concave shape lower than the upper surface of the second interlayer insulating layer 211 (e.g., at least a portion of the concave shape is lower than the upper surface of the second interlayer insulating layer 211), or a shape with unevenness in which protrusions and recesses alternate with each other.

The filler layer 217 may include a polymer-based material. Polymer-based materials may include, for example, acryl-based resin, epoxy-based resin, polyimide, and polyethylene. The filler layer 217 may have a relatively low modulus. The modulus of the filler layer 217 may be about 3 MPa to about 20 MPa.

A bridge line BL may be disposed on the filler layer 217 and connect an element of the first pixel circuit PC1 and a corresponding element of the second pixel circuit PC2 to each other. The bridge line BL may be arranged between the filler layer 217 and the first planarization layer 213. In some embodiments, the bridge line BL may be arranged on the same layer as a layer on which source electrodes and/or drain electrodes of thin-film transistors are arranged. The bridge line BL may include, for example, Mo, Al, Cu, and Ti, and may have a single-layer or multi-layer structure. In some embodiments, the bridge line BL may be a single-layer or multi-layer structure and include one or more of Mo, Al, Cu, and Ti.

Because the segment area SA overlaps the intermediate area MA, the first opening IOP may overlap the valley portion V. In some embodiments, a width of the intermediate area MA may be less than a width of the segment area SA. In some embodiments, a width of the intermediate area MA may be identical to a width of the segment area SA.

When the display device 1 is stretched or bent, stress may be concentrated on the segment area SA not overlapping the first barrier layer 103 and/or the inorganic insulating layer IIL. Thus, cracks or the like in inorganic films included in the substrate 100, the inorganic insulating layer IIL, the emission element layer EDL, and the encapsulation layer 500 may be prevented or reduced. The display device 1 may have a structure that is more robust against stretching.

Figure 11A:
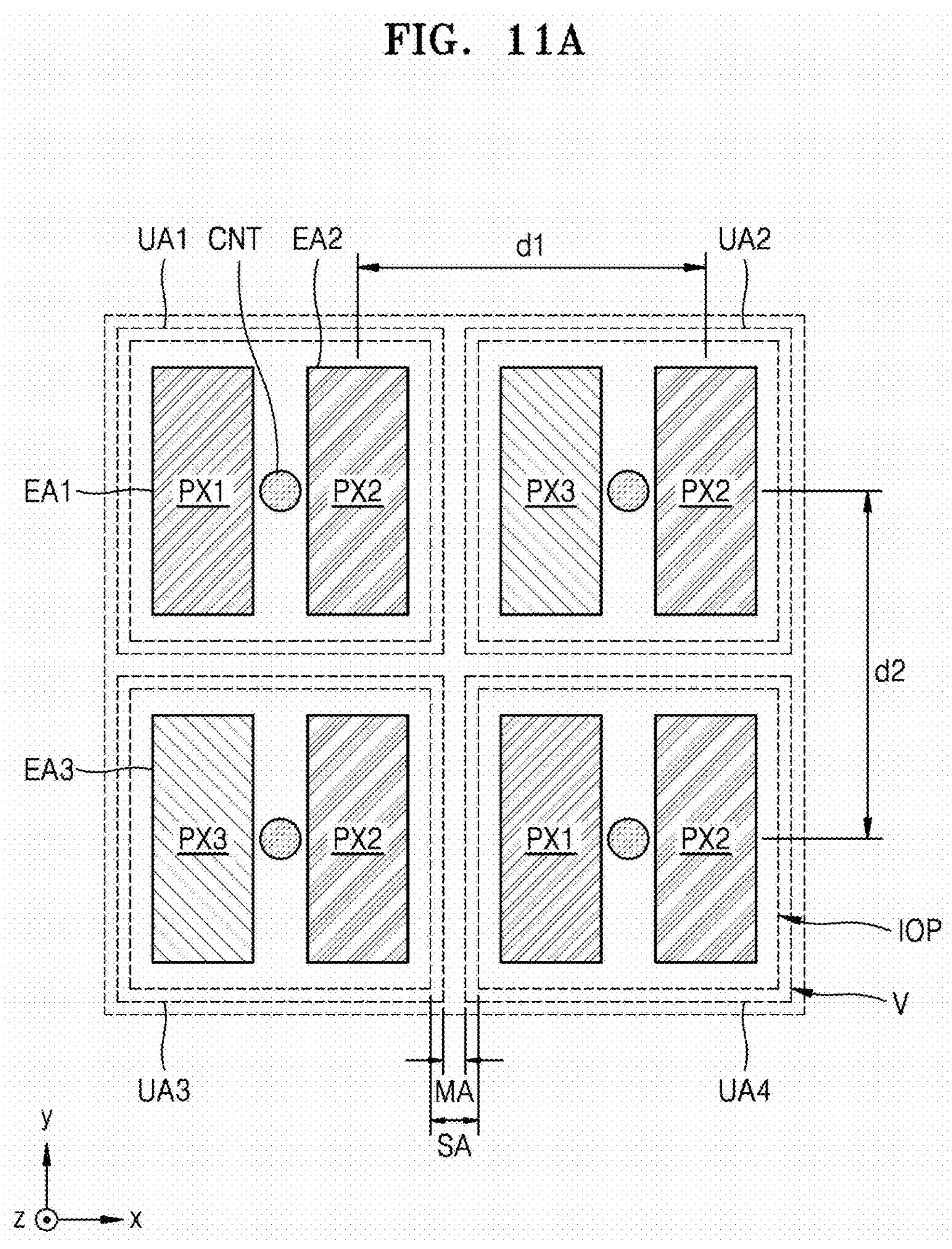
FIGS. 11A to 11B are plan views schematically illustrating a pixel arrangement of a display device according to an embodiment.
Figure 11B:
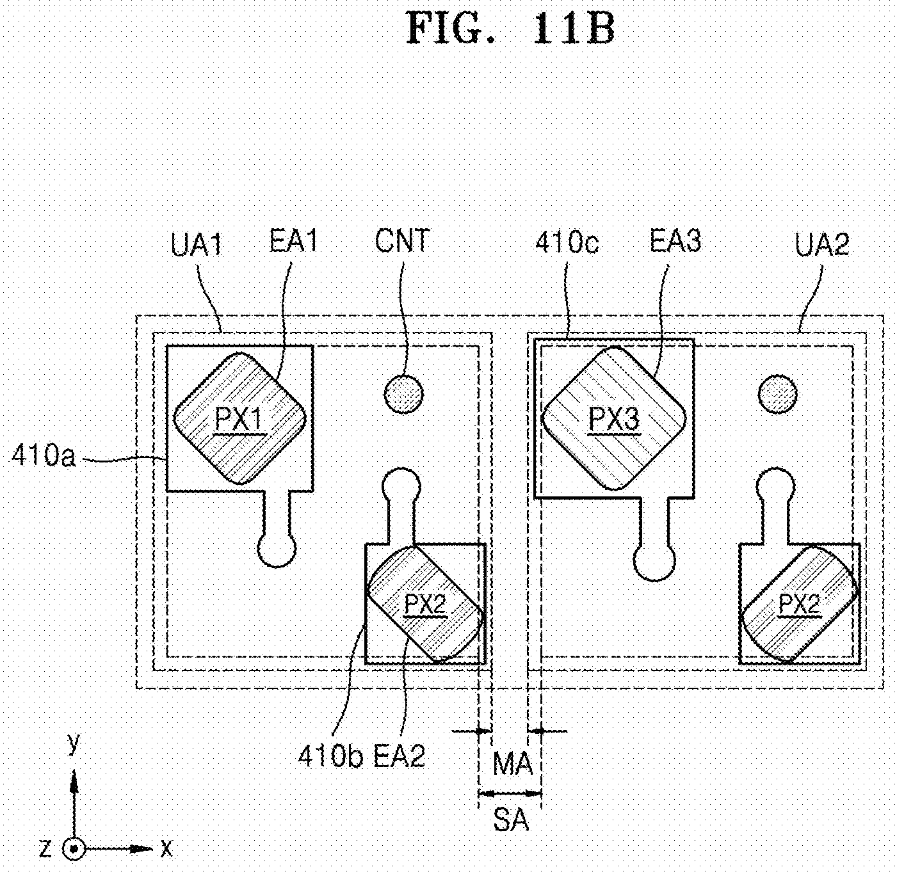

FIGS. 11A to 11B are plan views schematically illustrating a pixel arrangement of a display device according to an embodiment.

Referring to FIG. 11A, a plurality of unit areas UA1, UA2, UA3, and UA4 may be arranged apart from each other, with the intermediate area MA between the plurality of unit areas UA1, UA2, UA3, and UA4. For example, the second unit area UA2 may be arranged apart from the first unit area UA1 in a first direction (for example, an x direction), the third unit area UA3 may be arranged apart from the first unit area UA1 in a second direction (for example, a y direction), and the fourth unit area UA4 may be arranged apart from the third unit area UA3 in the first direction (for example, the x direction).

The intermediate area MA may be arranged such that the intermediate area MA surrounds each of the unit areas UA1, UA2, UA3, and UA4. The valley portion V defined by the emission element layer EDL (see FIG. 10) and the encapsulation layer 500 (see FIG. 10) may overlap the intermediate area MA. Accordingly, portions of the emission element layer EDL respectively overlapping the unit areas UA1, UA2, UA3, and UA4 may be apart from each other with the intermediate area MA between the portions of the emission element layer EDL. Portions of the encapsulation layer 500 overlapping the unit areas UA1, UA2, UA3, and UA4 may be apart from each other, with the intermediate area MA between the portions of the encapsulation layer 500.

One or more pixels may be arranged in each of the unit areas UA1, UA2, UA3, and UA4. Regarding this, FIG. 11A illustrates two pixels arranged in one unit area. For example, a first pixel PX1 and a second pixel PX2 may be arranged in the first unit area UA1, a third pixel PX3 and a second pixel PX2 may be arranged in the second unit area UA2, a third pixel PX3 and a second pixel PX2 may be arranged in the third unit area UA3, and a first pixel PX1 and a second pixel PX2 may be arranged in the fourth unit area UA4.

The first pixel PX1, the second pixel PX2, and the third pixel PX3 may emit light of different colors from each other. For example, the first pixel PX1 may emit red light, the second pixel PX2 may emit green light, and the third pixel PX3 may emit blue light. However, one or more embodiments are not limited thereto. In FIG. 11A, a boundary of each pixel indicates a boundary of an emission area.

At least one contact hole CNT may be arranged in each of the unit areas UA1, UA2, UA3, and UA4. As described with reference to FIGS. 6A to 6C, the contact hole CNT may be a hole configured for electrically connecting the voltage line VL and the metal bank layer 300 to each other. In some embodiments, the contact hole CNT may be arranged between neighboring pixels within one unit area.

A first emission area EA1 of the first pixel PX1, a second emission area EA2 of the second pixel PX2, a third emission area EA3 of the third pixel PX3 may have the same rectangular shape as each other, and may be arranged in a matrix in the first direction (for example, the x direction) and in the second direction (for example, the y direction).

A distance in the first direction (for example, the x direction) between pixels emitting light of the same color may be substantially the same as a distance in the second direction (for example, the y direction) between the pixels emitting light of the same color. For example, a first distance d1 between the center of the second pixel PX2 arranged in the first unit area UA1 and the center of the second pixel PX2 arranged in the second unit area UA2 may be the same as a second distance d2 between the center of the second pixel PX2 arranged in the second unit area UA2 and the center of the second pixel PX2 arranged in the fourth unit area UA4. Therefore, a pitch between pixels may be formed consistently.

A width of the first opening IOP defined by the inorganic insulating layer IIL (see FIG. 10) may be greater than a width of the valley portion V. Accordingly, a width of the segment area SA may be greater than a width of the intermediate area MA. When each of the pixels are arranged in the form illustrated in FIG. 11A, pixel circuits of each pixel may be arranged inside a unit area. Accordingly, the center of the valley portion V may be formed to correspond to the center of the first opening IOP.

In some embodiments, the width of the first opening IOP may be substantially the same as or similar to the width of the valley portion V. In this case, the segment area SA and the intermediate area MA may have corresponding shapes.

Referring to FIG. 11B, the first unit area UA1 and the second unit area UA2 may be arranged apart from each other, with the intermediate area MA between the first unit area UA1 and the second unit area UA2. The second unit area UA2 may be arranged apart from the first unit area UA1 in the first direction (for example, the x direction).

The intermediate area MA may be arranged such that the intermediate area MA surrounds the first unit area UA1 and the second unit area UA2. The valley portion V defined by the emission element layer EDL (see FIG. 10) and the encapsulation layer 500 (see FIG. 10) may overlap the intermediate area MA.

One or more pixels may be arranged in each of the first unit area UA1 and the second unit area UA2. Regarding this, FIG. 11B illustrates two pixels arranged in one unit area. For example, the first pixel PX1 and the second pixel PX2 may be arranged in the first unit area UA1, and the third pixel PX3 and the second pixel PX2 may be arranged in the second unit area UA2. The first pixel PX1, the second pixel PX2, and the third pixel PX3 may emit light of different colors from each other. For example, the first pixel PX1 may emit red light, the second pixel PX2 may emit green light, and the third pixel PX3 may emit blue light. However, one or more embodiments are not limited thereto. In FIG. 11B, a boundary of each pixel indicates a boundary of an emission area.

Emission areas EA1, EA2, and EA3 of each pixel may be arranged in a diamond or PenTile matrix structure. In this case, a pixel electrode of each pixel may deviate from an area in which a pixel circuit is arranged. For example, a pixel electrode 410*a* of the first pixel PX1 may be located inside the boundary of an area in which a pixel circuit is arranged, but a pixel electrode 410*b* may protrude to the outside of the boundary in which a pixel circuit is arranged.

Because the intermediate area MA does not overlap a pixel electrode and the segment area SA does not overlap a pixel circuit, the width of the intermediate area MA may be less than the width of the segment area SA. In some embodiments, the intermediate area MA may have a shape other than a square grid shape depending on the arrangement of the pixel electrodes. In this case, the intermediate area MA and the segment area SA may be offset from each other.

At least one contact hole CNT may be arranged in each of the first unit area UA1 and the second unit area UA2.

Figure 12:
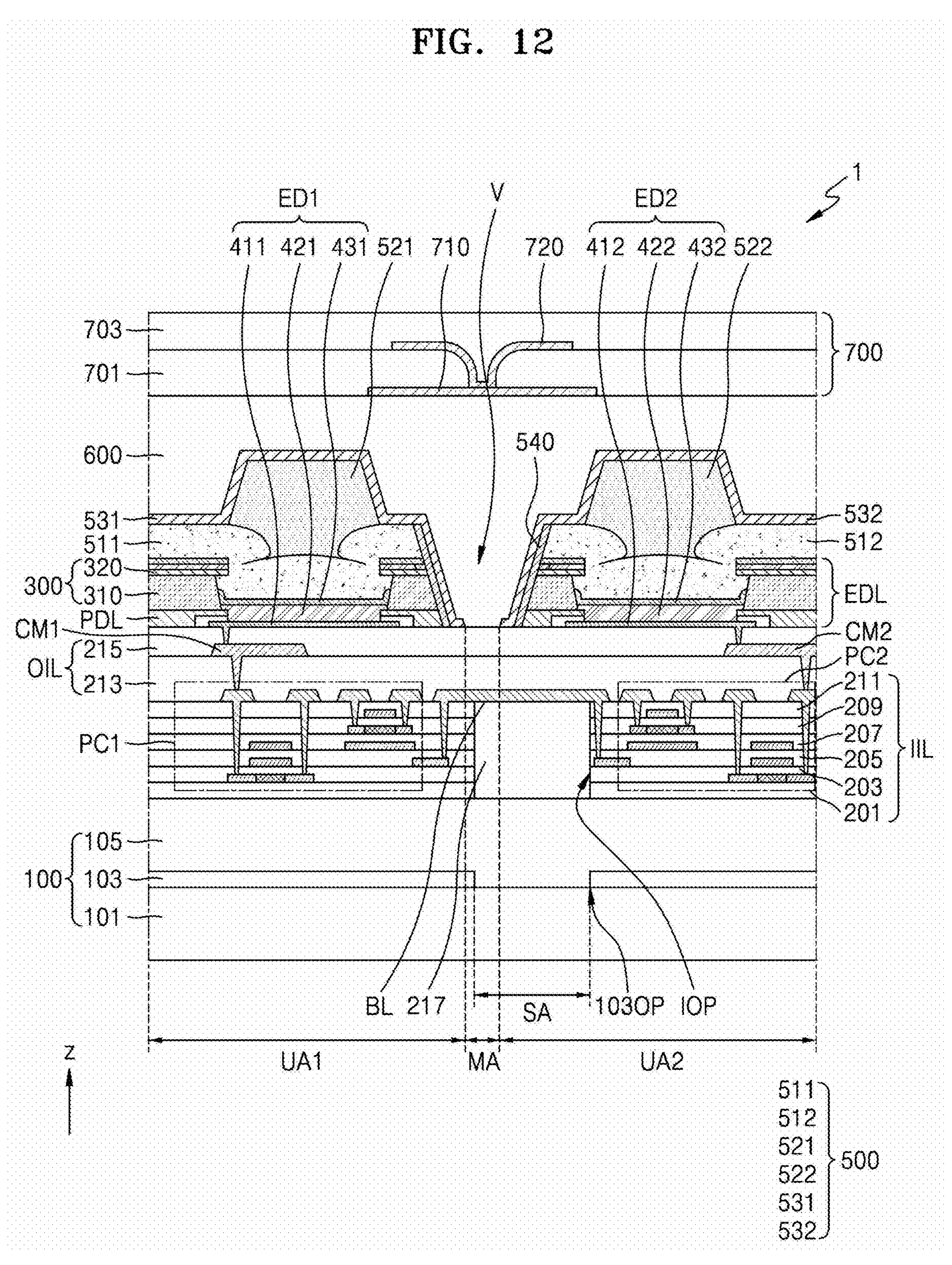
FIG. 12 is a cross-sectional view schematically illustrating a display device according to an embodiment.

FIG. 12 is a cross-sectional view schematically illustrating a display device 1 according to an embodiment. FIG. 12 is similar to FIG. 10, differing in that the intermediate area MA and the segment area SA are offset from each other.

Referring to FIG. 12, the second emission element ED2 may protrude further toward the first unit area UA1 from an area in which the second pixel circuit PC2 is arranged. Because the first opening IOP of the inorganic insulating layer IIL is arranged between the first pixel circuit PC1 and the second pixel circuit PC2, the first opening IOP of the inorganic insulating layer IIL may partially overlap the second pixel electrode 412 of the second emission element ED2.

In some aspects, because the valley portion V is arranged between the first emission element ED1 and the second emission element ED2, the valley portion V and the first opening IOP of the inorganic insulating layer IIL may be offset from each other. Accordingly, the segment area SA in which the first opening IOP of the inorganic insulating layer IIL and the second opening 103OP of the first barrier layer 103 are arranged and the intermediate area MA in which the valley portion V is arranged may be offset from each other.

In FIG. 12, a portion of the segment area SA overlaps a portion of the intermediate area MA. However, the segment area SA and the intermediate area MA may not overlap each other depending on the arrangement of pixel circuits and emission elements.

Figure 13A:
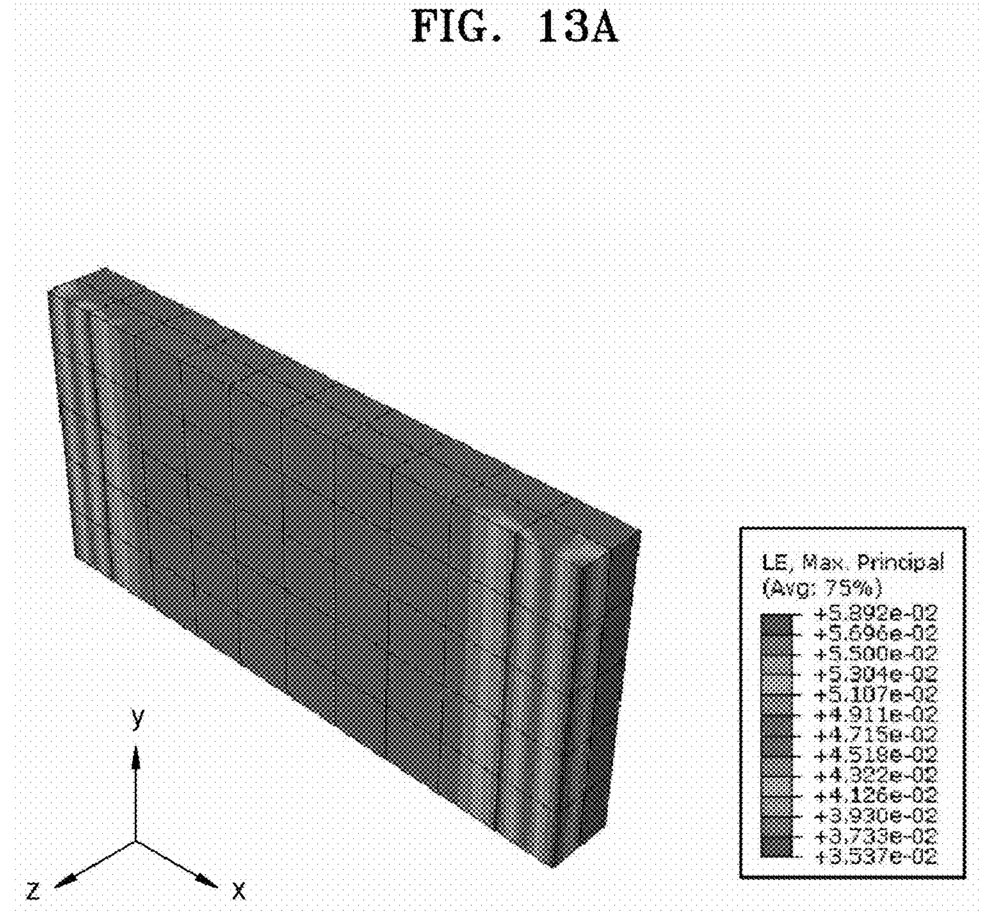
FIGS. 13A to 13C are diagrams illustrating elongation rates of each area of a substrate, an inorganic insulating film, and a conductive line when an inorganic insulating film is integrally formed on an entire surface of a substrate.
Figure 13B:
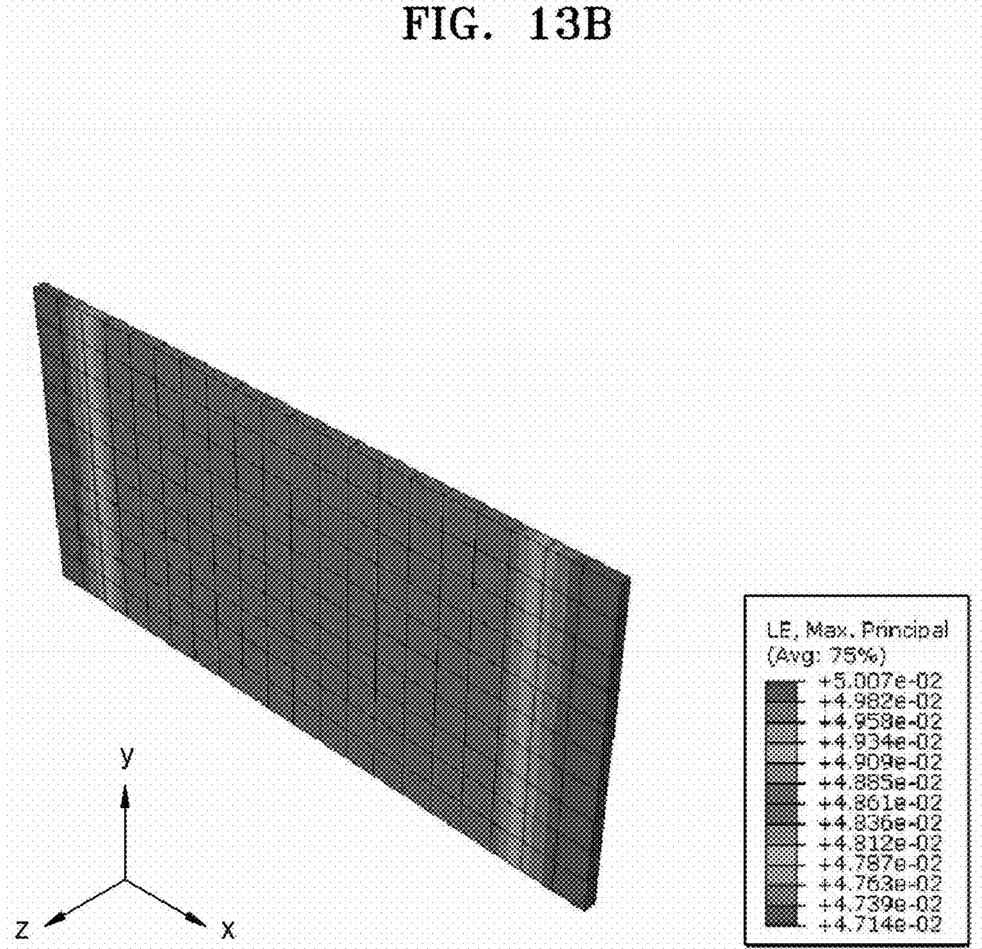
Figure 13C:
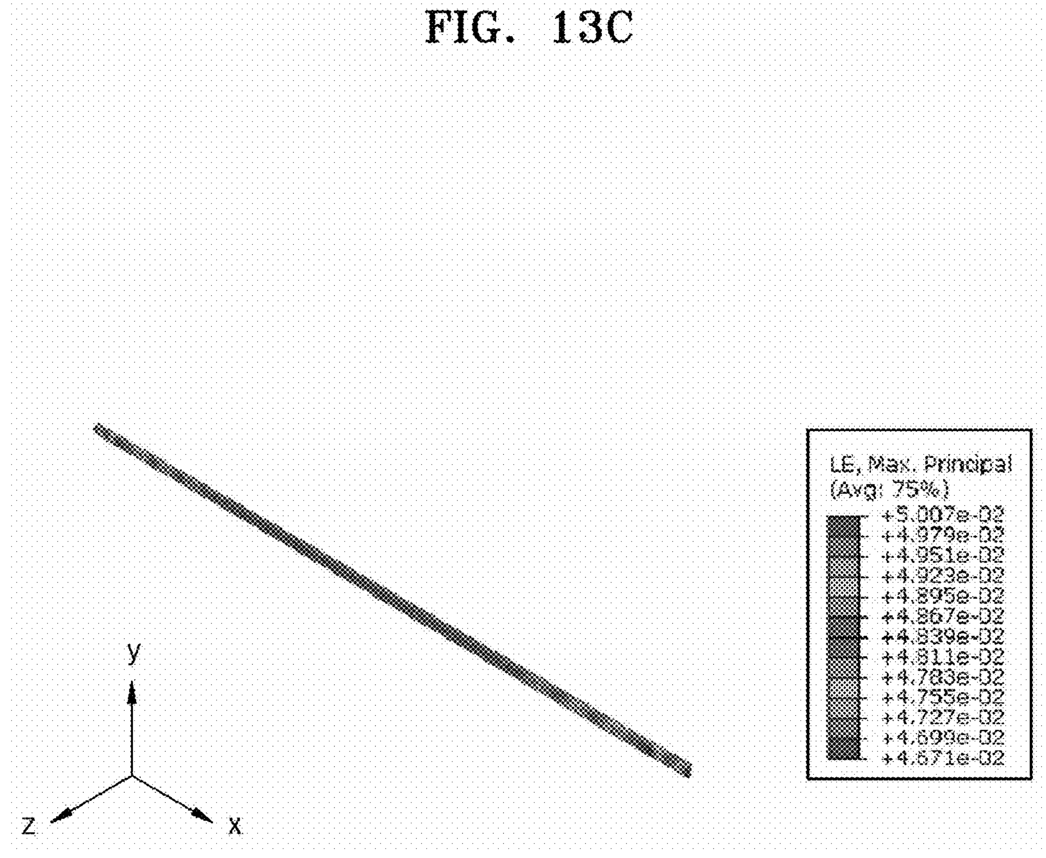

FIGS. 13A to 13C are diagrams illustrating elongation rates of each area of a substrate, an inorganic insulating film, and a conductive line, when the inorganic insulating film is integrally formed on an entire surface of the substrate. FIGS. 13A to 13C illustrate results of simulating elongation rates of a substrate, an inorganic insulating film formed on the entire surface of the substrate, and a conductive line extending in an x direction across the substrate, when a structure including the substrate, the inorganic insulating film, and the conductive line is stretched by 5% in the x and −x directions.

Referring to FIGS. 13A to 13C, the substrate has an overall elongation rate of about 5% except for both ends in the x direction, the inorganic insulating film has an overall elongation rate of about 4.8% except for both ends in the x direction, and the conductive line has an overall elongation rate of about 4.8% except for both ends in the x direction.

Figure 14A:
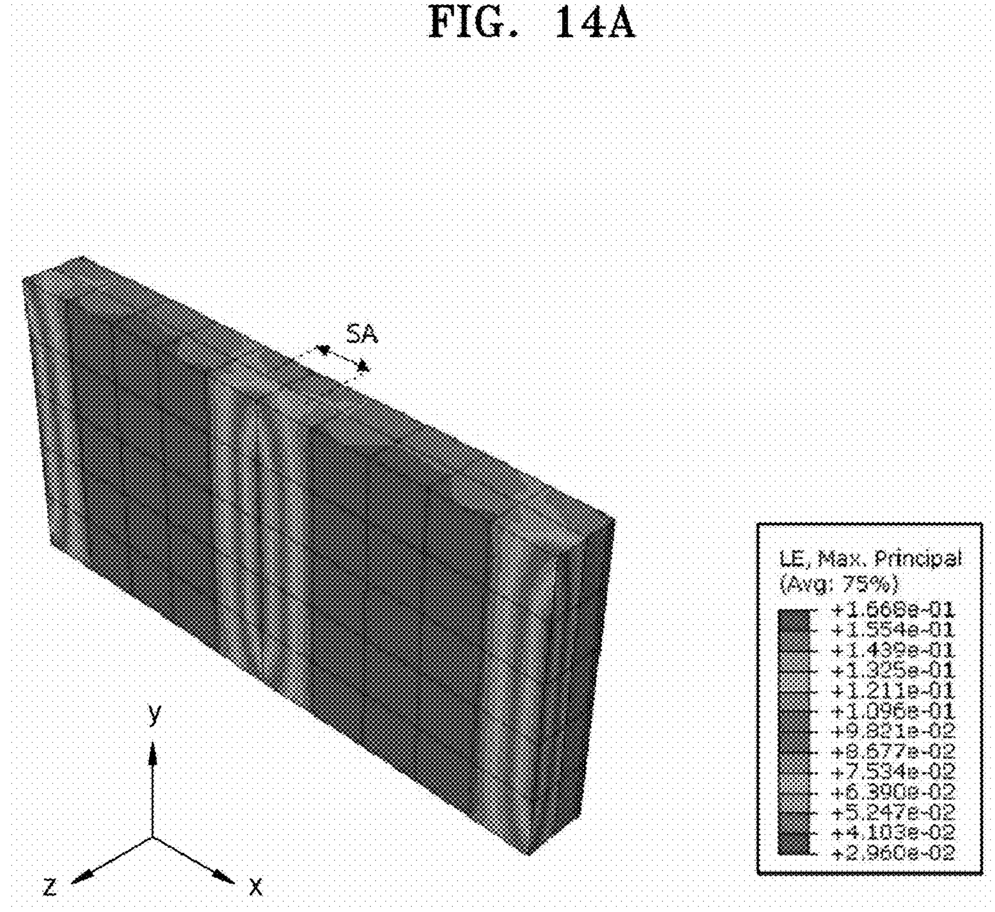
Figure 14B:
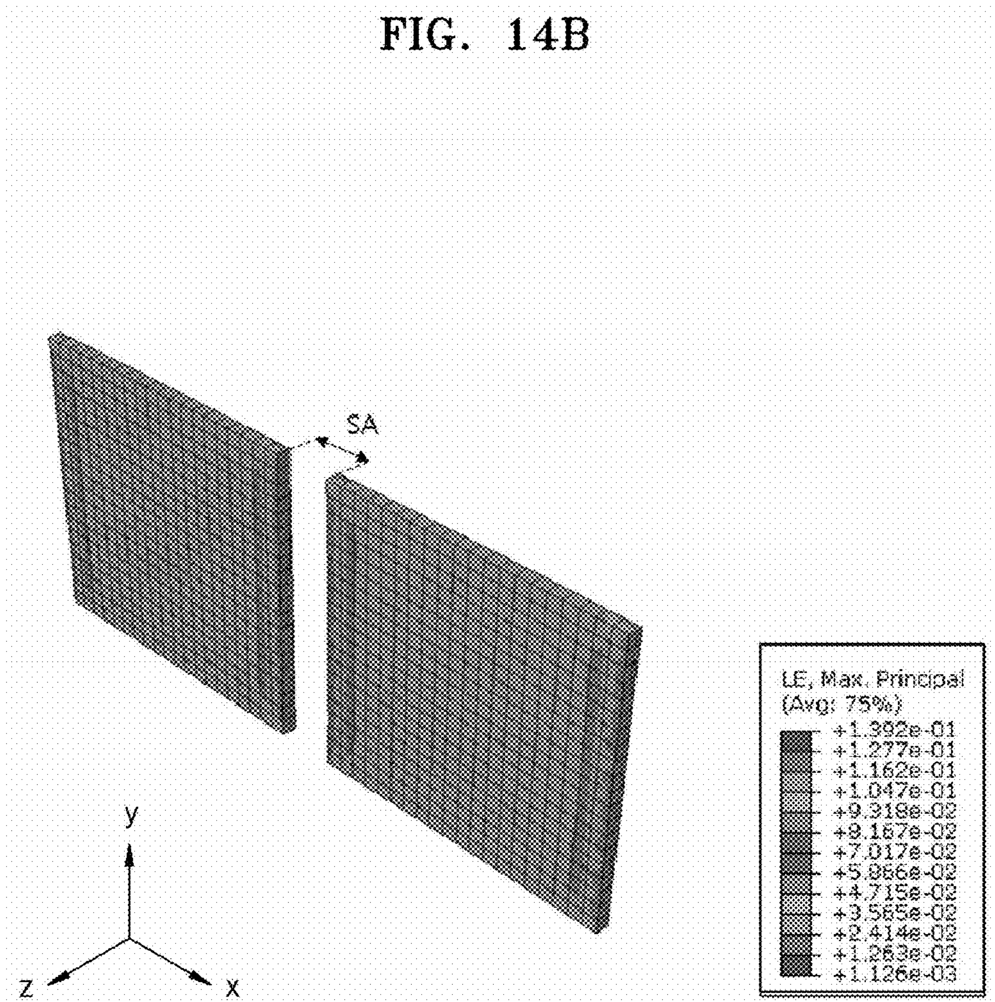
Figure 14C:
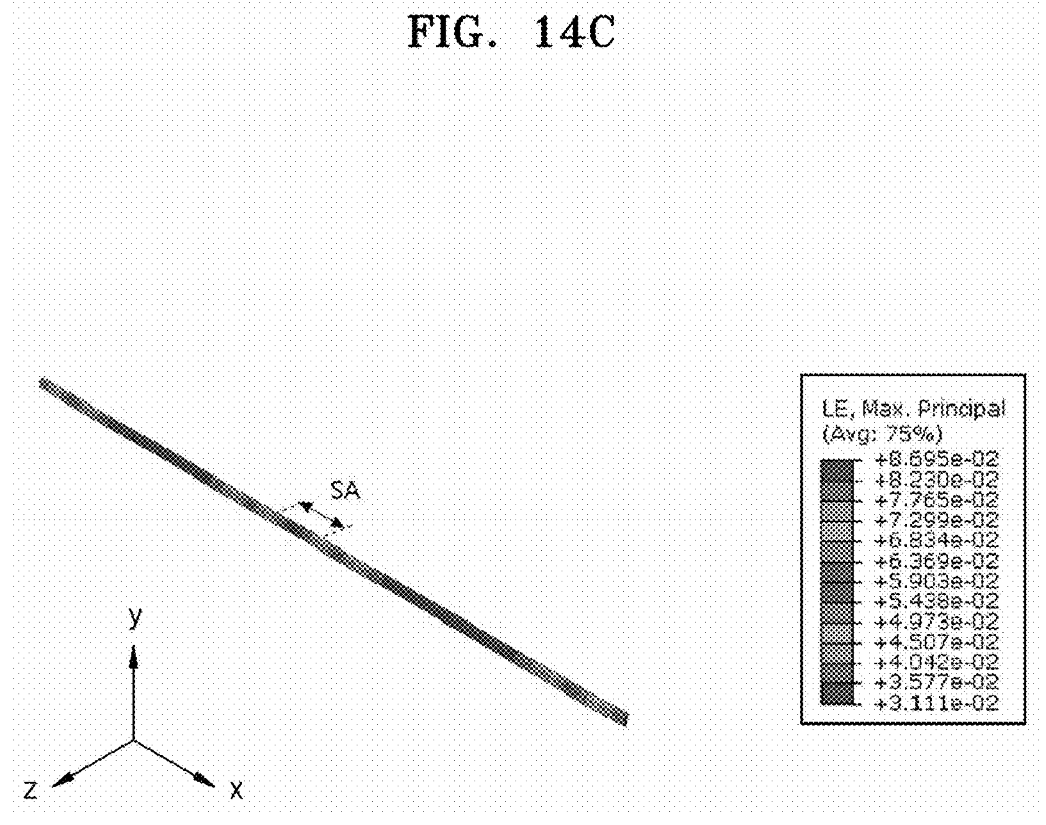

FIGS. 14A to 14C are diagrams illustrating elongation rates of each area of a substrate, an inorganic insulating film, and a conductive line, when the inorganic insulating film is segmented with a segment area in between. FIGS. 14A to 14C illustrate results of simulating elongation rates of a substrate, an inorganic insulating film formed by being segmented with the segment area SA in between, and a conductive line extending in an x direction across the substrate, when a structure including the substrate, the inorganic insulating film, and the conductive line is stretched by 5% in the x and −x directions.

Referring to FIGS. 14A to 14C, a strain of the substrate may be concentrated in the segment area SA, and the substrate may have an elongation rate of about 16% at the center of the segment area SA, and the substrate may have an elongation rate of about 3% in the segment area SA and areas excluding both ends in the x direction. The inorganic insulating film may be segmented into two parts with the segment area SA in between, and it can be seen that the elongation rate of each of the parts has decreased to about 3% or less. The conductive line has an elongation rate of about 3% in the segment area SA and areas excluding both ends in the x direction, but it was confirmed that the conductive line has a somewhat higher elongation rate of about 8% or more in the segment area SA.

Thus, a structure in which the inorganic insulating film is segmented with the segment area SA in between reduces the overall elongation rate of each element, thereby reducing and preventing defects due to cracks or the like.

Figure 15:
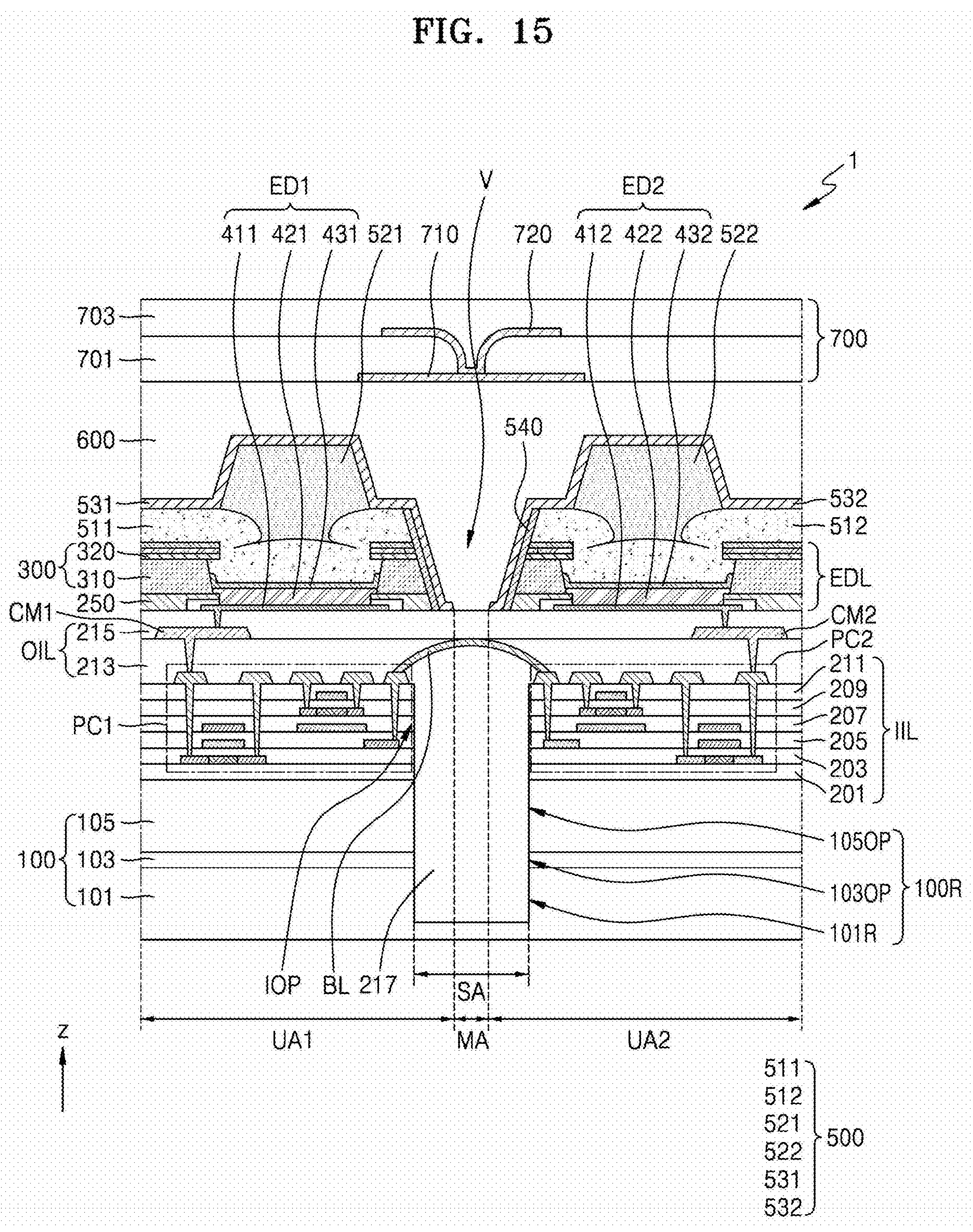
FIG. 15 is a cross-sectional view schematically illustrating a display device according to an embodiment.

FIG. 15 is a cross-sectional view schematically illustrating a display device 1 according to an embodiment. FIG. 15 is similar to FIG. 10, differing in that the substrate 100 defines a recess portion 100R overlapping the first opening IOP of the inorganic insulating layer IIL, and the bridge line BL has an arch shape.

Referring to FIG. 15, the display device 1 may include the first unit area UA1, the second unit area UA2, the intermediate area MA, and a segment area SA.

The substrate 100 may be provided such that a barrier layer, which is an inorganic material layer, and a base layer, which is an organic material layer, are alternately arranged with each other. For example, the substrate 100 may include the first base layer 101 and the second base layer 105, which include an organic material, and the first barrier layer 103 located between the first base layer 101 and the second base layer 105.

The substrate 100 may define the recess portion 100R that is concave in a thickness direction (for example, a ±z direction) from the uppermost surface of the substrate (for example, the upper surface of the second base layer 105). The thickness direction represents the thickness direction of display device 1 (see FIG. 1). For example, the recess portion 100R may include a third opening 105OP defined in the second base layer 105, the second opening 103OP defined in the first barrier layer 103, and a first recess 101R defined in the first base layer 101.

The third opening 105OP may pass through the second base layer 105 and the second opening 103OP may pass through the first barrier layer 103, but the first recess 101R may not pass through the first base layer 101, and the first base layer 101 may constitute the bottom surface of the first recess 101R. Because the first base layer 101 is not completely separated by the first recess 101R, when the substrate 100 is separated from a mother substrate during a manufacturing process for the display device 1, the substrate 100 may be prevented from being torn along the recess portion 100R. The inorganic insulating layer IIL may overlap the segment area SA and define the first opening IOP exposing the upper surface of the second base layer 105.

The first pixel circuit PC1, the second pixel circuit PC2, and the inorganic insulating layer IIL may be disposed on the substrate 100. The inorganic insulating layer IIL may include inorganic material layers between the substrate 100 and the emission element layer EDL. For example, the inorganic insulating layer IIL may include the buffer layer 201, the first gate insulating layer 203, the second gate insulating layer 205, the first interlayer insulating layer 207, the third gate insulating layer 209 and the second interlayer insulating layer 211.

The inorganic insulating layer IIL may overlap the segment area SA and define the first opening IOP exposing the upper surface of the second base layer 105. A portion of the inorganic insulating layer IIL overlapping the first unit area UA1 and a portion of the inorganic insulating layer IIL overlapping the second unit area UA2 may be arranged apart from each other, with the segment area SA between the portions of the inorganic insulating layer IIL.

The recess portion 100R may overlap the segment area SA. In other words, the recess portion 100R may overlap the first opening IOP of the inorganic insulating layer IIL. A side surface of the recess portion 100R may extend from a side surface of the first opening IOP of the inorganic insulating layer IIL.

The first opening IOP of the inorganic insulating layer IIL and the recess portion 100R of the substrate 100 may be filled with the filler layer 217. In some embodiments, an upper surface of the filler layer 217 may be located on a level identical or similar to a level at which the upper surface of the second interlayer insulating layer 211 is located. In some embodiments, the upper surface of the filler layer 217 may have a convex shape higher than the upper surface of the second interlayer insulating layer 211, a concave shape lower than the upper surface of the second interlayer insulating layer 211, or a shape with unevenness including one or more protrusions and/or one or more recesses. In some embodiments, the upper surface of the filler layer 217 may have a shape with unevenness in which protrusions and recesses alternate with each other.

Regarding this, FIG. 15 illustrates that an upper surface of the filler layer 217 has a convex shape. Because the upper surface of the filler layer 217 has a convex shape, the bridge line BL disposed on the filler layer 217 may have an arch shape. The bridge line BL having an arch shape may be more robust against stretching.

The filler layer 217 may include a polymer-based material. Polymer-based materials may include, for example, acryl-based resin, epoxy-based resin, polyimide, and polyethylene. The filler layer 217 may have a relatively low modulus. The modulus of the filler layer 217 may be about 3 MPa to about 20 MPa.

A bridge line BL may be disposed on the filler layer 217 and connect an element of the first pixel circuit PC1 and a corresponding element of the second pixel circuit PC2 to each other. The bridge line BL may be arranged between the filler layer 217 and the first planarization layer 213.

Because the segment area SA overlaps the intermediate area MA, the first opening IOP may overlap the valley portion V. In some embodiments, a width of the intermediate area MA may be less than a width of the segment area SA. In some embodiments, a width of the intermediate area MA may be identical to a width of the segment area SA.

When the display device 1 is stretched or bent, stress may be concentrated on the filler layer 217 having a relatively low modulus. Thus, cracks or the like in inorganic films included in the substrate 100, the inorganic insulating layer IIL, the emission element layer EDL, and the encapsulation layer 500 may be prevented or reduced. The display device 1 may have a structure that is more robust against stretching.

FIGS. 16A to 16F are cross-sectional views schematically illustrating a bridge line included in a display device, according to one or more embodiments. FIGS. 16A to 16F illustrate an enlarged portion of the display device 1 illustrated in FIG. 15.

Figure 16A:
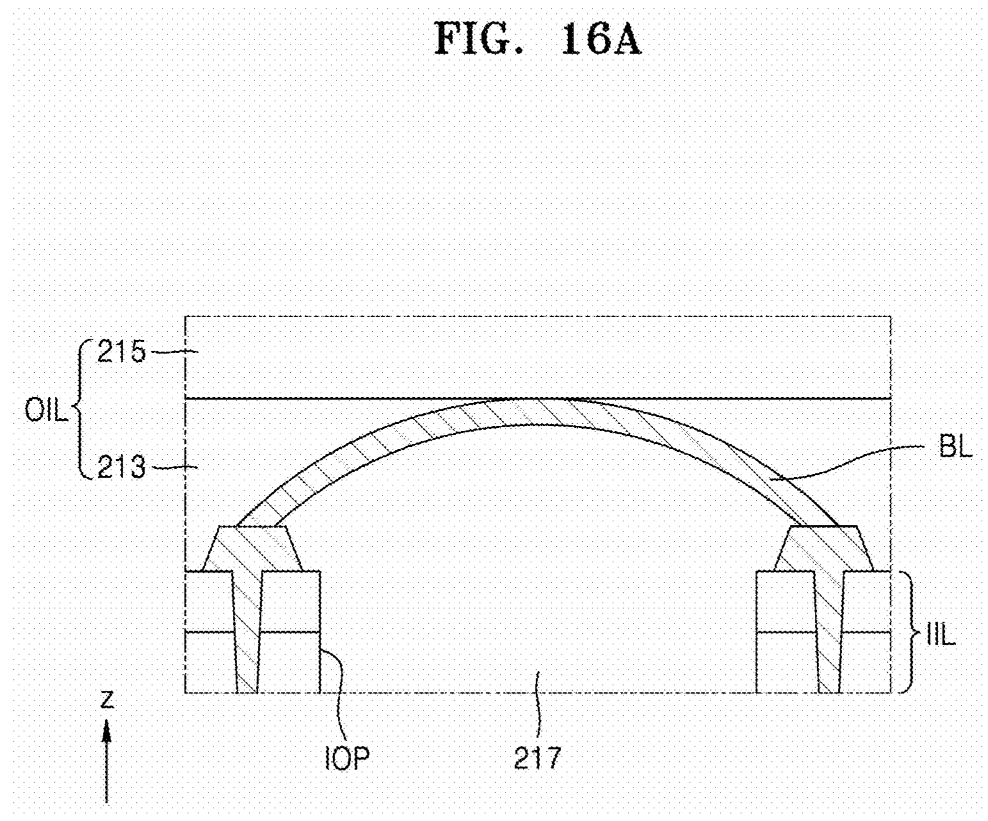
FIGS. 16A to 16F are cross-sectional views schematically illustrating a bridge line included in a display device, according to one or more embodiments.
Figure 16B:
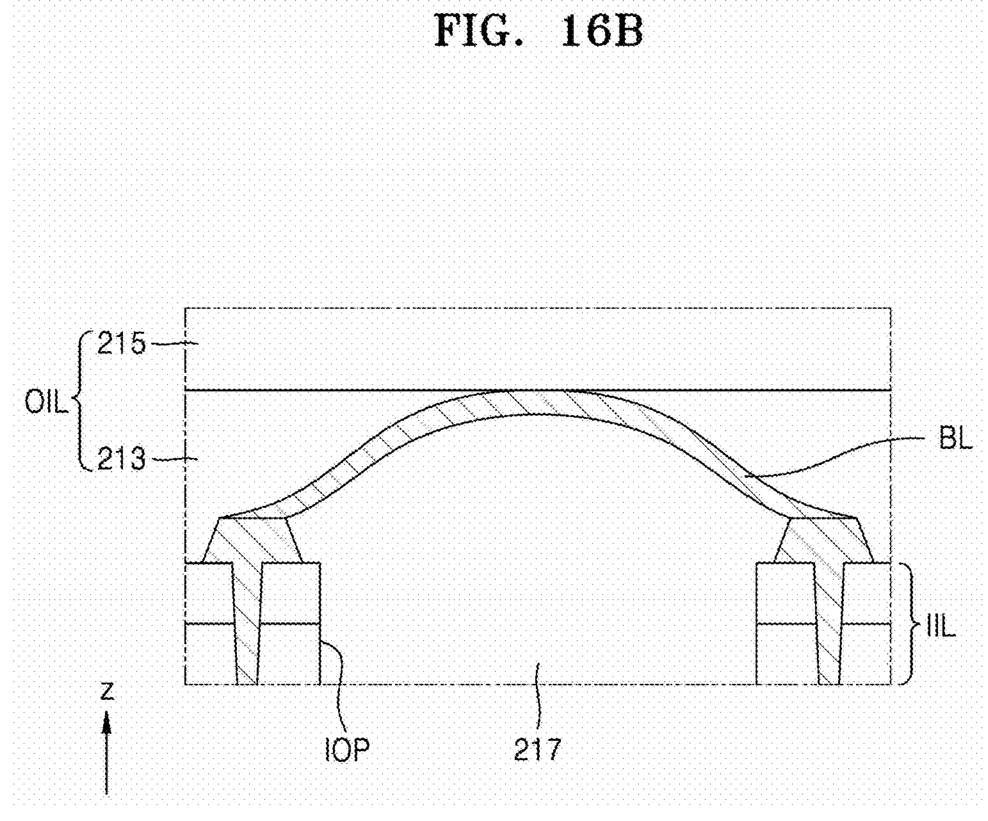

Referring to FIGS. 16A and 16B, the filler layer 217 may fill in the first opening IOP defined in the inorganic insulating layer IIL. The upper surface of the filler layer 217 may have a convex shape that is higher than the upper surface of the inorganic insulating layer IIL. The bridge line BL extending along the upper surface of the filler layer 217 may have an arch shape. The bridge line BL may have an arch shape with a single curvature, as illustrated in FIG. 16A, or may have an arch shape with a double curvature, as illustrated in FIG. 16B.

The organic insulating layer OIL may be disposed on the inorganic insulating layer IIL and the filler layer 217 and cover the bridge line BL. The organic insulating layer OIL may include the first planarization layer 213 and the second planarization layer 215.

Figure 16C:
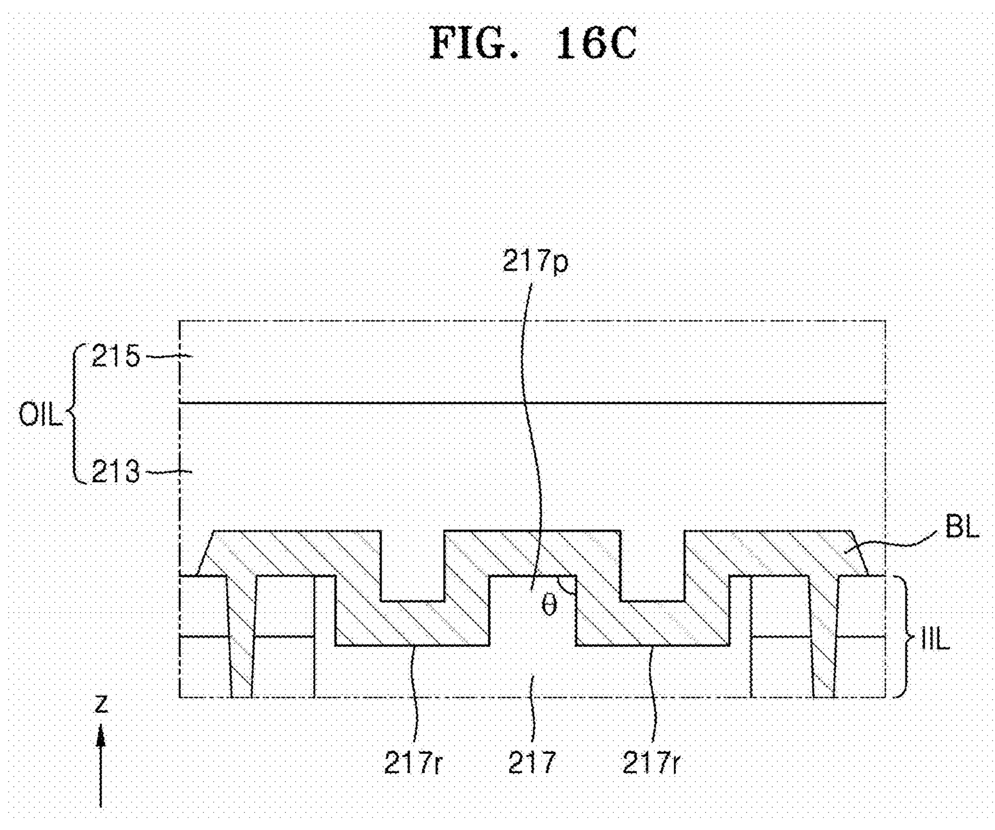
Figure 16D:
Figure 16D:
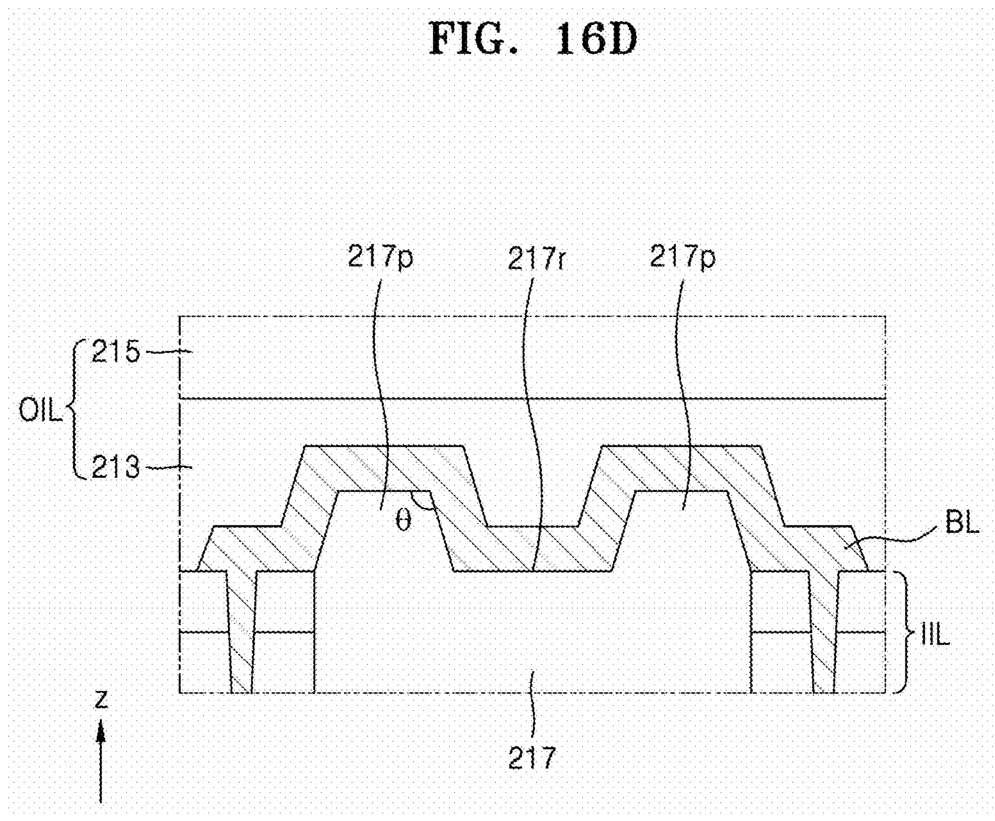

Referring to FIGS. 16C and 16D, the upper surface of the filler layer 217 may have a concavo-convex shape in which protrusions 217*p* that are convex compared to a surrounding area and recesses 217*r* that are concave compared to the surrounding area are alternately arranged with each other. An angle θ formed between an upper surface and a side surface of the protrusion 217*p* may be a right angle as illustrated in FIG. 16C or may have an obtuse angle as illustrated in FIG. 16D. The bridge line BL may have a shape corresponding to the upper surface of the filler layer 217. In other words, the bridge line BL may have a wiggle shape along the unevenness.

Figure 16E:
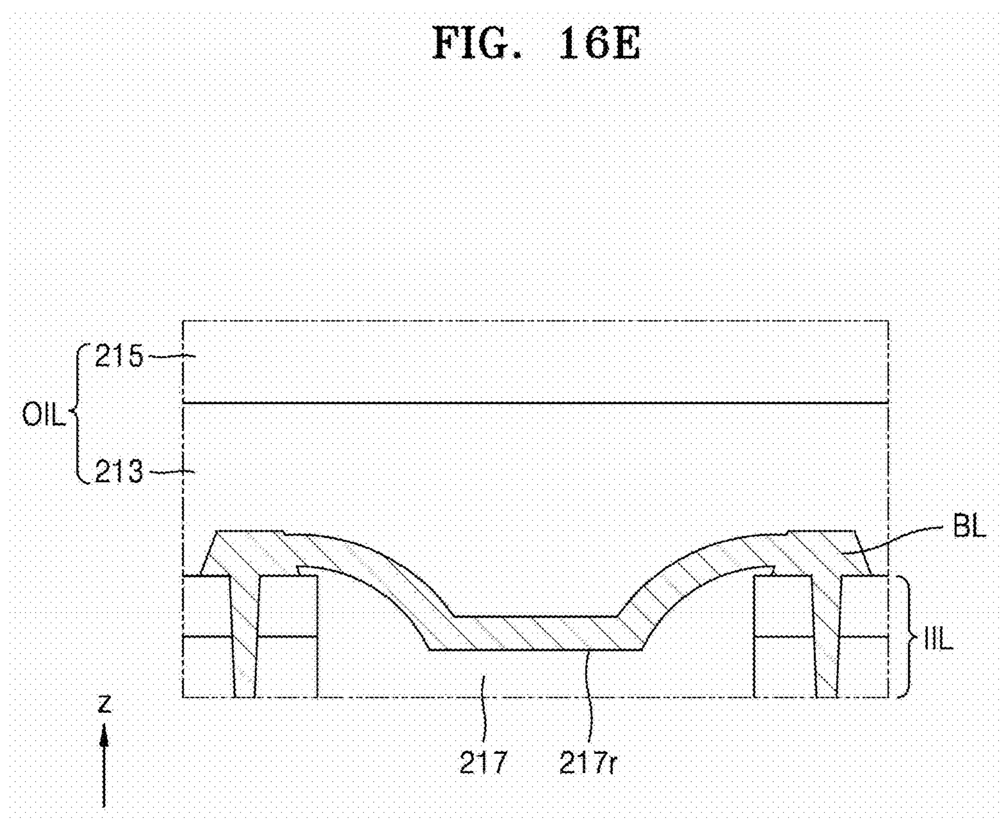

Referring to FIG. 16E, the upper surface of the filler layer 217 may include the recess 217*r* that is concave compared to the surrounding area. In some embodiments, the bottom surface of the recess 217*r* may be flat, but the side surface of the recess 217*r* may be gently curved (e.g., have a curvature). The bridge line BL may have a shape corresponding to the upper surface of the filler layer 217.

Figure 16F:
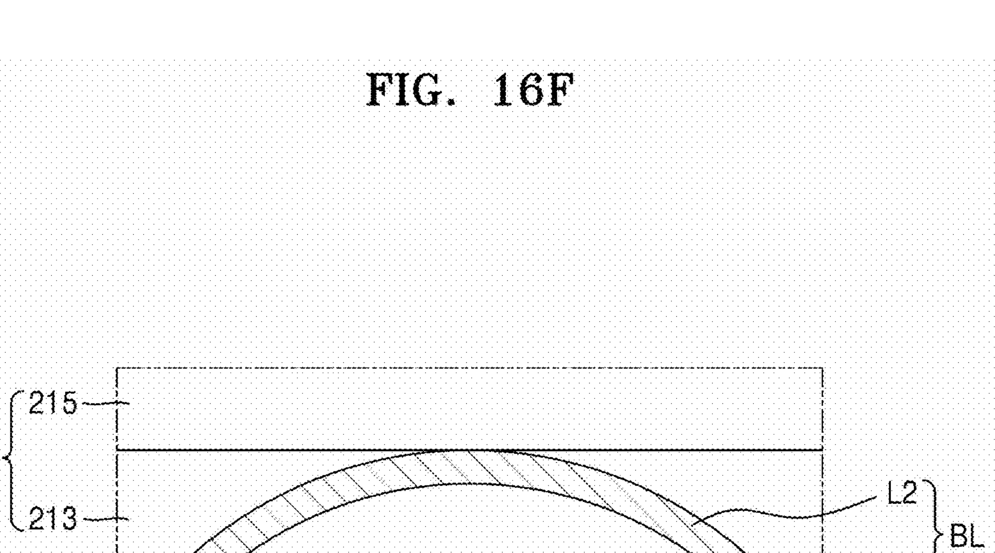

Referring to FIG. 16F, the upper surface of the filler layer 217 may include the recess 217*r* that is concave compared to the surrounding area, and the bridge line BL may have a double bridge structure including a first bridge line L1 corresponding to the upper surface of the filler layer 217 and a second bridge line L2 disposed on the first bridge line L1. In some embodiments, an upper filler layer filling in the recess 217*r* may be further disposed between the first bridge line L1 and the second bridge line L2, and the center of the upper filler layer may have a convex shape. Accordingly, the first bridge line L1 may have a concave shape in the thickness direction (for example, a z direction), and the second bridge line L2 may have an arch shape.

The structure of the filler layer 217 and the bridge line BL illustrated in FIGS. 16A to 16F may disperse the strain concentrated in some areas of the bridge line BL, preventing or reducing cracks in the bridge line BL when the display device is stretched.

Figure 17:
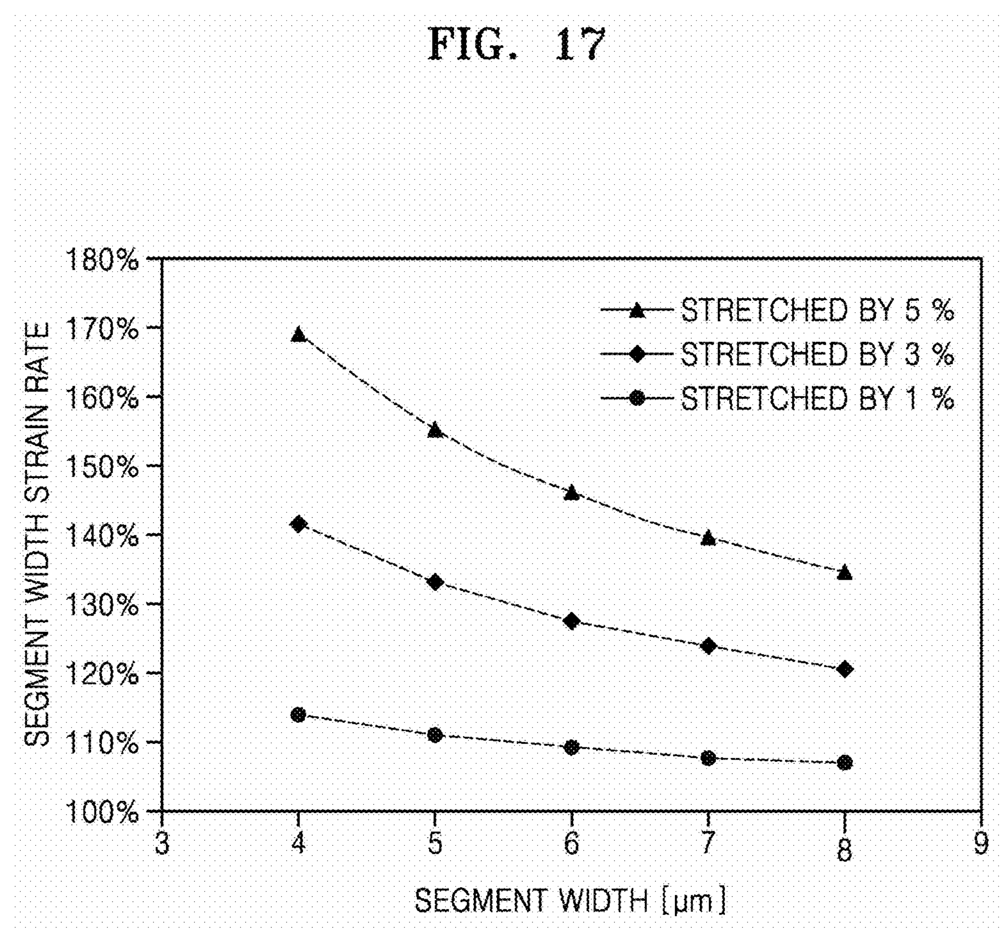
FIG. 17 is a graph illustrating a segment width strain rate according to a width of a segment area.
Figure 18:
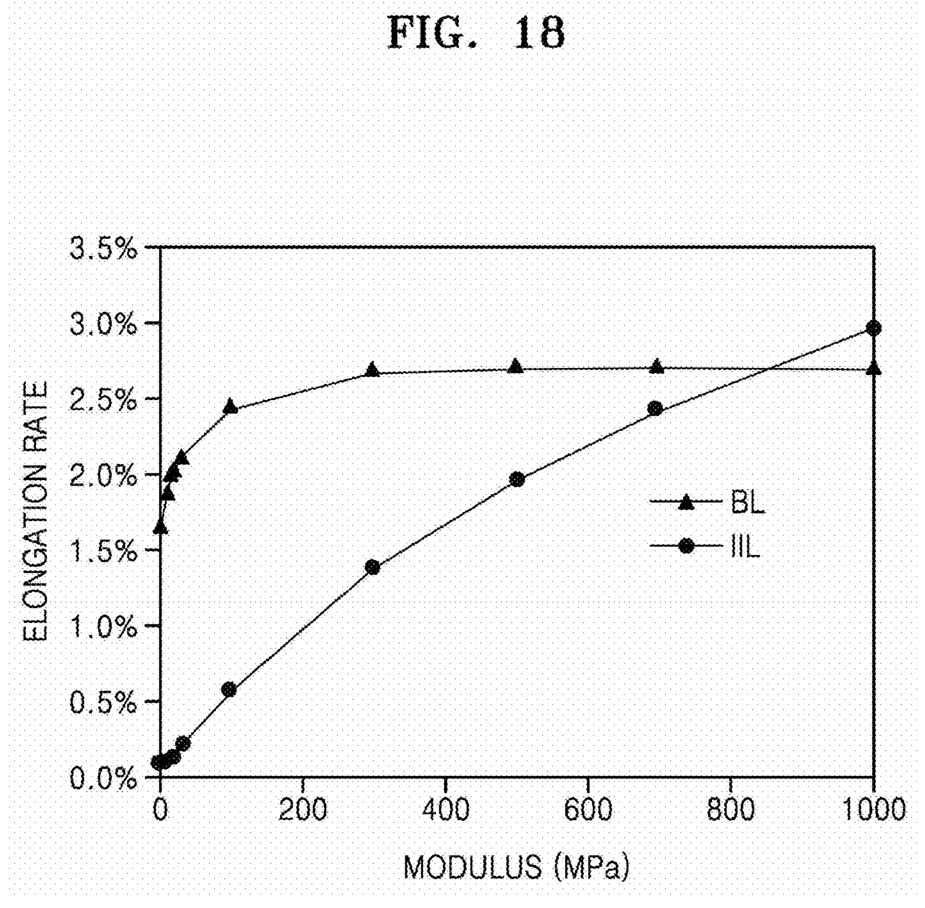
FIG. 18 is a graph illustrating an elongation rate of an inorganic insulating layer and an elongation rate of a bridge line according to a modulus of a filler layer.

FIG. 17 is a graph illustrating a segment width strain rate according to a width of a segment area, and FIG. 18 is a graph illustrating an elongation rate of an inorganic insulating layer and an elongation rate of a bridge line according to a modulus of a filler layer.

FIG. 17 illustrates a result of simulating a strain rate of a segment (area) width according to an initial width of a segment area, when a structure including a substrate having a recess portion overlapping the segment area, an inorganic insulating film formed by being segmented with the segment area in between, and a conductive line extending in the x direction across the substrate is stretched in one axis direction.

Referring to FIG. 17, the greater the initial width of the segment area, the smaller the segment width strain rate according to increases in the width of the segment area. For example, when the initial width of the segment area is 4 μm and the substrate is stretched by 5%, it can be seen that the segment width is deformed by about 170%, whereas, when the initial width is 8 μm and the substrate is stretched by 5%, it can be seen that the segment width is deformed by about 150%. Thus, as the width of the segment area increases, the segment width strain rate decreases, but the resolution of the display device may decrease.

FIG. 18 illustrates a result of simulating a strain rate of each of an inorganic insulating film IIL and a conductive line BL according to a modulus of a filler layer filling in a recess portion, when a structure including a substrate having a recess portion overlapping the segment area, an inorganic insulating film formed by being segmented with the segment area in between, and a conductive line extending in the x direction across the substrate is stretched by 5% in one axis direction.

Referring to FIG. 18, when the modulus of the filler layer is 20 MPa or less, it can be seen that the elongation rate of the inorganic insulating film IIL is about 0.13% or less, and the elongation rate of the conductive line BL is about 2.01% or less.

Because a threshold elongation rate at which cracks occur in the conductive line BL is 2.0%, and a threshold elongation rate at which cracks occur in the inorganic insulating film IIL is 0.7%, when the modulus of the filler layer is about 3 Mpa to about 20 Mpa, cracks in the inorganic insulating film IIL and the conductive line BL may be prevented or reduced, even when the substrate is stretched by 5%.

Figure 19:
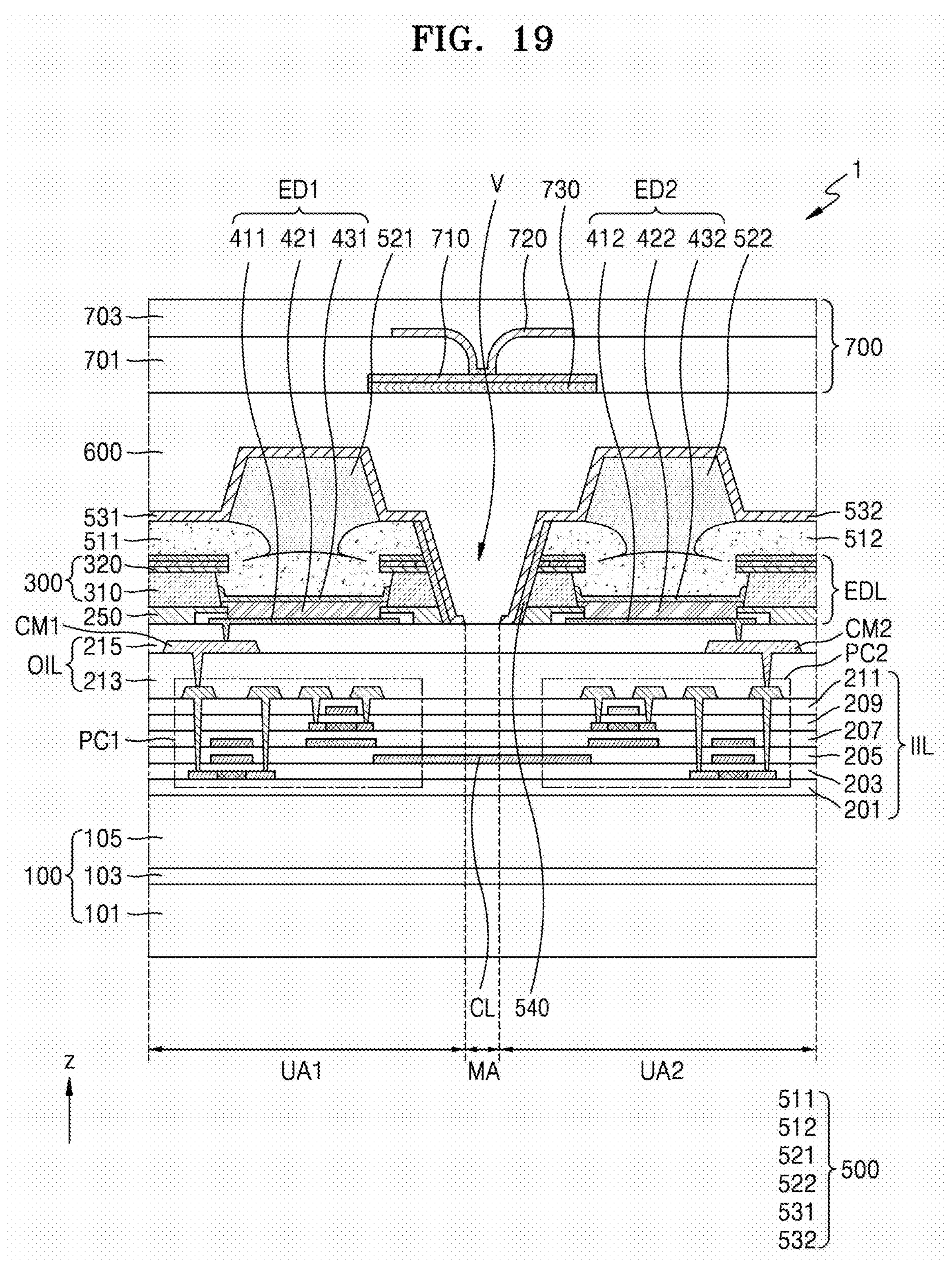
FIG. 19 is a cross-sectional view schematically illustrating a display device according to an embodiment.

FIG. 19 is a cross-sectional view schematically illustrating a display device 1 according to an embodiment. FIG. 19 is similar to FIG. 5, differing in that the touch sensor layer 700 further includes a third touch insulating layer 730.

Referring to FIG. 19, the display device 1 according to an embodiment may include a substrate 100, a first pixel circuit PC1 and a second pixel circuit PC2 disposed on the substrate 100, a first emission element ED1 electrically connected to the first pixel circuit PC1, and a second emission element ED2 electrically connected to the second pixel circuit PC2.

The display device 1 may include a first unit area UA1 in which the first emission element ED1 is arranged, a second unit area UA2 in which the second emission element ED2 is arranged, and an intermediate area MA located between the first unit area UA1 and the second unit area UA2.

The first pixel circuit PC1, the second pixel circuit PC2, and the inorganic insulating layer IIL may be disposed on the substrate 100. The inorganic insulating layer IIL may include inorganic material layers between the substrate 100 and the emission element layer EDL. For example, the inorganic insulating layer IIL may include the buffer layer 201, the first gate insulating layer 203, the second gate insulating layer 205, the first interlayer insulating layer 207, the third gate insulating layer 209 and the second interlayer insulating layer 211.

Elements of the first pixel circuit PC1 and the second pixel circuit PC2 may be connected to each other through a connection line CL. In FIG. 19, the connection line CL is arranged between the first gate insulating layer 203 and the second gate insulating layer 205. However, one or more embodiments are not limited thereto.

The organic insulating layer OIL including the first planarization layer 213 and the second planarization layer 215 may be disposed on the inorganic insulating layer IIL. The first connection electrode CM1 and the second connection electrode CM2 may be arranged between the first planarization layer 213 and the second planarization layer 215.

The first emission element ED1, the second emission element ED2, and the emission element layer EDL including an inorganic bank layer 250 and a metal bank layer 300 may be disposed on the organic insulating layer OIL. The first emission element ED1 may be arranged such that the first emission element ED1 overlaps the first unit area UA1, and the second emission element ED2 may be arranged such that the second emission element ED2 overlaps the second unit area UA2.

The first emission element ED1 may include a first pixel electrode 411, a first opposite electrode 431, and a first intermediate layer 421 arranged between the first pixel electrode 411 and the first opposite electrode 431. The second emission element ED2 may include a second pixel electrode 412, a second opposite electrode 432, and a second intermediate layer 422 arranged between the second pixel electrode 412 and the second opposite electrode 432.

The first emission element ED1 may be electrically connected to the first pixel circuit PC1 via the first connection electrode CM1. The second emission element ED2 may be electrically connected to the second pixel circuit PC2 through the second connection electrode CM2.

The inorganic bank layer 250 may be disposed on the organic insulating layer OIL and cover an edge of each of the first pixel electrode 411 of the first emission element ED1 and the second pixel electrode 412 of the second emission element ED2. The inorganic bank layer 250 may define pixel openings that expose a portion of each of the first pixel electrode 411 and the second pixel electrode 412. The metal bank layer 300 may be disposed on the inorganic bank layer 250. The metal bank layer 300 may include the first metal layer 310 and the second metal layer 320 disposed on the first metal layer 310.

The first opposite electrode 431 may be in direct contact with a side surface of the first metal layer 310 facing the center of the pixel opening. The second opposite electrode 432 may be in direct contact with a side surface of the first metal layer 310 facing the center of the pixel opening.

The encapsulation layer 500 may be disposed on the emission element layer EDL. The encapsulation layer 500 may include the first inorganic encapsulation layer 511 overlapping the first unit area UA1, the second inorganic encapsulation layer 512 overlapping the second unit area UA2, the third inorganic encapsulation layer 531 disposed on the first inorganic encapsulation layer 511, the fourth inorganic encapsulation layer 532 disposed on the second inorganic encapsulation layer 512, the first organic encapsulation layer 521 disposed between the first inorganic encapsulation layer 511 and the third inorganic encapsulation layer 531, and the second organic encapsulation layer 522 disposed between the second inorganic encapsulation layer 512 and the fourth inorganic encapsulation layer 532.

The first organic encapsulation layer 521 and the second organic encapsulation layer 522 may be patterned to correspond to the respective emission elements, or may be patterned such that the first organic encapsulation layer 521 and the second organic encapsulation layer 522 overlap emission elements arranged in the respective unit areas. In some embodiments, the first organic encapsulation layer 521 and the second organic encapsulation layer 522 may be omitted.

The emission element layer EDL and the encapsulation layer 500 may define the valley portion V overlapping the intermediate area MA and exposing the upper surface of the organic insulating layer OIL. The valley portion V may be arranged such that the valley portion V surrounds the first unit area UA1 and the second unit area UA2.

In the intermediate area MA, an inorganic material layer may not be arranged between the organic insulating layer OIL and the third planarization layer 600.

In some embodiments, as described with reference to FIG. 10, the display device 1 may include the segment area SA overlapping the second opening 103OP defined in the first barrier layer 103 and/or the first opening IOP defined in the inorganic insulating layer IIL. In some embodiments, as described with reference to FIG. 15, the display device 1 may include the segment area SA overlapping the first opening IOP defined by the inorganic insulating layer IIL and the recess portion 100R defined in the substrate 100.

The third planarization layer 600 may be disposed on the encapsulation layer 500, and the touch sensor layer 700 may be disposed on the third planarization layer 600.

The touch sensor layer 700 may include the first touch electrode 710, the second touch electrode 720, the first touch insulating layer 701 between the first touch electrode 710 and the second touch electrode 720, the second touch insulating layer 703 on the second touch electrode 720, and the third touch insulating layer 730 under the first touch electrode 710.

Because the third planarization layer 600 includes an organic material, in order to prevent damage to the first touch electrode 710 due to the third planarization layer 600 during a manufacturing process, the third touch insulating layer 730 may be disposed between the third planarization layer 600 and the first touch electrode 710. The third touch insulating layer 730 may include an inorganic material, such as, for example, silicon oxide, silicon nitride, and/or silicon oxynitride.

Because the first touch electrode 710 and the second touch electrode 720 are arranged such that the first touch electrode 710 and the second touch electrode 720 overlap the valley portion V, cracks may occur in the third touch insulating layer 730 including an inorganic material. In order to minimize cracks caused by the third touch insulating layer 730, the third touch insulating layer 730 may have a shape corresponding to a shape of the first touch electrode 710. In other words, the third touch insulating layer 730 may be patterned by using the same mask as the first touch electrode 710.

Thus, an area of the third touch insulating layer 730 may be minimized such that the display device 1 may have a more robust structure against stretching.

FIGS. 20A to 20G are perspective view schematically illustrating one or more embodiments of an electronic device including a display device according to an embodiment.

Figure 20A:
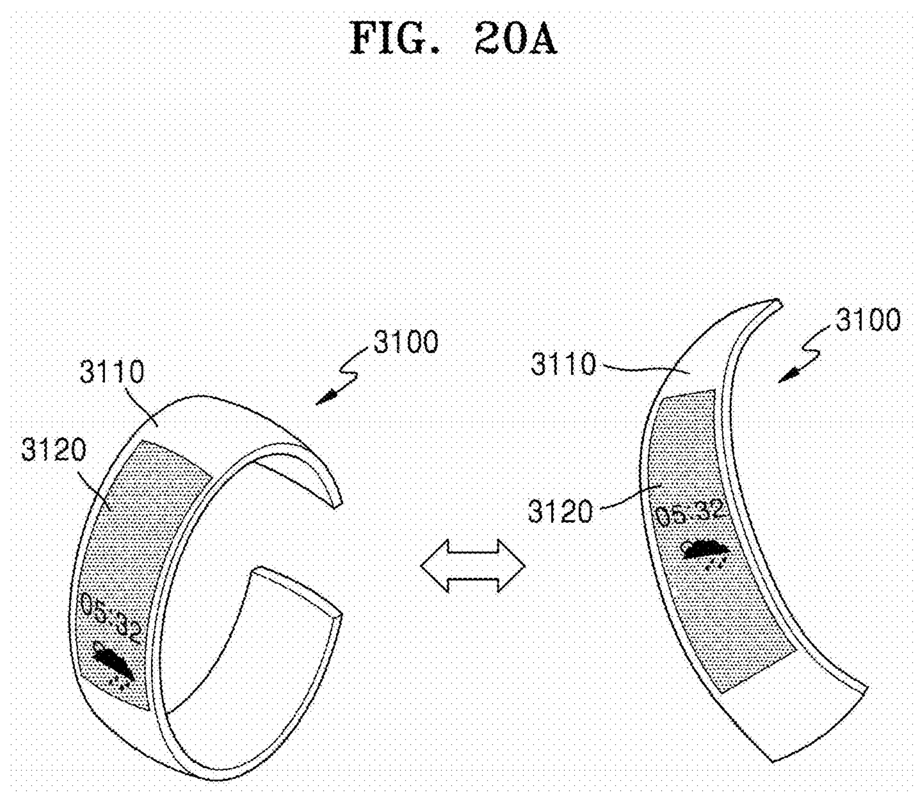
FIGS. 20A to 20G are perspective view schematically illustrating one or more embodiments of an electronic device including a display device according to an embodiment.

Referring to FIG. 20A, a display device according to an embodiment may be used in a wearable electronic device 3100 that may be worn on a part of the user's body. The wearable electronic device 3100 may include a body unit 3110 and a display unit 3120 provided on the body unit 3110. A display device according to one or more embodiments may be used as the display unit 3120 of the wearable electronic device 3100. As illustrated in FIG. 20A, the wearable electronic device 3100 may be deformable. In an embodiment, the wearable electronic device 3100 may be used as a smart watch or smartphone, depending on the user's choice.

Figure 20B:
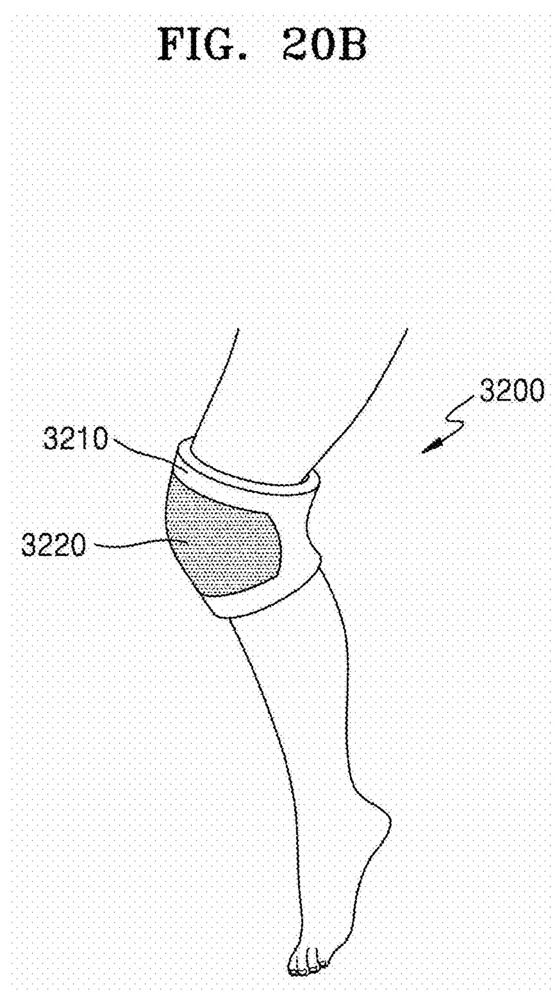

FIG. 20B illustrates a medical electronic device 3200. In an embodiment, the medical electronic device 3200 may include a body unit 3210 and an emission unit 3220. A display device according to one or more embodiments may be used as the emission unit 3220 of the medical electronic device 3200. The emission unit 3220 may emit light of a certain wavelength band (for example, infrared light, visible light, and the like) to the patient's body. In an embodiment, the body unit 3210 may have a stretchable fiber material and may have a structure that may be worn on the body of the user of the emission unit.

Figure 20C:
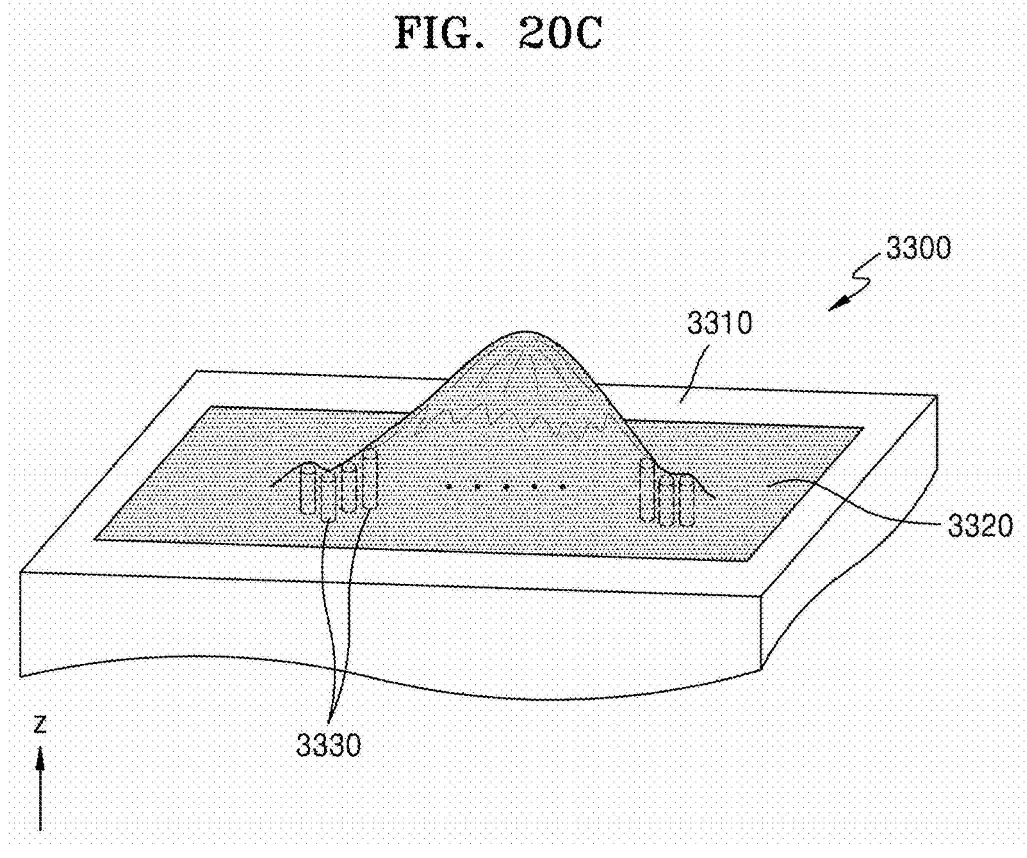

FIG. 20C illustrates an educational electronic device 3300. In an embodiment, the educational electronic device 3300 may include a display unit 3320 provided in a frame 3310. A display device according to one or more embodiments may be used as the display unit 3320. The display unit 3320 may provide images such as, for example, the ocean with waves, a snow-covered mountain, or a volcano with flowing lava, and in this case, the display unit 3320 may reflect a height of the wave, mountain, or volcano and may be stretched in a height direction (for example, a z direction). In some embodiments, a portion of the display unit 3320 may illustrate the movement of lava in three dimensions by sequentially changing the height in a direction in which the lava flows. The educational electronic device 3300 may include a plurality of pins (or stroke units) 3330 arranged on the rear surface of the display unit 3320 such that the display unit 3320 extends in the height direction. As the pins 3330 move in the third direction (for example, the z direction or −z direction), an image expressed on the display unit 3320 may be implemented to have a three-dimensional height. FIG. 20C illustrates the educational electronic device 3300, but the use of the educational electronic device 3300 is not limited as long as the device provides certain image information.

The electronic devices illustrated in FIGS. 20A to 20C are described as electronic devices with variable shapes, but one or more embodiments are not limited thereto. As in one or more embodiments described herein, a display device according to one or more embodiments may be used in an electronic device in which a portion capable of displaying an image (for example, a screen) is fixed.

Figure 20D:
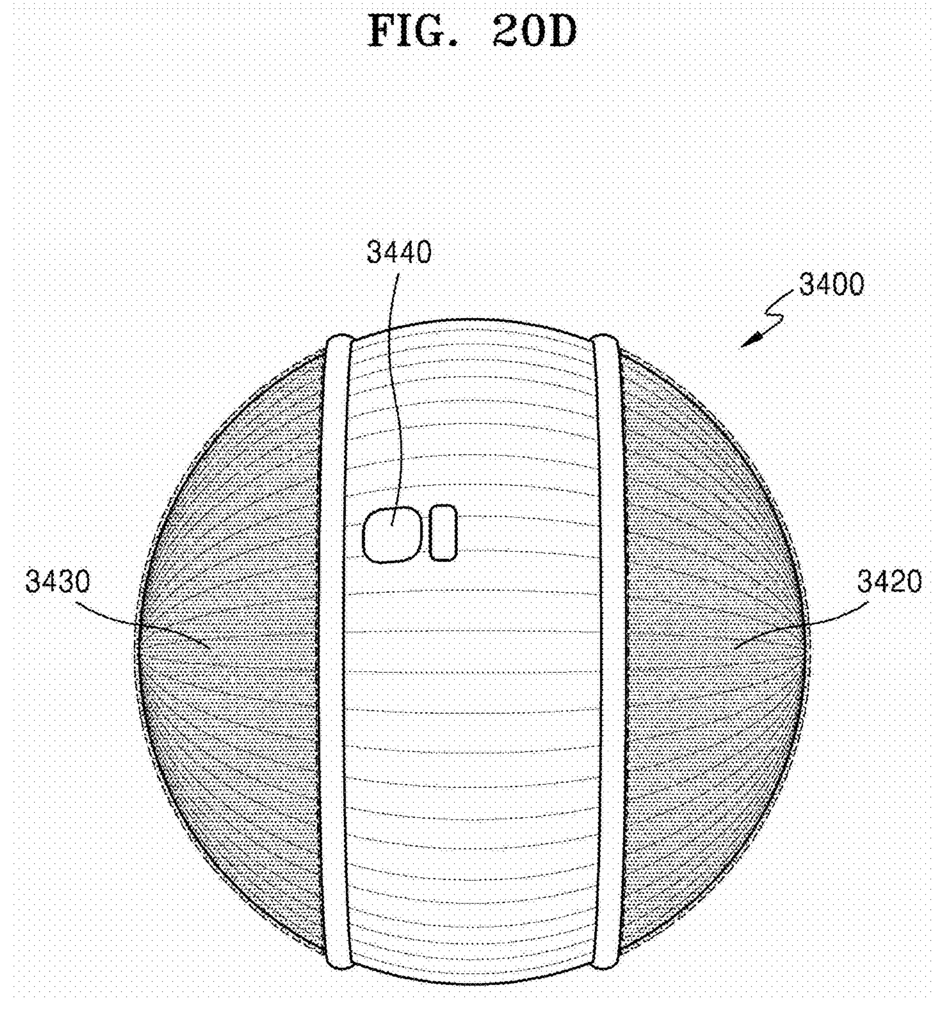

FIG. 20D illustrates a robot 3400 as an electronic device according to an embodiment. The robot 3400 may recognize movement or objects by using a camera unit 3440 and may display a certain image to the user through display units 3420 and 3430. In some embodiments, because display devices according to an embodiment may be stretched in various directions as described herein, the display devices may be assembled in connection with a body frame having a hemispherical shape, and accordingly, the robot 3400 may include the display units 3420 and 3430 having a hemispherical display unit.

Figure 20E:
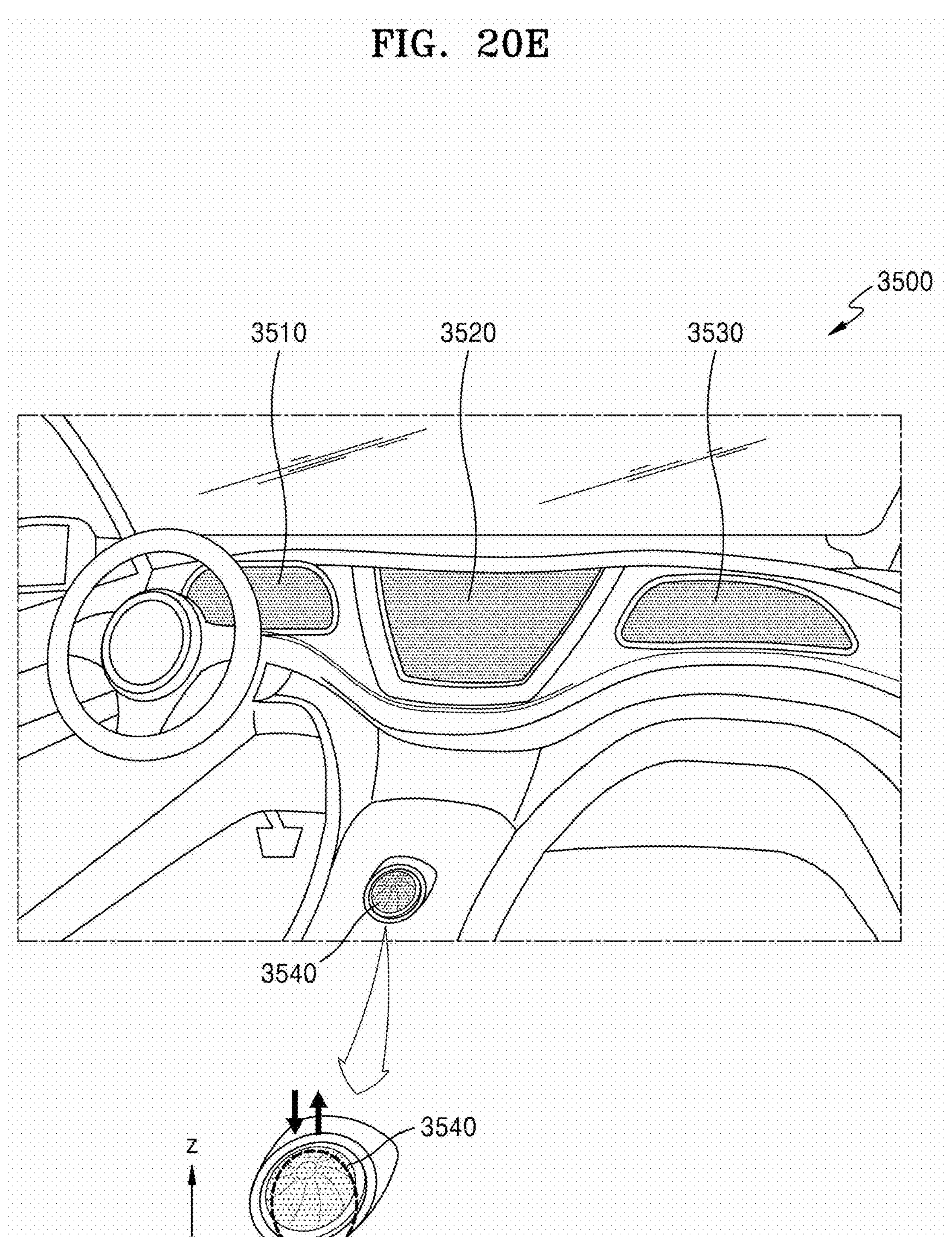

FIG. 20E illustrates a vehicle display device 3500 as an electronic device according to an embodiment. The vehicle display device 3500 may include a cluster 3510, a center information display (CID) 3520, and/or a co-driver display 3530. Because a display device according to an embodiment may be stretched in various directions, the display device may be used in the cluster 3510, the CID 3520, and/or the co-driver display 3530 regardless of the shape of an internal frame.

FIG. 20E illustrates that the cluster 3510, the CID 3520, and/or the co-driver display 3530 are separated from each other. However, one or more embodiments are not limited thereto. In another embodiment, at least two selected from among the cluster 3510, the CID 3520, and the co-driver display 3530 may be integrally connected as a single body.

In some embodiments, the vehicle display device 3500 may include a button 3540 for expressing a certain image. Referring to the enlarged view of FIG. 20E, the button 3540 having a hemispherical shape may include an object 3542 for providing the feeling of using the button while moving in the z direction or −z direction, and a display device disposed on the object 3542. In some embodiments, when the object 3542 has a three-dimensionally round surface, the display device may also have a three-dimensionally round surface.

Figure 20F:
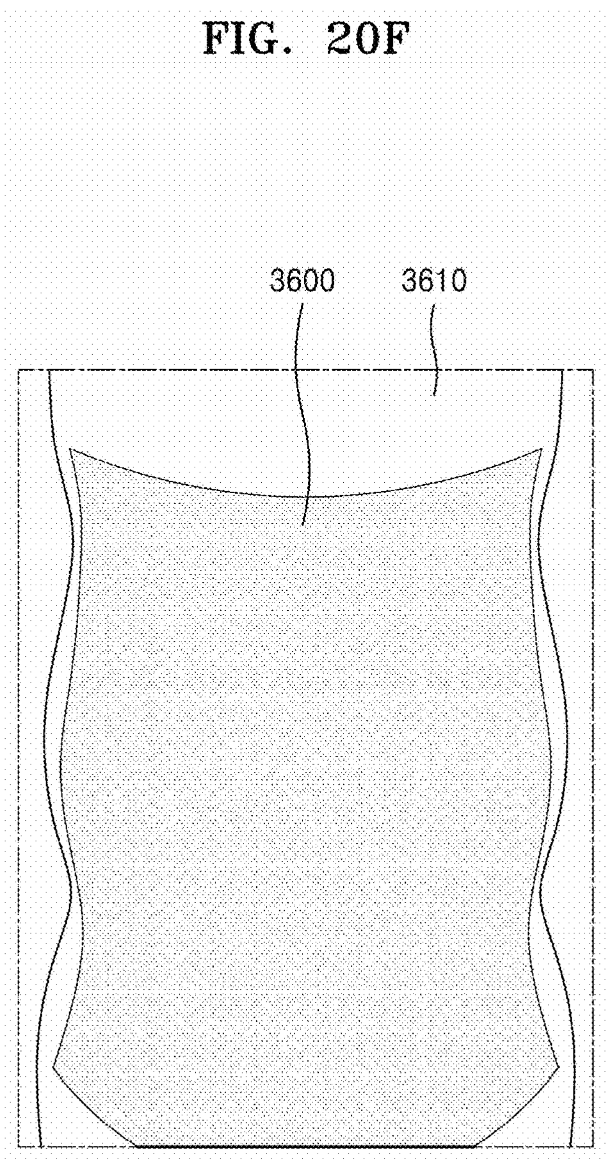

FIG. 20F illustrates that an electronic device according to an embodiment is an electronic device 3600 for advertising or exhibition. In some embodiments, the electronic device 3600 for advertising or exhibition may be installed on a fixed structure 3610, such as, for example, a wall or pillar. When the structure 3610 includes an uneven surface, as illustrated in FIG. 20F, the electronic device 3600 for advertising or exhibition may also be arranged along the uneven surface of the structure 3610. In some embodiments, the electronic device 3600 for advertising or exhibition may be installed on the structure 3610 by using a heat-shrink film or the like.

Figure 20G:
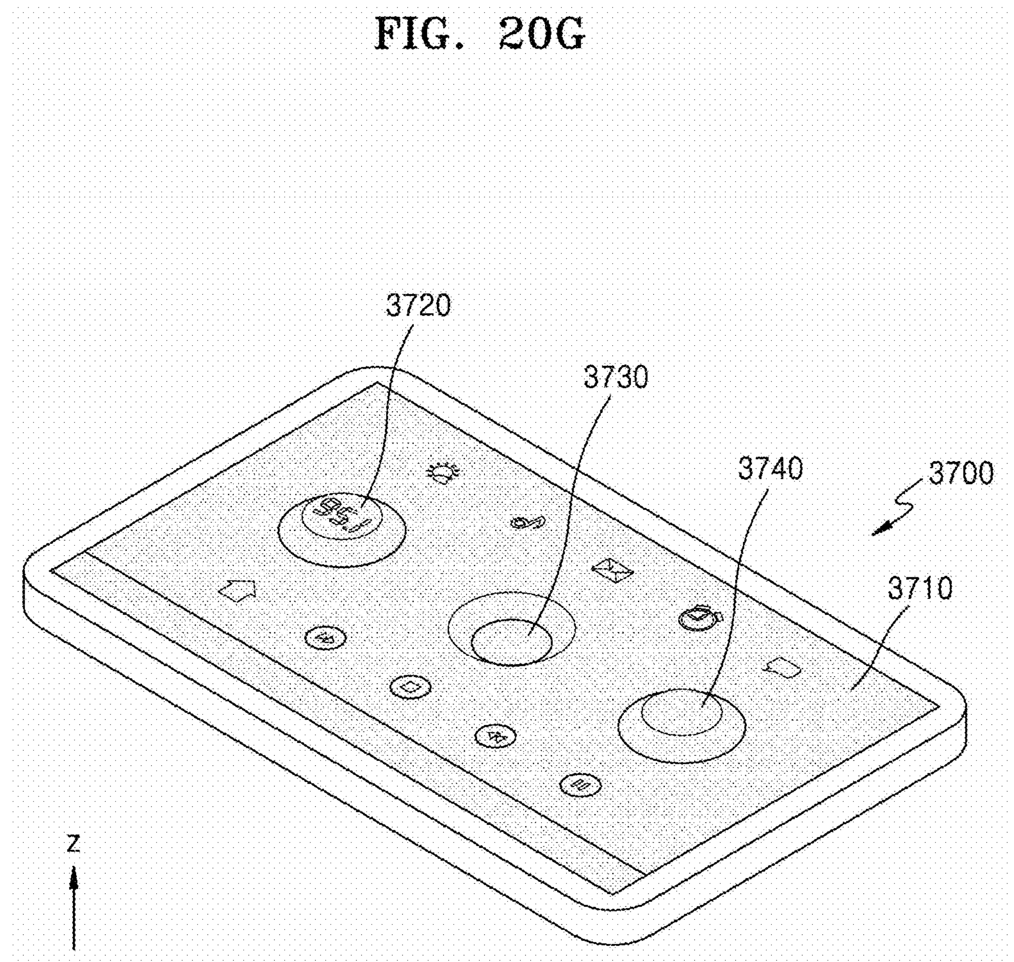

FIG. 20G illustrates an example wherein an electronic device according to an embodiment is a controller 3700. The controller 3700 may include image-type buttons. For example, the controller 3700 may include first to third button areas 3720, 3730, and 3740 in which a partial area of a display unit 3710 protrudes in the z direction or in the −z direction (or depressed in the z direction). In some embodiments, the first and third button areas 3720 and 3740 may protrude in the z direction, and the second button area 3730 may protrude in the −z direction (or depressed in the z direction).

According to an embodiment, a display device that may be stretched in various directions while preventing damage due to concentration of stress may be provided. However, these effects are examples, and the scope of one or more embodiments is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:

a substrate comprising a first unit area, a second unit area, and an intermediate area between the first unit area and the second unit area;

an organic insulating layer disposed on the substrate;

an emission element layer disposed on the organic insulating layer, the emission element layer comprising a first emission element overlapping the first unit area and a second emission element overlapping the second unit area; and an encapsulation layer disposed on the emission element layer, wherein the emission element layer and the encapsulation layer define a valley portion which overlaps the intermediate area and exposes an upper surface of the organic insulating layer.

2. The display device of claim 1, wherein:

each of the first emission element and the second emission element comprises a pixel electrode, an opposite electrode, and an emission layer arranged between the pixel electrode and the opposite electrode, the emission element layer further comprises:

an inorganic bank layer disposed on the organic insulating layer and defining a pixel opening that exposes a portion of the pixel electrode; and a metal bank layer disposed on the inorganic bank layer and comprising a first metal layer and a second metal layer disposed on the first metal layer, the first metal layer defines a first bank opening overlapping the pixel opening, and the second metal layer defines a second bank opening overlapping the pixel opening.

3. The display device of claim 2, wherein a width of the first bank opening is greater than a width of the second bank opening.

4. The display device of claim 2, wherein the inorganic bank layer and the metal bank layer are arranged apart from the intermediate area.

5. The display device of claim 4, wherein the encapsulation layer covers a side surface of the metal bank layer facing the intermediate area.

6. The display device of claim 5, further comprising a cover layer between the encapsulation layer and the side surface of the metal bank layer facing the intermediate area.

7. The display device of claim 2, further comprising a voltage line disposed under the organic insulating layer and configured to transfer a common power voltage, wherein the metal bank layer is electrically connected to the voltage line through one or more contact holes defined in the inorganic bank layer and the organic insulating layer.

8. The display device of claim 7, wherein the one or more contact holes comprise a plurality of contact holes, wherein a first contact hole of the plurality of contact holes is located in the first unit area and a second contact hole of the plurality of contact holes is located in the second unit area.

9. The display device of claim 2, wherein the opposite electrode is in direct contact with a side surface of the first metal layer facing a center of the pixel opening.

10. The display device of claim 1, wherein the encapsulation layer comprises:

a first inorganic encapsulation layer overlapping the first unit area, a second inorganic encapsulation layer overlapping the second unit area, a third inorganic encapsulation layer disposed on the first inorganic encapsulation layer, and a fourth inorganic encapsulation layer disposed on the second inorganic encapsulation layer.

11. The display device of claim 10, wherein the encapsulation layer further comprises:

a first organic encapsulation layer arranged between the first inorganic encapsulation layer and the third inorganic encapsulation layer; and a second organic encapsulation layer arranged between the second inorganic encapsulation layer and the fourth inorganic encapsulation layer.

12. The display device of claim 11, wherein:

the emission element layer further comprises a third emission element overlapping the first unit area and arranged apart from the first emission element, the encapsulation layer further comprises a third organic encapsulation layer between the first inorganic encapsulation layer and the third inorganic encapsulation layer, the first organic encapsulation layer is arranged such that the first organic encapsulation layer overlaps the first emission element, and the third organic encapsulation layer overlaps the third emission element and is arranged apart from the first organic encapsulation layer.

13. The display device of claim 11, wherein:

the emission element layer further comprises a third emission element overlapping the first unit area and arranged apart from the first emission element, and the first organic encapsulation layer is arranged such that the first organic encapsulation layer overlaps the first emission element and the third emission element.

14. The display device of claim 10, wherein the second inorganic encapsulation layer and the fourth inorganic encapsulation layer are arranged apart from each other, with the intermediate area between the second inorganic encapsulation layer and the fourth inorganic encapsulation layer.

15. The display device of claim 10, wherein the second inorganic encapsulation layer and the fourth inorganic encapsulation layer constitute a side surface of the valley portion.

16. The display device of claim 1, further comprising an inorganic insulating layer between the substrate and the organic insulating layer, wherein the inorganic insulating layer defines a first opening overlapping the intermediate area.

17. The display device of claim 16, wherein:

the substrate comprises at least one base layer and at least one barrier layer, and the at least one barrier layer defines a second opening overlapping the first opening.

18. The display device of claim 16, wherein a center of the first opening and a center of the valley portion are offset from each other.

19. The display device of claim 16, further comprising a filler layer filling in the first opening, wherein a modulus of the filler layer is about 3 MPa to about 20 MPa.

20. The display device of claim 19, wherein:

the substrate defines a recess portion that overlaps the first opening and is concave in a thickness direction, and the filler layer fills in the recess portion.

21. The display device of claim 19, further comprising a bridge line disposed on the inorganic insulating layer and the filler layer and crossing the first opening.

22. The display device of claim 21, wherein the bridge line has an arch shape.

23. The display device of claim 21, wherein:

an upper surface of the filler layer has unevenness, and the bridge line has a shape corresponding to a shape of the upper surface of the filler layer.

24. The display device of claim 21, wherein the bridge line comprises:

a first bridge line having a concave shape in a thickness direction; and a second bridge line disposed on the first bridge line and having an arch shape.

25. The display device of claim 1, further comprising:

a planarization layer disposed on the encapsulation layer; and a touch sensor layer disposed on the planarization layer, the touch sensor layer comprising a first touch electrode, a second touch electrode, a first touch insulating layer between the planarization layer and the first touch electrode, and a second touch insulating layer between the first touch electrode and the second touch electrode, wherein, in a plan view, a shape of the first touch insulating layer corresponds to a shape of the first touch electrode.

* * * * *